(12) United States Patent
Fredenburg et al.

(10) Patent No.: US 9,705,516 B1
(45) Date of Patent: Jul. 11, 2017

(54) RECONFIGURABLE PHASE-LOCKED LOOP WITH OPTIONAL LC OSCILLATOR CAPABILITY

(71) Applicant: Movellus Circuits, Inc., Ann Arbor, MI (US)

(72) Inventors: Jeffrey Alan Fredenburg, Ann Arbor, MI (US); Muhammad Faisal, Ann Arbor, MI (US); David Michael Moore, Ann Arbor, MI (US)

(73) Assignee: Movellus Circuits, Inc., Ann Arbor, MI (US)

( * ) Notice: Subject to any disclaimer, the term of this patent is extended or adjusted under 35 U.S.C. 154(b) by 0 days.

(21) Appl. No.: 15/224,296

(22) Filed: Jul. 29, 2016

(51) Int. Cl.
| | | |
|---|---|---|
| *H03L 7/06* | (2006.01) | |
| *H03L 7/099* | (2006.01) | |
| *H03L 7/081* | (2006.01) | |
| *H03B 5/12* | (2006.01) | |

(52) U.S. Cl.
CPC .......... *H03L 7/0995* (2013.01); *H03B 5/124* (2013.01); *H03B 5/1228* (2013.01); *H03L 7/0814* (2013.01)

(58) Field of Classification Search
None
See application file for complete search history.

(56) References Cited

U.S. PATENT DOCUMENTS

| | | | |
|---|---|---|---|
| 5,999,060 A * | 12/1999 | Zuta ........................ | H03L 7/085 331/1 A |
| 6,218,876 B1 | 4/2001 | Sung et al. | |
| 6,275,553 B1 | 8/2001 | Esaki | |
| 6,744,324 B1 * | 6/2004 | Adams .................. | H03F 1/0277 327/156 |
| 6,826,247 B1 * | 11/2004 | Elliott .................... | G09G 5/008 327/150 |
| 7,216,249 B2 | 5/2007 | Fujiwara et al. | |
| 8,321,489 B2 | 11/2012 | Staszewski et al. | |
| 8,427,205 B1 * | 4/2013 | Nagaraj ................ | H03L 7/0814 327/105 |
| 8,791,734 B1 | 7/2014 | Hara et al. | |
| 2005/0189972 A1 * | 9/2005 | Foo ....................... | H03L 7/0991 327/156 |

(Continued)

*Primary Examiner* — Cassandra Cox
(74) *Attorney, Agent, or Firm* — Lance Kreisman; Peninsula Patent Group

(57) ABSTRACT

A reconfigurable phase-locked loop integrated circuit is disclosed which is coupleable to an inductor, and may include: a memory storing a plurality of configuration parameters; a plurality of capacitive tuning circuits coupleable to the inductor to form an LC oscillator circuit to generate a first output signal having a first output frequency; a reconfigurable frequency and delay generator configurable as a ring oscillator or as a delay line circuit, and to generate a second output signal having a second output frequency; and a first digital controller to generate a first control signals to the reconfigurable frequency and delay generator to generate the second output signal having the second output frequency when the reconfigurable frequency and delay generator is configured as the ring oscillator; and to generate a second plurality of control signals to the plurality of capacitive tuning circuits to generate the first output signal having the first output frequency when the reconfigurable frequency and delay generator is configured as the delay line circuit.

34 Claims, 30 Drawing Sheets

(56) References Cited

U.S. PATENT DOCUMENTS

| | | | |
|---|---|---|---|
| 2013/0300477 A1* | 11/2013 | Ueda | H03L 7/099 |
| | | | 327/159 |
| 2016/0036454 A1* | 2/2016 | Moehlmann | H03L 7/0994 |
| | | | 327/147 |
| 2016/0204787 A1* | 7/2016 | Lotfy | H03L 7/085 |
| | | | 327/142 |

* cited by examiner

590B

590C

RECONFIGURABLE PHASE-LOCKED LOOP WITH OPTIONAL LC OSCILLATOR CAPABILITY

FIELD OF THE INVENTION

The present invention, in general, relates to phase-locked loops, and more particularly, relates to a reconfigurable, digital phase-locked loop which generates a frequency reference or delay with phase detection or measurement and which is configurable or reconfigurable for a variety of parameters and options.

BACKGROUND OF THE INVENTION

Phase-locked loop ("PLL") circuitry is used in frequency or clocking signal generation typically to generate signals relative to an input reference signal, such as a crystal oscillator, an inductive-capacititive ("LC") oscillator, a resistive-capacititive ("RC") oscillator or another type of relaxation oscillator. The phase-locked loop circuitry adjusts the frequency of a PLL output signal based on frequency and/or phase differences between the reference signal and the output signal. Based on any such difference, the frequency and/or phase of the output signal is increased or decreased accordingly. Phase-locked loops are used in a wide range of electronics, such as radios, telecommunication circuits, wireless and mobile devices, computers, and other devices.

Many such PLLs are either not configurable or not reconfigurable, so are more difficult to use with or within configurable or reconfigurable circuitry such as field programmable gate arrays ("FPGAs") or other logic circuitry. For example, such PLLs may not be configurable for a wide frequency range (especially at comparatively high frequencies), desired jitter level or specification, fractional frequency generation, power usage or dissipation, oscillation quality ("Q") factor, and so on, particularly while maintaining accuracy and avoiding frequency drift, including over fabrication process, voltage, and temperature ("PVT") variations.

In addition, the circuit designs of many PLLs, such as those which may be provided by a foundry to insert into the design of an integrated circuit for a selected silicon fabrication process technology, have a fixed IC layout (or floorplan). Such PLLs are provided as a "black box" design having a predetermined IC layout (or floorplan), a predetermined IC layout aspect ratio, and predetermined IC locations for circuitry inputs and outputs, for example. As a result, these "black box" PLLs cannot be readily inserted into any selected IC design without accommodating this fixed floorplan and significantly affecting the overall IC area and timing, and cannot be utilized independently of the silicon fabrication process technology.

As a consequence, a need remains for a reconfigurable, digital phase-locked loop which generates a frequency reference or delay with phase detection or measurement and which is configurable or reconfigurable for a variety of parameters and options, such as frequency, bandwidth, frequency resolution, jitter level or scale, power consumption, and/or fractional frequencies, and various options, such as inclusion of an LC oscillator.

In addition, such a reconfigurable, digital PLL should be capable of being provided as a circuitry netlist (generated using Verilog as an IC design tool, for example) or other comparable circuit specification, to produce a reconfigurable, digital PLL having a selected, malleable or otherwise variable IC layout (or floorplan), rather than a fixed or predetermined IC layout (or floorplan). Such a reconfigurable, digital PLL should also be readily insertable into virtually any selected IC design with either no or comparatively minor modification.

Lastly, such a reconfigurable, digital PLL should provide for control over output frequency, to provide a stable and desired frequency in response to variation in ambient or junction temperature or variation in other parameters such as voltage, fabrication process, frequency, and age.

SUMMARY OF THE INVENTION

The exemplary or representative embodiments of the present invention provide numerous advantages. Various representative embodiments provide a reconfigurable, digital phase-locked loop which generates a frequency reference or delay with phase detection or measurement and which is configurable or reconfigurable for a variety of parameters, such as frequency, bandwidth, frequency resolution, jitter level or scale, power consumption, and/or fractional frequencies, and various options, such as inclusion of an LC oscillator.

Various representative embodiments of the reconfigurable, digital phase-locked loop may be implemented as a circuitry netlist (generated using Verilog as an IC design tool, for example) or other comparable circuit specification. Such an inventive circuitry netlist or other comparable circuit specification of the representative embodiments can then be combined with the standard cells (or standard digital gates) of any selected silicon fabrication process technology (using such available IC design tools), together with the balance of the IC circuitry which is to utilize the reconfigurable, digital PLL, to generate an overall GDSII file incorporating the reconfigurable, digital PLL. This results in the reconfigurable, digital PLL embodiments having a selected, malleable or otherwise variable IC layout (or floorplan), rather than a fixed or predetermined IC floorplan, and effectively enables a customized reconfigurable, digital PLL IC layout (or floorplan) specifically tailored to the balance of the IC circuitry which is to utilize the reconfigurable, digital PLL. As a result, the representative embodiments of the reconfigurable, digital PLL are readily insertable into virtually any selected IC design with either no or comparatively minor modification.

In addition, various representative embodiments of the reconfigurable, digital phase-locked loop may also be configured or reconfigured to be utilized with an LC (inductive and capacitive) oscillator (or LC tank), such as provided using an optional inductor, to provide an output signal having superior noise performance, phase noise reduction, a greater frequency range (particularly at higher frequencies) and overall superior power performance.

Various representative embodiments of the reconfigurable, digital phase-locked loop are also compatible with a wide variety of reference signal generators, including crystal oscillators, LC oscillators, RC oscillators, and other relaxation oscillators. Various representative embodiments of a reconfigurable, digital phase-locked loop also provide for control over output frequency and phase, to provide a stable and desired frequency and phase in response to variation in ambient or junction temperature or variation in other parameters such as voltage, fabrication process, frequency, and age.

A reconfigurable, digital phase-locked loop integrated circuit is disclosed which is coupleable to a reference frequency generator. A representative embodiment of the reconfigurable, digital phase-locked loop integrated circuit comprises: a memory storing a plurality of configuration parameters, at least one configuration parameter of the plurality of configuration parameters specifying an output frequency; a reconfigurable frequency and delay generator configurable and reconfigurable in response to the configuration parameters to generate an output signal having the output frequency; and a digital controller coupled to the memory and to the reconfigurable frequency and delay generator, the digital controller further coupleable to receive an input signal from the reference frequency generator having a reference frequency, the digital controller adapted to access the memory and retrieve the plurality of configuration parameters, and to generate a plurality of control signals to the reconfigurable frequency and delay generator both to generate the output signal having the output frequency in response to the plurality of configuration parameters, and to match a phase of the output signal to an input signal phase.

A representative embodiment of the reconfigurable, digital phase-locked loop integrated circuit, may further comprise: a user interface controller coupled to the memory, the user interface controller adapted to receive user input, convert the user input into the plurality of configuration parameters, and to write the plurality of configuration parameters to the memory.

In a representative embodiment, the plurality of configuration parameters further comprise at least one configuration parameter selected from the group consisting of: bandwidth, frequency resolution, jitter level, power consumption, fractional frequencies, and combinations thereof. In a representative embodiment, the reconfigurable phase-locked loop is configurable and reconfigurable post-fabrication as an integrated circuit.

In a representative embodiment, the reconfigurable frequency and delay generator, in its entirety, comprises: a first plurality of digital logic gates synthesizable using a plurality of standard cells of a selected fabrication technology, and the digital controller, in its entirety, comprises: a second plurality of digital logic gates synthesizable using a plurality of standard cells of the selected fabrication technology. Also in a representative embodiment, the digital controller, in its entirety, comprises a fabrication process-independent design of a plurality of digital logic circuits.

In a representative embodiment, each control signal of the plurality of control signals may correspond to a coefficient of a plurality of coefficients of a control word.

In a representative embodiment, the reconfigurable frequency and delay generator comprises: a phase sampler; and a plurality of configurable oscillator stages coupled to the phase sampler, each configurable oscillator stage of the plurality of configurable oscillator stages further comprising: at least one core inverter to form a plurality of core inverters coupled in series, a last core inverter of the plurality of core inverters generating the output signal having the output frequency; and a plurality of delay control circuits, each delay control circuit of the plurality of delay control circuits coupled to an output of a corresponding core inverter of the plurality of core inverters.

In a representative embodiment, each core inverter of the plurality of core inverters comprises a plurality of inverters having a differential inverter circuit structure comprising: first and second nonconfigurable inverters coupled in parallel; and third and fourth configurable inverters cross-coupled to outputs of the first and second nonconfigurable inverters.

In a representative embodiment, each delay control circuit of the plurality of delay control circuits further comprises: a plurality of switchable frequency control inverters coupled in parallel with the first and second nonconfigurable inverters; a plurality of primary switched capacitors coupled to the outputs of the first and second nonconfigurable inverters; a plurality of secondary switched digital varactors coupled to the outputs of the first and second nonconfigurable inverters; and a plurality of voltage controllers, each voltage controller of the plurality of voltage controllers coupled to provide a selected voltage to a corresponding secondary switched digital varactor of the plurality of secondary switched digital varactors.

In a representative embodiment, the plurality of switchable frequency control inverters comprise a plurality of transistors having a plurality of different sizes to provide a corresponding plurality of different delays. Also in a representative embodiment, the plurality of switchable frequency control inverters comprise a plurality of transistors having a differential inverter circuit structure.

In a representative embodiment, each primary switched capacitor of the plurality of primary switched capacitors comprises: a transmission gate; and a FET transistor having its gate coupled to the transmission gate and further having its source and drain coupled to a ground potential.

In a representative embodiment, each secondary switched digital varactor of the plurality of secondary switched digital varactors comprises: a transmission gate; and a FET transistor having its gate coupled to the transmission gate and further having its source and drain coupled to the selected voltage.

In a representative embodiment, each voltage controller of the plurality of voltage controllers comprises: a plurality of transistors coupled in series to form a voltage ladder circuit structure having a plurality of nodes, each node of the plurality of nodes having a different voltage; and a plurality of transmission gates, each transmission gate of the plurality of transmission gates coupled to a secondary switched digital varactor and to a selected node of the plurality of nodes to transmit the selected voltage to the secondary switched digital varactor in response to a plurality of control signals.

Also in a representative embodiment, the phase sampler comprises a plurality of flip-flops, each flip-flop input coupled to an output of a corresponding core inverter of the plurality of core inverters, each flip-flop output generating a single bit indicator of a position of the phase of the output signal along the plurality of configurable oscillator stages.

In a representative embodiment, a number of oscillator stages are selectable to form the plurality of configurable oscillator stages in response to the plurality of configuration parameters. For example, a representative embodiment may further comprise: a plurality of switching circuits coupled to the plurality of configurable oscillator stages to select a predetermined number of oscillator stages to form a ring oscillator circuit structure or a delay line circuit structure in response to the plurality of configuration parameters. Also in a representative embodiment, the plurality of configurable oscillator stages are configurable to form a ring oscillator or a delay line in response to the plurality of configuration parameters. For example, a representative embodiment may further comprise: a plurality of switching circuits coupled to the plurality of configurable oscillator stages to selectively configure the plurality of configurable oscillator stages as a ring oscillator circuit structure and a delay line circuit structure in response to the plurality of configuration parameters.

In a representative embodiment, the reconfigurable frequency and delay generator may further comprise: a phase interpolator coupled between the plurality of configurable oscillator stages and the phase sampler. In a representative embodiment, the phase interpolator comprises at least one inverter tree coupled between and among the plurality of configurable oscillator stages, the at least one inverter tree comprising: a first plurality of interpolator inverters, the first plurality of interpolator inverters coupled to a plurality of outputs of the plurality of core inverters; and a second plurality of interpolator inverters, the second plurality of interpolator inverters coupled to outputs of the first plurality of interpolator inverters to provide a plurality of phase interpolator outputs.

In another representative embodiment, the phase interpolator comprises a plurality of configurable interpolator stages, the plurality of configurable interpolator stages comprising: a first interpolator stage; a first multiplexer coupled to the first interpolator stage, the first multiplexer comprising a first plurality of switches to selectively couple the first interpolator stage to the plurality of configurable oscillator stages in response to a configuration parameter; a second interpolator stage; and a second multiplexer coupled to the second interpolator stage, the second multiplexer comprising a second plurality of switches to selectively couple the second interpolator stage to the first interpolator stage in response to a configuration parameter.

In a representative embodiment, the digital controller comprises: a binary encoder coupled to a phase sampler, the binary encoder adapted to generate a first binary count corresponding to positional phase information provided by the phase sampler; a gray code counter coupled to receive the output signal and generate a gray code count representing the output frequency; a gray code sampler adapted to sample the gray code count; a gray code-to-binary converter adapted to generate a second binary count from the gray code count; and an adder adapted to combine the second binary count with the first binary count to provide a combined binary representation of the frequency and phase of the output signal.

In a representative embodiment, the adder is further adapted to concatenate the second binary count in higher significant bit positions with the first binary count in lower bit positions of the combined binary representation of the frequency and phase of the output signal. In another representative embodiment, the adder is further adapted to add the second binary count with the first binary count to provide the combined binary representation of the frequency and phase of the output signal.

In a representative embodiment, the gray code counter is clocked by the output signal, and all other circuits of the digital controller are clocked by the reference frequency.

In a representative embodiment, the digital controller further comprises: an error correction circuit coupled to the gray code sampler, the error correction circuit adapted to determine an error condition when more than one bit has changed between successive gray code samples of a plurality of gray code samples.

In another representative embodiment, the digital controller further comprises: a gray code register coupled to the gray code counter to store a plurality of successive gray code samples. In a representative embodiment, the gray code counter and the gray code register are clocked by the output signal, and all other circuits of the digital controller are clocked by the reference frequency. In a representative embodiment, the gray code register is written to at the output signal frequency and read from at the reference frequency.

In a representative embodiment, the digital controller further comprises: a reference counter circuit coupled to receive the input signal and provide a third binary count of the reference frequency; a programmable multiplier circuit coupled to the reference counter to multiply the third binary count by a selected multiplicand to generate a multiplied reference frequency count; a comparator circuit coupled to the programmable multiplier and to the adder, the comparator circuit adapted to compare the combined binary representation with the multiplied reference frequency count and generate a corresponding first error signal; and a programmable digital filter coupled to the comparator circuit to convert the first error signal into the plurality of control signals.

In a representative embodiment, the programmable multiplier circuit multiplies the third binary count by a selected integer multiplicand to generate the multiplied reference frequency count. In another representative embodiment, the programmable multiplier circuit multiplies the third binary count by a selected non-integer multiplicand to generate the multiplied reference frequency count.

In a representative embodiment, the programmable digital filter comprises: a configurable filter to receive the first error signal and to generate a second error signal using one or more gain stages; and a memory storing one or more gain coefficients for the configurable filter. In a representative embodiment, the programmable digital filter further comprises: one or more configurable gain stages, each configurable gain stage implementing a corresponding gain coefficient of the one or more gain coefficients. For example, the one or more configurable gain stages implement a linear digital filter selected from the group consisting of: $H(z)=K_P$; $H(z)=K_P+K_I/(1-z^{-1})$; $H(z)=K_0+K_1/(1-z^{-1})+K_2/(1-z^{-2})$; $H(z)=K_0+K_1 z^{-1}$; $H(z)=K_0+K_1 z^{-1}+K_2 z^{-2}$; and combinations thereof.

In a representative embodiment, the second error signal comprises a plurality of coefficients forming a control word, each coefficient corresponding to a control signal of the plurality of control signals provided on a signaling bus to the oscillator. In another representative embodiment, the programmable digital filter further comprises: a coefficient generator coupled to the configurable filter and adapted to generate a plurality of coefficients forming a control word, each coefficient corresponding to a control signal of the plurality of control signals provided on a signaling bus to the oscillator.

In a representative embodiment, the programmable digital filter comprises: a configurable filter to receive the first error signal and to generate a second error signal using one or more gain stages; and wherein the memory further stores one or more gain coefficients for the configurable filter.

A representative embodiment of the reconfigurable, digital phase-locked loop integrated circuit may further comprise a plurality of capacitive tuning circuits. For such a representative embodiment, the reconfigurable phase-locked loop is further coupleable to an inductor to form an LC oscillator circuit.

Another representative embodiment of a reconfigurable, digital phase-locked loop integrated circuit coupleable to a reference frequency generator is disclosed, comprising: a user interface controller adapted to receive user input and to convert the user input into a plurality of configuration parameters, at least one configuration parameter of the plurality of configuration parameters specifying an output frequency; a memory coupled to the user interface controller to store the plurality of configuration parameters; a reconfigurable frequency and delay generator configurable and reconfigurable in response to the configuration parameters to generate an output signal having the output frequency; and a digital controller coupled to the memory and to the reconfigurable frequency and delay generator, the digital controller further coupleable to receive an input signal from the reference frequency generator having a reference frequency, the digital controller adapted to detect the frequency and phase of the output signal, to access the memory and retrieve the plurality of configuration parameters, and to generate a plurality of control signals to the reconfigurable frequency and delay generator, in response to both the plurality of configuration parameters and the detected frequency and phase of the output signal, to generate the output signal having the output frequency and to match a phase of the output signal to an input signal phase.

In a representative embodiment, the integrated circuit, in its entirety, comprises: a plurality of digital logic gates synthesizable using a plurality of standard cells of a selected fabrication technology; and one or more memory circuits or registers.

Another representative embodiment of a reconfigurable, digital phase-locked loop integrated circuit coupleable to a reference frequency generator is disclosed, with the reconfigurable phase-locked loop integrated circuit configurable and reconfigurable post-fabrication, and with the reconfigurable phase-locked loop integrated circuit comprising: a memory storing a plurality of configuration parameters, wherein the plurality of configuration parameters comprise at least two configuration parameters selected from the group consisting of: output frequency, bandwidth, frequency resolution, jitter level, power consumption, fractional frequencies, and combinations thereof; a reconfigurable frequency and delay generator configurable and reconfigurable in response to the configuration parameters to generate an output signal having the output frequency; and a digital controller coupled to the memory and to the reconfigurable frequency and delay generator, the digital controller further coupleable to receive an input signal from the reference frequency generator having a reference frequency, the digital controller adapted to detect the frequency and phase of the output signal, to access the memory and retrieve the plurality of configuration parameters, and to generate a plurality of control signals to the reconfigurable frequency and delay generator, in response to both the plurality of configuration parameters and the detected frequency and phase of the output signal, to generate the output signal having the output frequency and to match a phase of the output signal to an input signal phase; wherein the reconfigurable frequency and delay generator and the digital controller comprise a plurality of digital logic gates synthesizable in their entireties using a plurality of standard cells of a selected fabrication technology.

A representative embodiment of reconfigurable frequency and delay generator is disclosed, comprising: a plurality of configurable oscillator stages, each configurable oscillator stage of the plurality of configurable oscillator stages comprising: (1) a plurality of core inverters coupled in series, a last core inverter of the plurality of core inverters generating an output signal having a configurable output frequency; and (2) a plurality of delay control circuits, each delay control circuit of the plurality of delay control circuits coupled to an output of a corresponding core inverter of the plurality of core inverters; and a phase sampler coupled to the plurality of configurable oscillator stages.

The reconfigurable frequency and delay generator also may further comprise: a memory storing a plurality of configuration parameters, at least one configuration parameter of the plurality of configuration parameters specifying the output frequency; and a user interface controller coupled to the memory, the user interface controller adapted to receive user input, convert the user input into the plurality of configuration parameters, and to write the plurality of configuration parameters to the memory.

In a representative embodiment, the reconfigurable frequency and delay generator is configurable and reconfigurable post-fabrication as an integrated circuit.

Another representative embodiment of a reconfigurable frequency and delay generator is disclosed, comprising: a memory storing a plurality of configuration parameters, at least one configuration parameter of the plurality of configuration parameters specifying an output frequency; a plurality of configurable oscillator stages, each configurable oscillator stage of the plurality of configurable oscillator stages comprising: (1) a plurality of core inverters coupled in series, a last core inverter of the plurality of core inverters generating an output signal having the output frequency; and (2) a plurality of delay control circuits, each delay control circuit of the plurality of delay control circuits coupled to an output of a corresponding core inverter of the plurality of core inverters; a phase sampler coupled to the plurality of configurable oscillator stages; and a plurality of switching circuits coupled to the plurality of configurable oscillator stages to selectively configure the plurality of configurable oscillator stages as a ring oscillator circuit structure and a delay line circuit structure in response to the plurality of configuration parameters.

Another representative embodiment of a reconfigurable frequency and delay generator is disclosed, comprising: a plurality of configurable oscillator stages, each configurable oscillator stage of the plurality of configurable oscillator stages comprising: (1) a plurality of core inverters coupled in series, a last core inverter of the plurality of core inverters generating an output signal having a configurable output frequency, each core inverter of the plurality of core inverters comprising: first and second nonconfigurable inverters coupled in parallel; and third and fourth configurable inverters cross-coupled to outputs of the first and second nonconfigurable inverters; and (2) a plurality of delay control circuits, each delay control circuit of the plurality of delay control circuits coupled to an output of a corresponding core inverter of the plurality of core inverters, each delay control circuit of the plurality of delay control circuits comprising: a plurality of switchable frequency control inverters coupled in parallel with the first and second nonconfigurable inverters; a plurality of primary switched capacitors coupled to the outputs of the first and second nonconfigurable inverters; a plurality of secondary switched digital varactors coupled to the outputs of the first and second nonconfigurable inverters; and a plurality of voltage controllers, each voltage controller of the plurality of voltage controllers coupled to provide a selected voltage to a corresponding secondary switched digital varactor of the plurality of secondary switched digital varactors.

A representative embodiment of a digital control loop circuit is also disclosed which is coupleable to an oscillator to form a configurable, digital phase-locked loop to generate an output signal having a configurable or selectable output frequency, with the digital control loop circuit further coupleable to a reference frequency generator. A representative embodiment of a digital control loop circuit comprises: a memory storing a plurality of configuration parameters, at least one configuration parameter of the plurality of configuration parameters specifying the output frequency; and a digital controller coupled to the memory and coupleable to the oscillator, the digital controller further coupleable to receive an input signal from the reference frequency generator having a reference frequency, the digital controller adapted to access the memory and retrieve the plurality of configuration parameters, and to generate a plurality of control signals to the oscillator both to generate the output signal having the output frequency in response to the plurality of configuration parameters, and to match a phase of the output signal to an input signal phase.

Such a digital control loop circuit may further comprise any of the various components described above for any of the other representative embodiments of the reconfigurable, digital phase-locked loop integrated circuit, or various components of the reconfigurable frequency and delay generator.

In a representative embodiment of the digital control loop circuit, the digital controller may be further adapted to detect the frequency and phase of the output signal, and to generate the plurality of control signals in response to both the plurality of configuration parameters and the detected frequency and phase of the output signal. For example, for such a representative embodiment, the digital controller may further comprise: a frequency and phase detector to detect the frequency and phase of the output signal, the frequency and phase detector comprises: a phase sampler; a binary encoder coupled to the phase sampler, the binary encoder adapted to generate a first binary count corresponding to positional phase information provided by the phase sampler; and a gray code counter coupled to receive the output signal and generate a gray code count representing the output frequency.

A representative embodiment of a fabrication process-independent digital control loop circuit is also disclosed which is coupleable to an oscillator to form a configurable, digital phase-locked loop to generate an output signal having a configurable or selectable output frequency, with the digital control loop circuit further coupleable to a reference frequency generator, comprising: a user interface controller adapted to receive user input and to convert the user input into a plurality of configuration parameters, at least one configuration parameter of the plurality of configuration parameters specifying the output frequency; a memory coupled to the user interface controller to store the plurality of configuration parameters; and a digital controller coupled to the memory and coupleable to the oscillator, the digital controller further coupleable receive an input signal from the reference frequency generator having a reference frequency, the digital controller adapted to detect the frequency and phase of the output signal, to access the memory and retrieve the plurality of configuration parameters, and to generate a plurality of control signals to the oscillator, in response to both the plurality of configuration parameters and the detected frequency and phase of the output signal, to generate the output signal having the output frequency and to match a phase of the output signal to an input signal phase.

Another representative embodiment of a digital control loop circuit is disclosed which is coupleable to an oscillator to form a configurable, digital phase-locked loop to generate an output signal having a configurable or selectable output frequency, the digital control loop circuit further coupleable to a reference frequency generator, the representative embodiment of the digital control loop circuit comprising: a memory storing a plurality of configuration parameters, wherein the plurality of configuration parameters comprise at least two configuration parameters selected from the group consisting of: output frequency, bandwidth, frequency resolution, jitter level, power consumption, fractional frequencies, and combinations thereof; a digital controller coupled to the memory and coupleable to the oscillator, the digital controller further coupleable to receive an input signal from the reference frequency generator having a reference frequency, the digital controller comprising a plurality of digital logic gates synthesizable in their entireties using a plurality of standard cells of a selected fabrication technology, the digital controller adapted to detect the frequency and phase of the output signal, to access the memory and retrieve the plurality of configuration parameters, and to generate a plurality of control signals to the reconfigurable analog core circuit, in response to both the plurality of configuration parameters and the detected frequency and phase of the output signal, to generate the output signal having the output frequency and to match a phase of the output signal to an input signal phase.

Another representative embodiment of a digital control loop circuit is disclosed which is coupleable to an oscillator to form a configurable, digital phase-locked loop to generate an output signal having an output frequency, the digital control loop circuit further coupleable to a reference frequency generator, with the representative embodiment of the digital control loop circuit comprising: a phase sampler adapted to generate positional phase information; a binary encoder coupled to the phase sampler, the binary encoder adapted to generate a first binary count corresponding to positional phase information provided by the phase sampler; a gray code counter coupled to receive the output signal and generate a gray code count representing the output frequency; a gray code sampler adapted to sample the gray code count; a gray code-to-binary converter adapted to generate a second binary count from the gray code count; an adder adapted to combine the second binary count with the first binary count to provide a combined binary representation of the frequency and phase of the output signal; a reference counter circuit coupled to receive an input signal having a reference frequency from the reference frequency generator and provide a third binary count of the reference frequency; a programmable multiplier circuit coupled to the reference counter to multiply the third binary count by a selected multiplicand to generate a multiplied reference frequency count; a comparator circuit coupled to the programmable multiplier and to the adder, the comparator circuit adapted to compare the combined binary representation with the multiplied reference frequency count and generate a corresponding first error signal; and a programmable digital filter coupled to the comparator circuit to convert the first error signal into a plurality of control signals to the oscillator, to generate the output signal having the output frequency and to match a phase of the output signal to an input signal phase.

A representative embodiment of a reconfigurable phase-locked loop integrated circuit is disclosed which is coupleable to a reference frequency generator and further coupleable to an inductor, with representative embodiment of the reconfigurable phase-locked loop integrated circuit comprising: a memory storing a plurality of configuration parameters, at least one configuration parameter of the plurality of configuration parameters specifying a selected output frequency; a plurality of capacitive tuning circuits coupleable to the inductor to form an LC oscillator circuit to generate a first output signal having a first output frequency; a reconfigurable frequency and delay generator configurable and reconfigurable in response to the plurality of configuration parameters to configure as a ring oscillator or as a delay line circuit, and to generate a second output signal having a second output frequency; and a first digital controller coupled to the reconfigurable frequency and delay generator and to the plurality of capacitive tuning circuits, the first digital controller further coupleable to receive an input signal from the reference frequency generator having a reference frequency, the first digital controller adapted to access the memory and retrieve the plurality of configuration parameters; when the reconfigurable frequency and delay generator is configured as the ring oscillator, to generate a first plurality of control signals to the reconfigurable frequency and delay generator both to generate the second output signal having the second output frequency in response to the plurality of configuration parameters, and to match a phase of the second output signal to an input signal phase; and when the reconfigurable frequency and delay generator is configured as the delay line circuit, to generate a second plurality of control signals to the plurality of capacitive tuning circuits both to generate the first output signal having the first output frequency in response to the plurality of configuration parameters, and to match a phase of the first output signal to the input signal phase.

In such a representative embodiment, the reconfigurable frequency and delay generator comprises: a first phase sampler; and a plurality of configurable oscillator stages coupled to the first phase sampler, each configurable oscillator stage of the plurality of configurable oscillator stages further comprising: at least one core inverter to form a plurality of core inverters coupled in series, a last core inverter of the plurality of core inverters generating the second output signal having the second output frequency; and a first plurality of delay control circuits, each delay control circuit of the first plurality of delay control circuits coupled to an output of a corresponding core inverter of the plurality of core inverters.

Such a representative embodiment of a reconfigurable phase-locked loop integrated circuit may further comprise: a first multiplexer of a plurality of multiplexers, the first multiplexer coupled to an output of a last configurable oscillator stage of the plurality of configurable oscillator stages, the first multiplexer to selectively couple the last output of the last configurable oscillator stage to an input of a first configurable oscillator stage of the plurality of configurable oscillator stages to form the ring oscillator circuit structure in response to the plurality of configuration parameters. In a representative embodiment, the first multiplexer is further coupled to an output of the LC oscillator circuit, the first multiplexer further to selectively couple the output of the LC oscillator circuit to the input of the first configurable oscillator stage to form the delay line circuit structure in response to the plurality of configuration parameters.

Such a representative embodiment of a reconfigurable phase-locked loop integrated circuit may further comprise: a second multiplexer of the plurality of multiplexers, the second multiplexer coupled to the output of the last configurable oscillator stage, the second multiplexer to selectively couple the last output of the last configurable oscillator stage to an output of the reconfigurable phase-locked loop to provide the second output signal having the selected output frequency. In a representative embodiment, the second multiplexer is further coupled to the output of the LC oscillator circuit, the second multiplexer to selectively couple the output of the LC oscillator circuit to the output of the reconfigurable phase-locked loop to provide the first output signal having the selected output frequency.

Such a representative embodiment of a reconfigurable phase-locked loop integrated circuit may further comprise: a second digital controller coupled to the reconfigurable frequency and delay generator, the second digital controller adapted, when the reconfigurable frequency and delay generator is configured as the delay line circuit, to generate a third plurality of control signals to the plurality of configurable oscillator stages to match the phase of the second output signal to the phase of the first output signal.

Such a representative embodiment of a reconfigurable phase-locked loop integrated circuit may further comprise: a third multiplexer coupled to the first digital controller and to the second digital controller, the third multiplexer to selectively couple either the output of the second digital controller or the output of the first digital controller to the plurality of delay control circuits, in response to the plurality of configuration parameters.

Such a representative embodiment of a reconfigurable phase-locked loop integrated circuit may further comprise: a second phase sampler coupled to the second digital controller and to the plurality of configurable oscillator stages.

In such a representative embodiment, the second digital controller may comprise: a binary encoder coupled to the second phase sampler, the binary encoder adapted to generate a second binary count corresponding to positional phase information provided by the second phase sampler; and an accumulator to add and accumulate successive second binary counts generated by the binary encoder.

In such a representative embodiment, the output of the accumulator comprises a plurality of coefficients forming a control word, each coefficient corresponding to a control signal of the plurality of control signals provided on a signaling bus to the plurality of delay control circuits.

In another such a representative embodiment, the second digital controller may further comprise: a coefficient generator coupled to the accumulator and adapted to generate a plurality of coefficients forming a control word, each coefficient corresponding to a control signal of the plurality of control signals provided on a signaling bus to the plurality of delay control circuits.

Such a representative embodiment of a reconfigurable phase-locked loop integrated circuit may further comprise: a fourth switch coupled to the first digital controller to selectively couple the output of the first digital controller to the plurality of capacitive tuning circuits, in response to the plurality of configuration parameters.

In a representative embodiment, the plurality of capacitive tuning circuits comprises: a plurality of primary switched capacitors coupleable to the inductor; a plurality of secondary switched digital varactors coupleable to the inductor; and a plurality of voltage controllers, each voltage controller of the plurality of voltage controllers coupled to provide a selected voltage to a corresponding secondary switched digital varactor of the plurality of secondary switched digital varactors. Also in a representative embodiment, each primary switched capacitor of the plurality of primary switched capacitors comprises: a transmission gate; and a FET transistor having its gate coupled to the transmission gate and further having its source and drain coupled to a ground potential; and wherein each secondary switched digital varactor of the plurality of secondary switched digital varactors comprises: a transmission gate; and a FET transistor having its gate coupled to the transmission gate and further having its source and drain coupled to the selected voltage. Also in a representative embodiment, each voltage controller of the plurality of voltage controllers comprises: a plurality of transistors coupled in series to form a voltage ladder circuit structure having a plurality of nodes, each node of the plurality of nodes having a different voltage; and a plurality of transmission gates, each transmission gate of the plurality of transmission gates coupled to a secondary switched digital varactor and to a selected node of the plurality of nodes to transmit the selected voltage to the secondary switched digital varactor in response to the first plurality of control signals.

Another representative embodiment of a reconfigurable phase-locked loop integrated circuit is disclosed which is coupleable to a reference frequency generator and further coupleable to an inductor, with the representative embodiment of the reconfigurable phase-locked loop integrated circuit comprising: a user interface controller adapted to receive user input and convert the user input into a plurality of configuration parameters, at least one configuration parameter of the plurality of configuration parameters specifying a selected output frequency; a memory storing the plurality of configuration parameters; a plurality of capacitive tuning circuits coupleable to the inductor to form an LC oscillator circuit to generate a first output signal having a first output frequency; a plurality of multiplexers; a reconfigurable frequency and delay generator configurable and reconfigurable in response to the plurality of configuration parameters to configure as a ring oscillator or as a delay line circuit, and to generate a second output signal having a second output frequency; and a first digital controller coupled to the reconfigurable frequency and delay generator and to the plurality of capacitive tuning circuits, the first digital controller further coupleable to receive an input signal from the reference frequency generator having a reference frequency, the first digital controller adapted to access the memory and retrieve the plurality of configuration parameters; when the reconfigurable frequency and delay generator is configured as the ring oscillator, to generate a first plurality of control signals to the reconfigurable frequency and delay generator both to generate the second output signal having the second output frequency in response to the plurality of configuration parameters, and to match a phase of the second output signal to an input signal phase; and when the reconfigurable frequency and delay generator is configured as the delay line circuit, to generate a second plurality of control signals to the plurality of capacitive tuning circuits both to generate the first output signal having the first output frequency in response to the plurality of configuration parameters, and to match a phase of the first output signal to the input signal phase.

Another representative embodiment of a reconfigurable phase-locked loop integrated circuit is disclosed which is coupleable to a reference frequency generator and further coupleable to an inductor, with the representative embodiment of the reconfigurable phase-locked loop integrated circuit comprising: a user interface controller; a memory circuit to store a plurality of configuration parameters; a plurality of capacitive tuning circuits coupleable to the inductor to form an LC oscillator circuit to generate a first signal; a first plurality of configurable oscillator stages, each configurable oscillator stage of the first plurality of configurable oscillator stages further comprising: (1) at least one core inverter to form a plurality of core inverters coupled in series, the plurality of core inverters including a first core inverter and a last core inverter, the last core inverter generating a second signal; and (2) a first plurality of delay control circuits, each delay control circuit of the first plurality of delay control circuits coupled to an output of a corresponding core inverter of the plurality of core inverters; a first phase sampler coupled to the plurality of configurable oscillator stages; a first multiplexer coupled to the LC oscillator circuit and to the first core inverter, the first multiplexer to select the first signal or the second signal as the input of the first core inverter, in response to the plurality of configuration parameters; a second multiplexer coupled to the LC oscillator circuit and to the last core inverter, the second multiplexer to select the first signal or the second signal as the output signal, in response to the plurality of configuration parameters; a first digital controller coupled to receive a reference input signal from the reference frequency generator having a reference frequency, the first digital controller adapted to generate a plurality of control signals to the plurality of capacitive tuning circuits or to the plurality of delay control circuits to generate the selected output frequency and to match a phase of the output signal to a phase of the reference input signal; a second digital controller; a third multiplexer coupled to the first digital controller and to the second digital controller, the third multiplexer to selectively couple the output of the first digital controller or the second digital controller to the plurality of delay control circuits, in response to the plurality of configuration parameters; and a fourth switch to selectively couple the output of the first digital controller to the plurality of capacitive tuning circuits in response to the plurality of configuration parameters.

A representative embodiment of a reconfigurable, cascaded digital phase-locked loop integrated circuit is also disclosed which is coupleable to a reference frequency generator to generate an input signal having a reference frequency, the cascaded digital phase-locked loop integrated circuit comprising: a first digital phase-locked loop circuit configured to generate a first signal having a first frequency which is an integer multiple of the reference frequency; and a second digital phase-locked loop circuit coupled to the first digital phase-locked loop, the second digital phase-locked loop configured to generate a second, output signal having a second output frequency in response to a plurality of configuration parameters, the second frequency having a configurable fractional offset from the integer multiple of the reference frequency, and to match a phase of the second output signal with a first signal phase.

In such a representative embodiment, the second digital phase-locked loop circuit is further configured to generate a configurable error signal to generate the second output signal having the second output frequency in response to the plurality of configuration parameters. For example, the second digital phase-locked loop circuit may be further configured to generate a configurable error signal in response to the plurality of configuration parameters, and to use the configurable error signal in a feedback error signal to generate the second output signal having the second output frequency.

The representative embodiment of the reconfigurable, cascaded digital phase-locked loop integrated circuit may further comprise: a memory storing the plurality of configuration parameters, at least one configuration parameter of the plurality of configuration parameters specifying the second output frequency.

In a representative embodiment, the first digital phase-locked loop circuit comprises: a first reconfigurable frequency and delay generator configurable and reconfigurable in response to the configuration parameters to generate the first signal having the first frequency; and a first digital controller coupled to the memory and to the first reconfigurable frequency and delay generator, the digital controller further coupleable to receive an input signal from the reference frequency generator having a reference frequency, the first digital controller adapted to access the memory and retrieve the plurality of configuration parameters, and to generate a first plurality of control signals to the first reconfigurable frequency and delay generator both to generate the first signal having the first frequency in response to the plurality of configuration parameters, and to match a phase of the first signal to an input signal phase.

In a representative embodiment, the second digital phase-locked loop circuit comprises: a second reconfigurable frequency and delay generator configurable and reconfigurable in response to the configuration parameters to generate the second output signal having the second output frequency; and a second digital controller coupled to the memory, to the first reconfigurable frequency and delay generator and to the second reconfigurable frequency and delay generator, the second digital controller configured to access the memory and retrieve the plurality of configuration parameters, the second digital controller further configured to generate a configurable error signal in response to a plurality of configuration parameters, to add the configurable error signal into a feedback error signal to generate a second plurality of control signals to the second reconfigurable frequency and delay generator to provide the second output signal having the second output frequency and to match a phase of the second output signal to a first signal phase In such a representative embodiment, the second digital controller comprises: a divider to receive the second output signal; a phase detector coupled to the divider and to the first reconfigurable frequency and delay generator, the phase detector adapted to generate a first error signal from the difference between the phase of the divided second output signal and the first signal; an adder to add the configurable error signal to the first error signal to generate the feedback error signal; and a digital loop filter to convert the feedback error signal into the second plurality of control signals.

Another representative embodiment of a reconfigurable, cascaded digital phase-locked loop integrated circuit is also disclosed which is coupleable to a reference frequency generator to generate an input signal having a reference frequency, the reconfigurable, cascaded digital phase-locked loop integrated circuit comprising: a user interface controller adapted to receive user input and to convert the user input into a plurality of configuration parameters; a memory coupled to the user interface controller, the memory storing the plurality of configuration parameters, at least one configuration parameter of the plurality of configuration parameters specifying an output frequency; a first digital phase-locked loop configured to generate a first signal having a first frequency which is an integer multiple of the reference frequency; and a second digital phase-locked loop coupled to the first digital phase-locked loop, the second digital phase-locked loop adapted to generate a configurable error signal in response to the plurality of configuration parameters, and to add the configurable error signal into a feedback error signal to generate a second output signal having a second output frequency, the second output frequency having a configurable fractional offset from the integer multiple of the reference frequency, and to match a phase of the second output signal with a first signal phase.

Another representative embodiment of a reconfigurable, cascaded digital phase-locked loop integrated circuit is disclosed which is coupleable to an oscillator to receive an input signal having a first frequency which is an integer multiple of a reference frequency, the reconfigurable, cascaded digital phase-locked loop integrated circuit comprising: a user interface controller adapted to receive user input and to convert the user input into a plurality of configuration parameters; a memory coupled to the user interface controller, the memory storing the plurality of configuration parameters, at least one configuration parameter of the plurality of configuration parameters specifying an output frequency; a plurality of configurable oscillator stages, each configurable oscillator stage of the plurality of configurable oscillator stages further comprising: (1) a plurality of core inverters coupled in series, a last core inverter of the plurality of core inverters generating an output signal having a second frequency; and (2) a plurality of delay control circuits, each delay control circuit of the first plurality of delay control circuits coupled to an output of a corresponding core inverter of the plurality of core inverters; and a digital controller coupled to the plurality of delay control circuits and coupleable to the oscillator to receive the input signal having the first frequency, the digital controller configured to access the memory and retrieve the plurality of configuration parameters, the digital controller further configured to generate a configurable error signal in response to the plurality of configuration parameters, to add the configurable error signal into a feedback error signal to generate a plurality of control signals to the plurality of delay control circuits to provide the output signal having the second frequency and to match a phase of the output signal to an input signal phase, the second frequency having a configurable fractional offset from the integer multiple of the reference frequency.

Another representative embodiment of a reconfigurable phase-locked loop is disclosed which is coupleable to a reference frequency generator, comprising: a user interface controller; a memory circuit to store a plurality of configuration parameters, the plurality of configuration parameters comprising a plurality of coefficients corresponding to a plurality of selectable, predetermined second error signals; a first reconfigurable frequency and delay generator comprising: a first plurality of core inverters coupled in series, a last core inverter of the first plurality of core inverters generating a first signal having a first selected frequency; and a first plurality of delay control circuits, each delay control circuit of the first plurality of delay control circuits coupled to an output of a corresponding core inverter of the plurality of core inverters; a second reconfigurable frequency and delay generator comprising: a second plurality of core inverters coupled in series, a last core inverter of the plurality of core inverters generating a second output signal having a second selected output frequency; and a second plurality of delay control circuits, each delay control circuit of the second plurality of delay control circuits coupled to an output of a corresponding core inverter of the second plurality of core inverters; a first digital controller coupleable to the reference frequency generator to receive a reference input signal having a reference frequency and further coupled to the first plurality of delay control circuits, the first digital controller adapted to generate a first plurality of control signals to the first plurality of delay control circuits to generate the first signal having the first selected frequency and to match a phase of the first signal to a phase of the reference input signal, the first selected frequency being an integer multiple of the reference frequency; and a second digital controller coupled to the last core inverter of the first plurality of core inverters to receive the first signal having the first selected frequency, the second digital controller adapted to generate a first error signal from the difference between the phase of a divided second output signal and the first signal; to select and add to the first error signal a predetermined second error signal of the plurality of selectable, predetermined second error signals to generate a feedback error signal, to convert the feedback error signal to a second plurality of control signals to the second plurality of delay control circuits to generate the second output signal having the second selected output frequency and to match a phase of the second output signal to a phase of the first signal, the second selected output frequency having a predetermined fractional offset from the integer multiple of the reference frequency.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which.

DETAILED DESCRIPTION OF REPRESENTATIVE EMBODIMENTS

Figure 1:
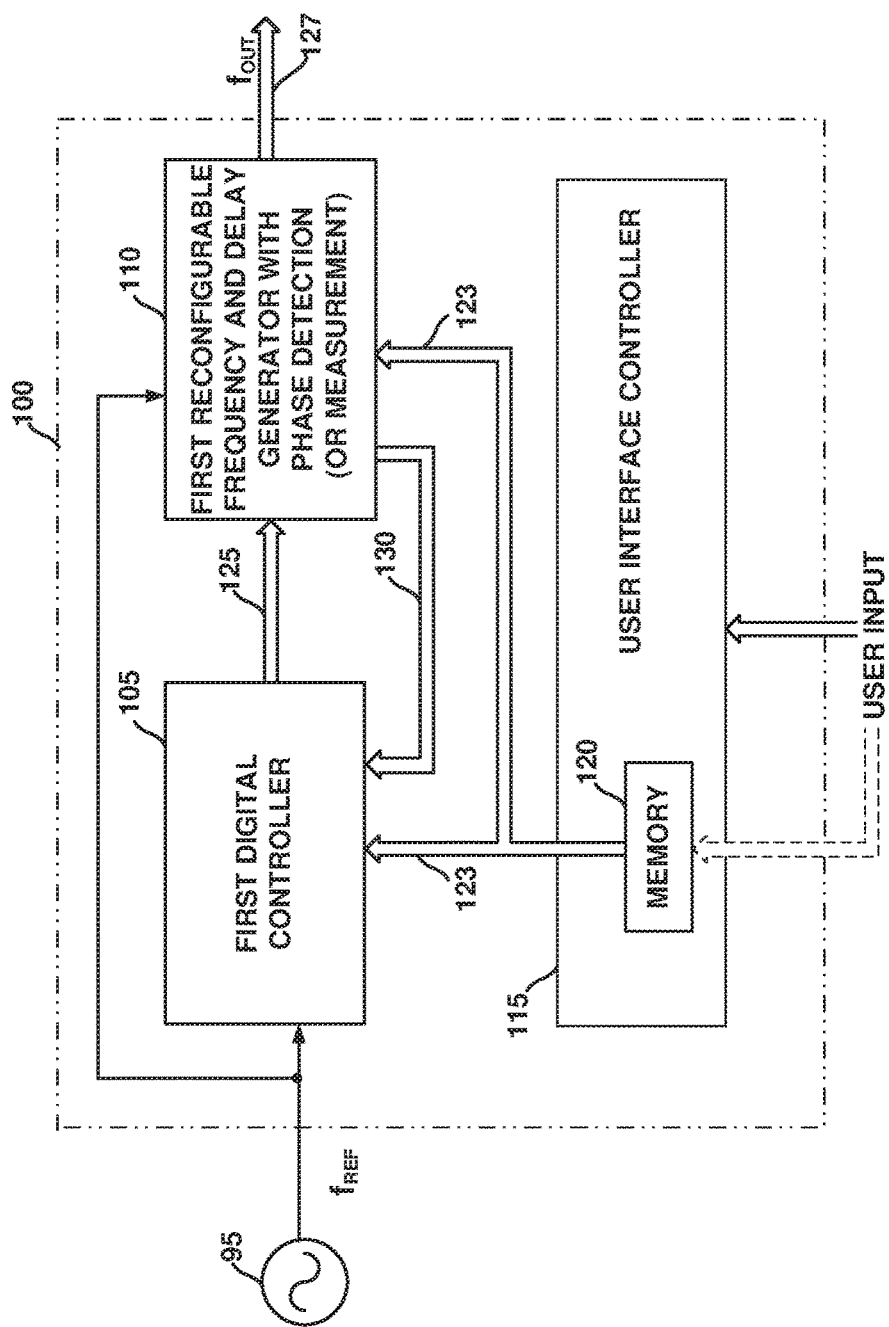
FIG. 1 is a block diagram illustrating an exemplary or representative embodiment of a first reconfigurable, digital phase-locked loop.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

As mentioned above, various representative embodiments provide a first, second and third reconfigurable, digital phase-locked loops 100, 200, 300 which generate a frequency reference or delay with phase detection or measurement and which are configurable or reconfigurable for a variety of parameters and various options, such as (1) the desired frequency $f_{OUT}$ of the output signal; (2) bandwidth (for noise suppression); (3) frequency accuracy or Q value; (4) frequency resolution (frequency increments, such as the minimum capacitance values and minimum voltage increments for tuning the frequency); (5) number of stages; (6) jitter level or scale (phase increments for phase locking); (7) power consumption; and/or (8) fractional frequency selection, for example and without limitation.

Various representative embodiments of the first, second and third reconfigurable, digital phase-locked loops 100, 200, 300 may be implemented as a circuitry netlist (generated using Verilog as an IC design tool, for example) or other comparable circuit specification. Such an inventive circuitry netlist or other comparable circuit specification of the representative embodiments can then be combined with the standard cells (or standard digital gates) of any selected silicon fabrication process technology (using such available IC design tools), together with the balance of the IC circuitry which is to utilize the first, second and/or third reconfigurable, digital phase-locked loops 100, 200, 300, to generate an overall GDSII file incorporating the first, second and/or third reconfigurable, digital phase-locked loops 100, 200, 300. This results in the first, second and third reconfigurable, digital phase-locked loops 100, 200, 300 embodiments having a selected, malleable or otherwise variable IC layout (or floorplan), rather than a fixed or predetermined IC floorplan, and effectively enables a customized reconfigurable, digital PLL IC layout (or floorplan) specifically tailored to the balance of the IC circuitry which is to utilize the first, second and/or third reconfigurable, digital phase-locked loops 100, 200, 300. As a result, the representative embodiments of the first, second and third reconfigurable, digital phase-locked loops 100, 200, 300 are readily insertable into virtually any selected IC design with either no or comparatively minor modification.

Various representative embodiments of the first, second and third reconfigurable, digital phase-locked loops 100, 200, 300 are also compatible with a wide variety of reference signal generators, including crystal oscillators, LC oscillators, RC oscillators, and other relaxation oscillators. Various representative embodiments of the first, second and third reconfigurable, digital phase-locked loops 100, 200, 300 also provide for control over output frequency and phase, to provide a stable and desired frequency and phase in response to variation in ambient or junction temperature or variation in other parameters such as voltage, fabrication process, frequency, and age.

The first, second and third reconfigurable, digital phase-locked loops 100, 200, 300 thereby provide considerable flexibility to change multiple parameter specifications, with minimal if any changes to hardware. As a result, the first, second and third reconfigurable, digital phase-locked loops 100, 200, 300 are not tied to specific applications and are not fixed by any given set of specifications.

FIG. 1 is a block diagram illustrating an exemplary or representative embodiment of a first reconfigurable, digital phase-locked loop (PLL) 100. It should be noted that while referred to herein as digital (or digitally-controlled) phase-locked loops (e.g., "Omni PLL™"), the first, second and third reconfigurable, digital PLLs 100, 200, 300 may be referred to equivalently and without a loss of generality as reconfigurable, digital oscillators, or as reconfigurable, digital clocks or clock references, or as reconfigurable, digital PLL, clock or clock reference cell libraries, all for example and without limitation.

As mentioned above, a first embodiment of a reconfigurable, digital phase-locked loop 100 comprises a first digital controller 105, a first reconfigurable frequency and delay generator with phase detection (or measurement) 110, an optional user interface controller 115, and a memory 120 or other registers to store parameters and other user input for configuration and reconfiguration of the reconfigurable, digital PLL 100. The user interface controller 115 may be optional for a selected embodiment. While the memory 120 (or other registers) to store parameters and other user input for configuration and reconfiguration of the reconfigurable, digital PLL 100 is illustrated as part of the user interface controller 115, those have skill in the art will recognize that any such memory 120 may be separate from the (optional) user interface controller 115, and all such variations are within the scope of the disclosure. For ease of reference and discussion, the first and/or second reconfigurable frequency and delay generators with phase detection (or measurement) 110, 140 may be referred to more simply and abbreviated as "first and/or second reconfigurable frequency and delay generators" 110, 140, it being understood that any such reference means and includes the phase detection and/or measurement capabilities. As discussed in greater detail below, there are several different versions or alternative circuit configurations for the first and/or second reconfigurable frequency and delay generators 110, 140, any and all of which are within the scope of this disclosure.

It should be noted that the first digital controller 105 (and also the second and third digital controllers 135, 145) may also be referred to equivalently as a "digital control loop circuit", as each such controller (105, 135, 145) is or provides a digital control loop circuit that is coupleable to virtually any oscillator to form a configurable, digital phase-locked loop.

As illustrated, a reference frequency ("$f_{REF}$", from a reference clock (or oscillator) 95, such as a crystal oscillator or an LC oscillator (e.g., an LC tank), for example and without limitation) is input into the first digital controller 105 and the first reconfigurable frequency and delay generator 110, and the first reconfigurable frequency and delay generator 110 provides or generates an output signal (on line or bus 127) which oscillates at the desired or selectable frequency ("$f_{OUT}$" (or "$f_{OUT1}$")), as illustrated. Also as illustrated, feedback of frequency and phase information, as described in greater detail below, is provided to the first digital controller 105 from the first reconfigurable frequency and delay generator 110, typically via a first (feedback) bus 130 or other communication lines or wires. In addition, frequency and phase control is provided to the first reconfigurable frequency and delay generator 110 from the first digital controller 105, typically in the form of control signals (e.g., as a filtered error signal), also referred to herein as one or more control words, via a second (control) bus 125. As discussed in greater detail below, these control signals are typically high or low voltages, corresponding to or which may be represented by binary coefficient values of one or more control words. Each of these components, and various embodiments of these components, are also described in greater detail below.

Figure 2:
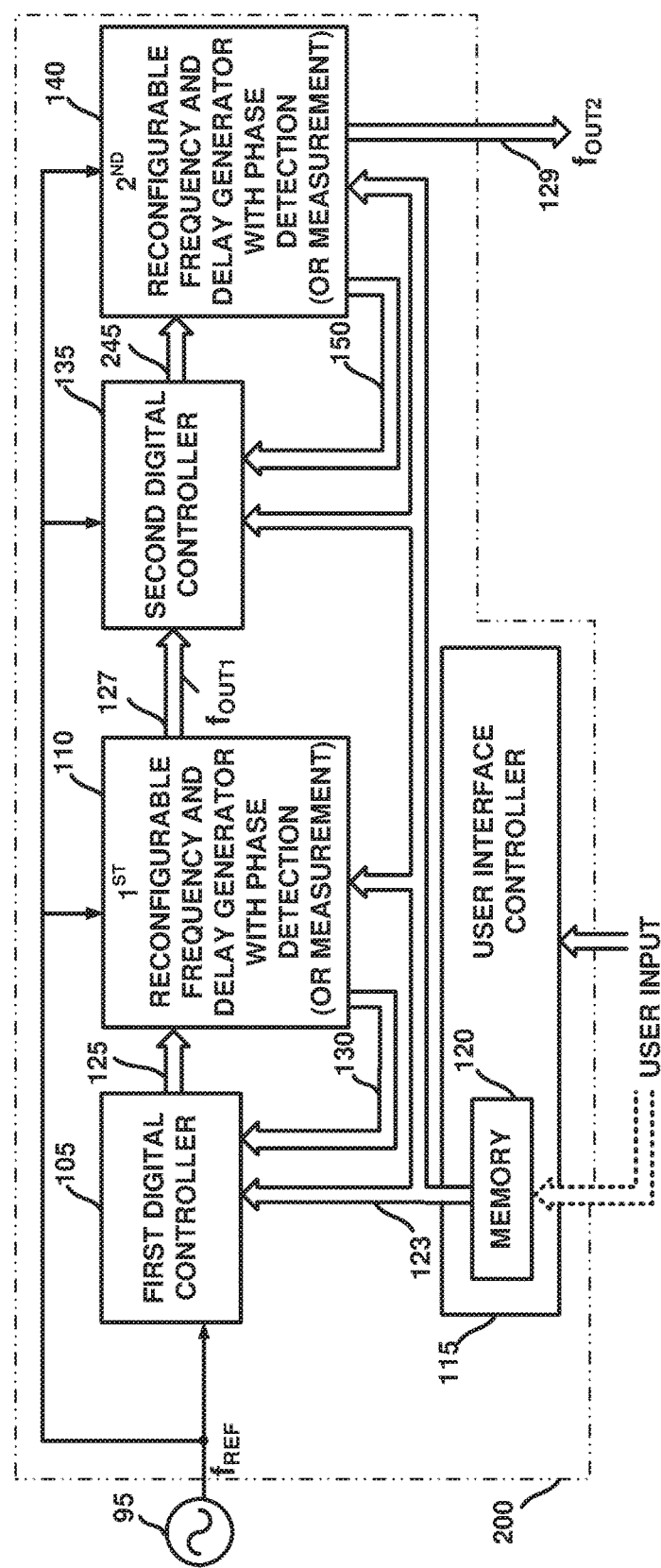
FIG. 2 is a block diagram illustrating an exemplary or representative embodiment of a second reconfigurable, digital phase-locked loop.

FIG. 2 is a block diagram illustrating an exemplary or representative embodiment of a second reconfigurable, digital phase-locked loop 200, which is used to provide a fractional output signal, i.e., an output signal at a fractional offset, increment or multiple of the input reference frequency. As mentioned above, the second embodiment of a reconfigurable, digital phase-locked loop 200 also comprises a first digital controller 105, a first reconfigurable frequency and delay generator 110, an optional user interface controller 115, and a memory 120 or other registers to store parameters and other user input for configuration and reconfiguration of the reconfigurable, digital phase-locked loop 200, and further comprises a second digital controller 135 and a second reconfigurable frequency and delay generator 140. As discussed in greater detail below, there are several different versions or alternative circuit configurations for the second reconfigurable frequency and delay generator 140, any and all of which are within the scope of this disclosure. As illustrated, the reference frequency ($f_{REF}$) is also input into the first digital controller 105 and the first reconfigurable frequency and delay generator 110, and is additionally input into the second digital controller 135 and the second reconfigurable frequency and delay generator 140.

For the second reconfigurable, digital phase-locked loop 200, the first reconfigurable frequency and delay generator 110 also generates a first output signal having output frequency $f_{OUT1}$, precisely as described above with reference to the first reconfigurable, digital phase-locked loop 100, output on line or bus 127 and provided to the second digital controller 135. The second reconfigurable frequency and delay generator 140 provides or generates the overall or second output signal having the desired or selectable (fractional) frequency ($f_{OUT2}$), which is a fractional offset from an integer multiple of the reference frequency, as illustrated, on line or bus 129. Also as illustrated, feedback of frequency and phase information, as described in greater detail below, is also provided to the first digital controller 105 from the first reconfigurable frequency and delay generator 110, typically via a first (feedback) bus 130 or other communication lines or wires. In addition, frequency and phase control is provided to the first reconfigurable frequency and delay generator 110 from the first digital controller 105, typically in the form of control word signals, via a second (control) bus 125.

For the second reconfigurable, digital phase-locked loop 200, feedback of frequency and phase information, as described in greater detail below, is also provided to the second digital controller 135 from the second reconfigurable frequency and delay generator 140, typically via a third (feedback) bus 150 or other communication lines or wires. In addition, frequency and phase control is provided to the second reconfigurable frequency and delay generator 140 from the second digital controller 135, also typically in the form of control signals (e.g., as an error signal, as a control word, etc.), via a fourth (control) bus 245. Each of these components, and various embodiments, is described in greater detail below.

It should be noted that for the second reconfigurable, digital phase-locked loop 200, in a representative embodiment, the second reconfigurable frequency and delay generator 140 may be implemented identically or similarly to the first reconfigurable frequency and delay generator 110, in any of the variations or alternative circuit configurations. Also in a representative embodiment, the second digital controller 135 is generally not identical or substantially similar to the first digital controller 105, and instead has different circuit structures, along with different control and feedback mechanisms. In another representative embodiment, the second digital controller 135 may be implemented identically to the first digital controller 105, but with the addition of a second configurable error signal (650), as discussed in greater detail below.

Various configurations are also provided to the first and/or second digital controllers 105, 135 and the first and/or second reconfigurable frequency and delay generators 110, 140 (via bus 123), which may be in the form of configuration parameters input by a user either into the user interface controller 115 or directly into the memory 120. In turn, the user interface controller 115 also may transform the input configuration parameters into other forms (e.g., digital filter coefficients) and store the transformed configuration parameters in the memory 120. The various configuration parameters are then distributed to selected components (e.g., via lines or bus 123), as discussed in greater detail below, such as for the selection of various available circuit configurations and for the selection of other parameters such as jitter levels, as selection signals, control signals, or filter coefficients, for example and without limitation. The various configuration parameters may also be utilized by the first and/or second digital controllers 105, 135 in generation of the various control signals, such as a configurable error signal for fractional output frequencies. Accordingly, the configuration parameters may provide control directly, or indirectly through the various control signals or selection signals. Accordingly, any reference to "in response to one or more control signals" may also mean and include "in response to one or more control signals and/or configuration parameters" or "in response to one or more configuration parameters" or "in response to one or more control signals which are in response to one or more configuration parameters", as indicated by the context, and all such variations are within the scope of the disclosure.

Figure 3:
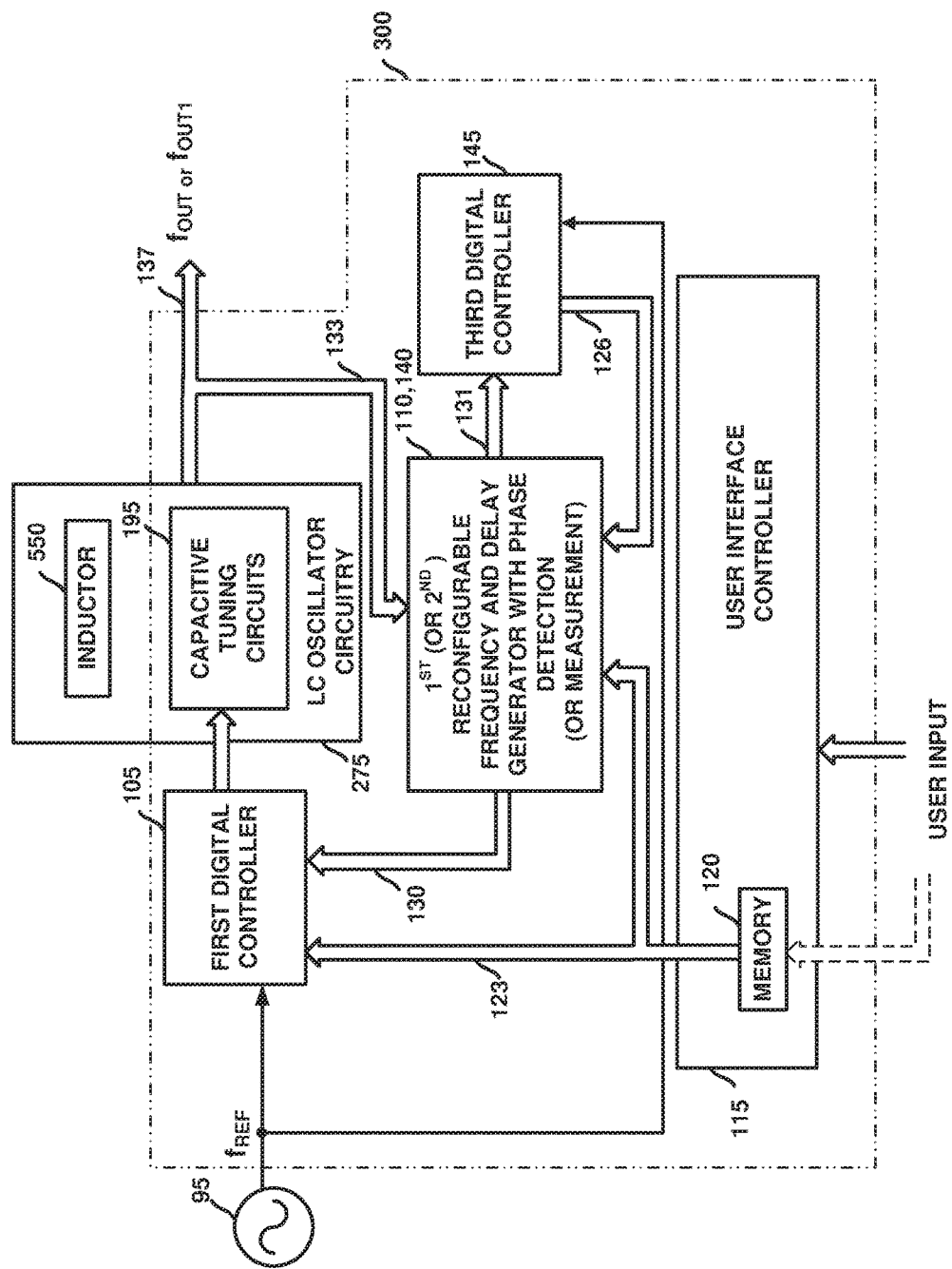
FIG. 3 is a block diagram illustrating an exemplary or representative embodiment of a third reconfigurable, digital phase-locked loop.

FIG. 3 is a block diagram illustrating an exemplary or representative embodiment of a third reconfigurable, digital phase-locked loop 300. A first embodiment of a reconfigurable, digital phase-locked loop 300 also comprises a first digital controller 105, a first (or second) reconfigurable frequency and delay generator 110, 140, an optional user interface controller 115, and a memory 120 or other registers to store parameters and other user input for configuration and reconfiguration of the reconfigurable, digital PLL 300. As mentioned above, there are several different versions or alternative circuit configurations for the first and/or second reconfigurable frequency and delay generator 110, 140, any and all of which are within the scope of this disclosure.

The third reconfigurable, digital phase-locked loop 300 differs from the first and second reconfigurable, digital phase-locked loops 100, 200 and further comprises an LC (inductive and capacitive) oscillator 275, and a third digital controller 145. As illustrated for the third reconfigurable, digital phase-locked loop 300, a reference frequency ("$f_{REF}$", from a reference clock (or oscillator) 95, such as a crystal oscillator or an LC oscillator (e.g., an LC tank), for example and without limitation) is also input into the first digital controller 105 and the first reconfigurable frequency and delay generator 110. For the third reconfigurable, digital phase-locked loop 300, the first reconfigurable frequency and delay generator 110 is coupled to receive the output signal having output frequency $f_{OUT}$ from the LC oscillator 275 (on line or bus 133), and the first reconfigurable frequency and delay generator 110 is configured (or reconfigured) to operate as a delay line 190 circuit configuration (or delay locked loop, rather than a ring oscillator circuit configuration), synchronizing and locking in frequency and phase to the LC oscillator 275, and further generating incremental and/or interpolated phase information pertaining to the LC oscillator 275 which would otherwise be unavailable from the LC oscillator 275. The LC oscillator 275 provides or generates an output signal (on line or bus 137) which oscillates at the desired or selectable frequency ("$f_{OUT}$" or "$f_{OUT1}$"), as illustrated.

Not separately illustrated, the third reconfigurable, digital phase-locked loop 300 may also be utilized in the second reconfigurable, digital phase-locked loop 200, directly replacing or substituting for the configuration of the first digital controller 105 and first reconfigurable frequency and delay generator 110 illustrated in FIG. 2. For such an embodiment, the output of the LC oscillator 275 (as "$f_{OUT1}$") on line or bus 137 is provided to the second digital controller 135, and the second reconfigurable frequency and delay generator 140 generates an output signal having the fractional offset frequency $f_{OUT2}$, as discussed above.

Also as illustrated in FIG. 3, feedback of frequency and phase information, as described in greater detail below, is provided from the first reconfigurable frequency and delay generator 110 to the first digital controller 105 and to the third digital controller 145, typically via first (feedback) bus 130 and fifth (feedback) bus 131, respectively, or other communication lines or wires. In addition, frequency and phase control is provided to the LC oscillator 275 from the first digital controller 105, typically in the form of control signals (e.g., as control words or as a filtered error signal), also referred to herein as one or more control words, via a second (control) bus 125. In addition, phase control is provided to the first reconfigurable frequency and delay generator 110 (configured (or reconfigured) to operate as a delay line or delay locked loop) from the third digital controller 145, typically in the form of control signals (e.g., as control words or a filtered error signal), also referred to herein as one or more control words, via a sixth (control) bus 126. As discussed in greater detail below, these control signals are also typically high or low voltages, corresponding to or which may be represented by binary coefficient values of one or more control words. Each of these components, and various embodiments of these components, are also described in greater detail below. Various configurations are also provided to the first digital controller 105 and the first reconfigurable frequency and delay generator 110 (via bus 123), which may be in the form of configuration parameters input by a user either into the user interface controller 115 or directly into the memory 120, as discussed above.

As mentioned above, for the first, second and third reconfigurable, digital phase-locked loops 100, 200, 300, the (optional) user interface controller 115 and/or memory 120 provides for user input of any of a wide variety of selectable configuration parameters, such as selection of frequency, bandwidth, frequency resolution, jitter level or scale, power consumption, noise suppression, and/or fractional frequencies, which are then used for the configuration and/or reconfiguration of the first, second and third reconfigurable, digital phase-locked loops 100, 200, 300. Depending on the selected embodiment, a memory 120 or other registers or information storage devices may also be included and generally is included to store these various parameters and other user input. The configuration parameters may be input directly into the memory 120 or into the user interface controller 115. Such user input may occur at any time, depending upon the selected embodiment, such as by setting the various selectable configuration parameters during fabrication (e.g., setting parameters stored in memory 120 or other registers), or post-fabrication or post-packaging (e.g., during a calibration process), or during use, such as for configuration and/or reconfiguration of the selectable configuration parameters for frequency, bandwidth, frequency resolution, jitter level or scale, power consumption, noise suppression, and/or fractional frequencies, also setting and storing the various selectable configuration parameters in memory 120 or other registers.

Other configuration parameters are also input, and as mentioned above, are utilized for selection of circuit configurations, such as the number of oscillator stages (270), the configuration for use of the LC circuitry as a third reconfigurable, digital phase-locked loop 300, the selection of various multiplexers, the use and configuration of the phase interpolator (165), and so on.

In addition, the first, second and third reconfigurable, digital phase-locked loops 100, 200, 300 generate and provide as an output a desired or selectable frequency, $f_{OUT}$, which may be either an integer or fractional multiple or division of the input reference frequency $f_{REF}$, which is typically generated by another form of reference frequency generator, such as a crystal oscillator, a free-running LC oscillator, and so on.

Significantly, and as discussed in greater detail below, the first digital controller 105 (and also the second and third digital controllers 135, 145) can be implemented to be both timing independent and process independent, and can be provided as a circuit netlist without modification for virtually any IC fabrication process, as mentioned above. The first digital controller 105 (and also the second and third digital controllers 135, 145) are independent from the first and second reconfigurable frequency and delay generators 110, 140, respectively, and further independent from the LC oscillator 275, all with respect to timing, so the circuitry layouts may be done independently as well.

The first digital controller 105 (and also the second and third digital controllers 135, 145) may be designated or specified using behavioral code, which is then used to directly generate and provide a circuit netlist, or a GDSII file or other IC layout, for example, for fabrication for a selected IC fabrication process, and therefore is independent of fabrication process as well. Stated another way, given the inventive circuit design of the first digital controller 105, such as using a gray code counter 210 to cross clock domains, together with the specification of all of this circuit functionality and algorithms using behavioral code (if x, then y), the first digital controller 105 (and also the second and third digital controllers 135, 145) are directly "synthe-sizable", directly convertible to a circuit netlist, and may be fabricated using any fabrication process technology without modification.

Similarly, and as described in greater detail below, given the nature of the timing-independent control from the respective first digital controller 105 (and also the second and third digital controllers 135, 145), which may be considered to be analog circuits, very minimal information about a fabrication process technology is required to transfer or port the first and second reconfigurable frequency and delay generators 110, 140 between and among different IC fabrication processes and, in turn, only very limited modification is required for implementation of the first and second reconfigurable frequency and delay generators 110, 140 in any given fabrication process technology. The first and second reconfigurable frequency and delay generators 110, 140 have been implemented using multiple instantiations of the same components having highly regular structures, such as multiple oscillator stages 270, each of which has an identical circuit structure that can be optimized using a guided place and route, and repeated across the IC as necessary or desirable. As a result, the first and second reconfigurable frequency and delay generators 110, 140 can also be provided as circuitry netlists across a wide range of IC fabrication processes without significant modification.

With this ease of synthesis and/or fabrication, the first, second and/or third reconfigurable, digital phase-locked loops 100, 200, 300, and their various components such as the first digital controller 105 (and also the second and third digital controllers 135, 145) and the first and second reconfigurable frequency and delay generators 110, 140, also may then be provided to an end-user or customer as readily-insertable, large scale standard libraries or cells which may be utilized, without modification, in any selected fabrication process for any selected integrated circuit requiring a PLL.

Figure 4:
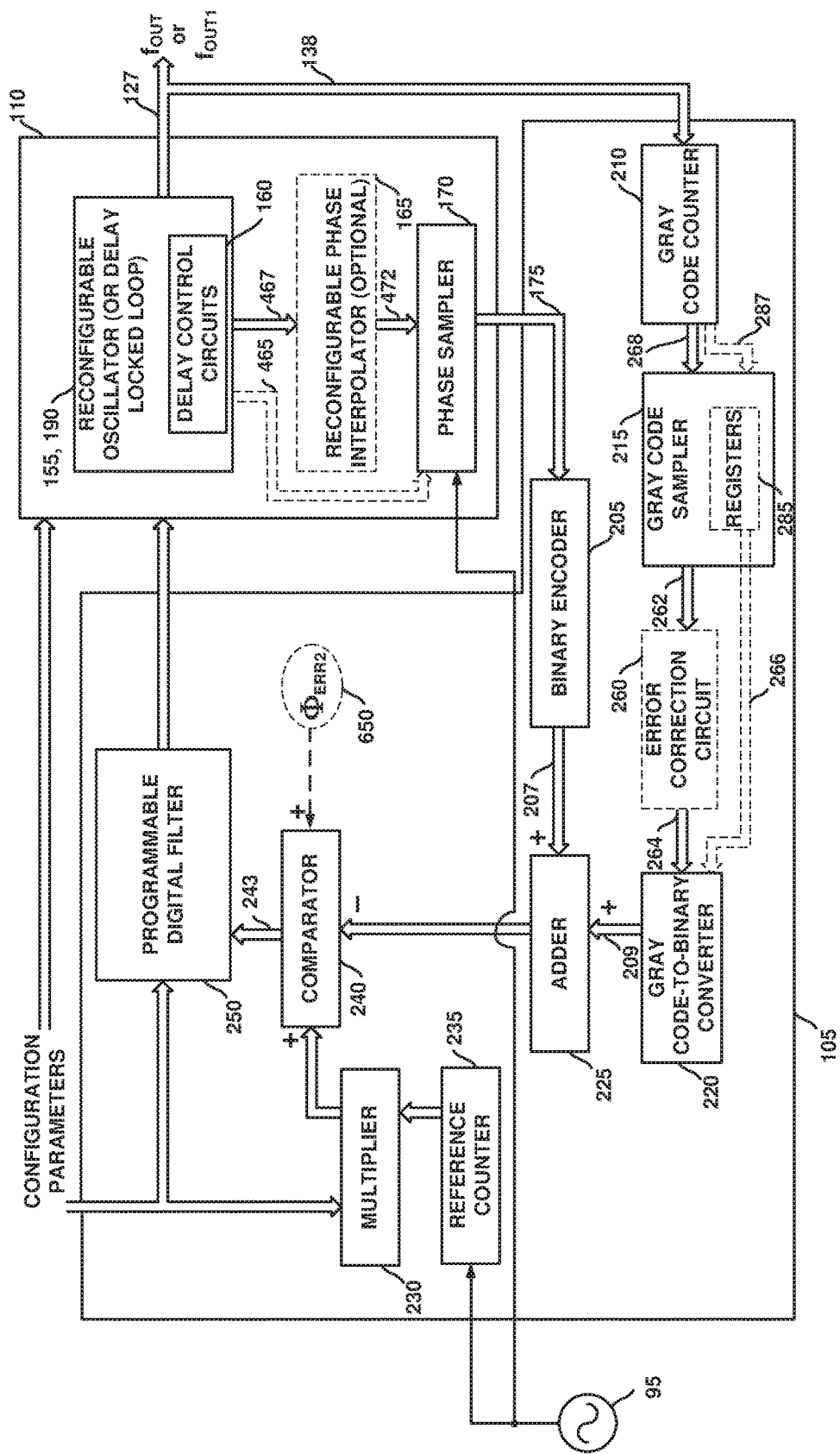
FIG. 4 is a block diagram illustrating exemplary or representative embodiments of a first digital controller and a first reconfigurable frequency and delay generator with phase detection (or measurement) for the first, second or third reconfigurable, digital phase-locked loops.

FIG. 4 is a block diagram illustrating exemplary or representative embodiments of a first digital controller 105 and a first reconfigurable frequency and delay generator 110 for the first, second and/or third reconfigurable, digital phase-locked loops 100, 200, 300. As illustrated, the first reconfigurable frequency and delay generator 110 generally comprises a reconfigurable oscillator or delay line 155, 190, which using the same circuitry may have different configurations, such as a reconfigurable (ring) oscillator (155) (FIGS. 5 and 20) also may be configured instead as a reconfigurable delay line (or delay locked loop) (190) (FIGS. 6 and 21), which further comprises delay control circuits 160. Depending upon the configuration, the reconfigurable oscillator or delay line 155, 190 is referred to herein as a reconfigurable oscillator 155 or as a reconfigurable delay line (or delay locked loop) 190, it being understood that the same circuitry it utilized in both configurations to form different circuit structures. The first reconfigurable frequency and delay generator 110 further comprises an optional reconfigurable phase interpolator 165 (includable as an option, such as a user selectable option with corresponding configuration parameters, such as selectable jitter levels as user input parameters), and one or more phase samplers 170, illustrated in FIG. 4 with one phase sampler 170.

Figure 5:
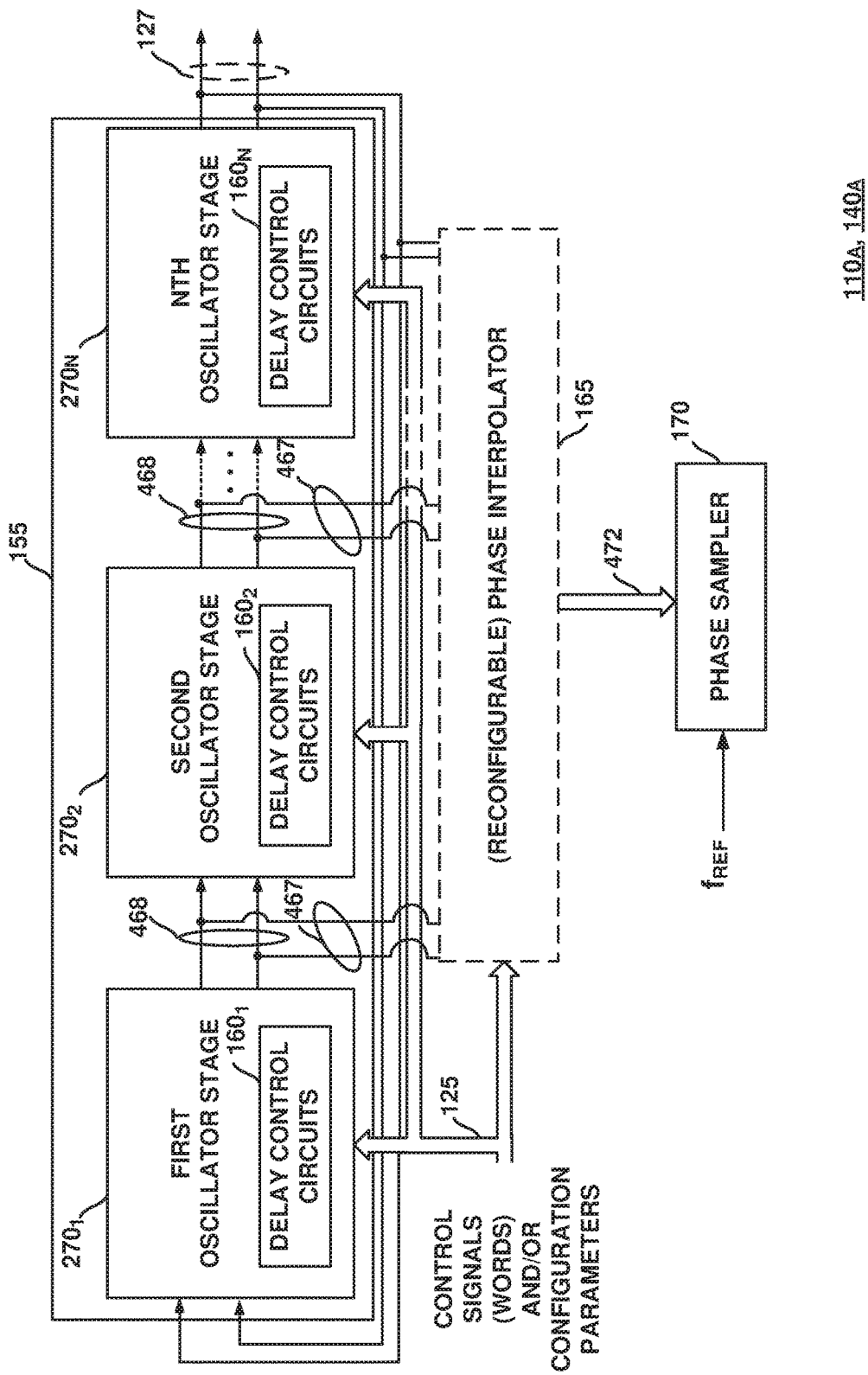
FIG. 5 is a block diagram illustrating in greater detail an exemplary or representative embodiment of a first and/or second reconfigurable frequency and delay generator with phase detection (or measurement), in a first circuit version or alternative, for the first and/or second reconfigurable, digital phase-locked loops.
Figure 6:
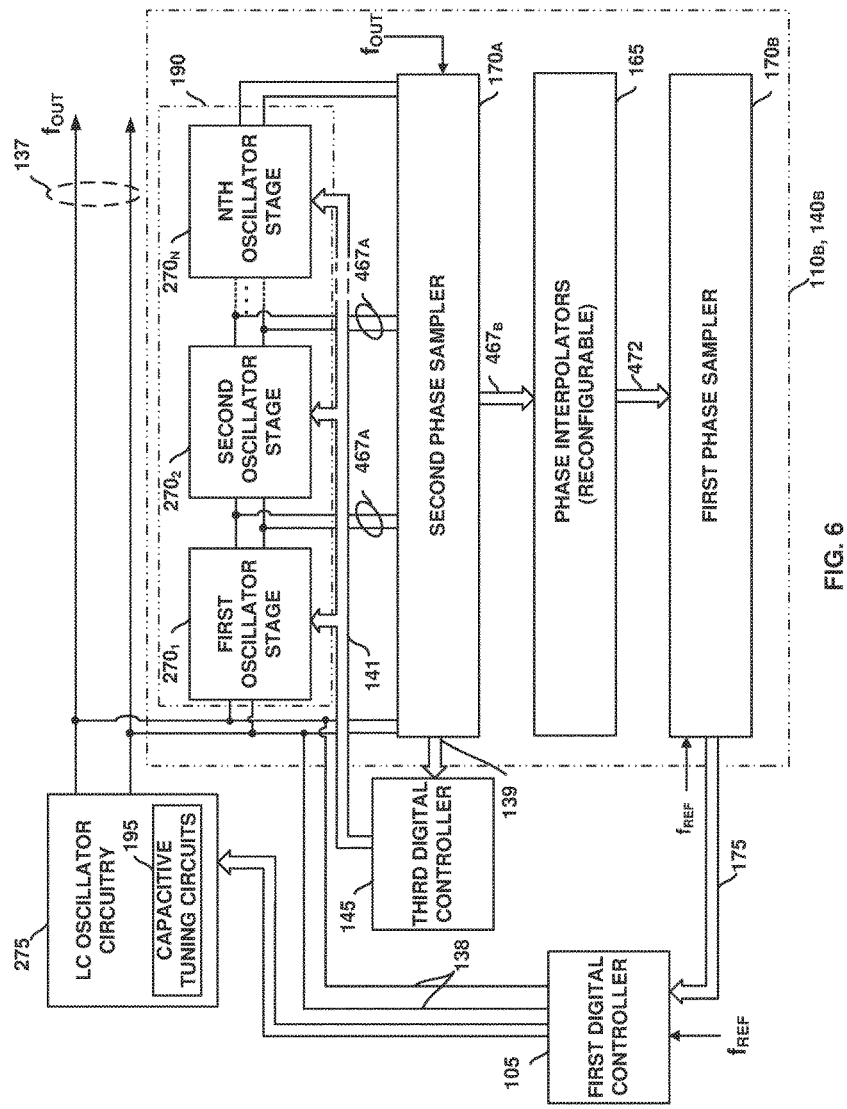
FIG. 6 is a block diagram illustrating in greater detail an exemplary or representative embodiment of a first and/or second reconfigurable frequency and delay generators with phase detection (or measurement), in a second circuit version or alternative, for the third reconfigurable, digital phase-locked loop.
Figure 20:
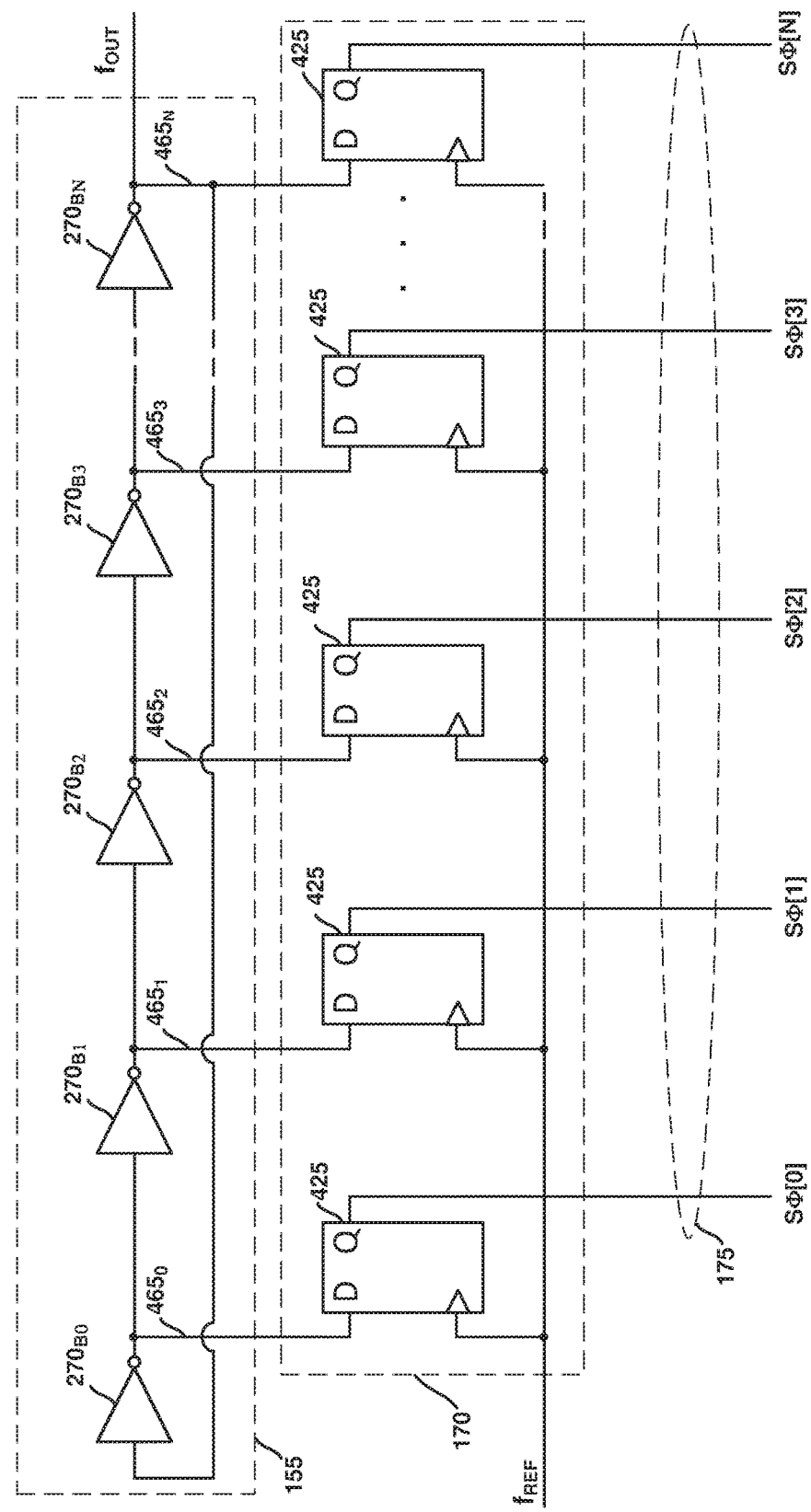
FIG. 20 is a block diagram illustrating in greater detail an exemplary or representative embodiment of a plurality of oscillator stages in a ring oscillator circuit structure and an exemplary or representative embodiment of a phase sampler of the first and/or second reconfigurable frequency and delay generators with phase detection (or measurement) for the first or second reconfigurable, digital phase-locked loops.

As mentioned above, it should be noted that the second reconfigurable frequency and delay generator 140 may be implemented identically or substantially similarly to the first reconfigurable frequency and delay generator 110, and will also generally comprise a reconfigurable oscillator or delay line 155, 190 (which may have different configurations, such as a reconfigurable (ring) oscillator (155) (FIGS. 5 and 20)

also may be configured instead as a reconfigurable delay line (or delay locked loop) (190) (FIGS. 6 and 21)), which further comprises delay control circuits 160, an optional reconfigurable phase interpolator 165 (also includable as an option, such as a user selectable option with corresponding parameters, such as selectable jitter levels as user input parameters), and at least one phase sampler 170. In addition, depending upon the embodiment (e.g., for a third reconfigurable, digital phase-locked loop 300), additional phase samplers 170 may also be included, as an option, to provide phase information for separate use by the third digital controller 145 (as illustrated in FIG. 6).

The first digital controller 105 generally comprises a binary encoder 205, a gray code counter 210, a gray code sampler 215 (which also may include one or more gray code registers 285), an optional error correction circuit 260, a gray code-to-binary converter 220, a adder (or combiner) 225, a multiplier 230, a reference counter (or accumulator) 235, a comparator (adder or subtractor) 240, and programmable digital filter 250. The programmable digital filter 250 is generally implemented to receive an error count (if any) from the comparator (adder or subtractor) 240 (which optionally may also include a second error signal $\phi_{ERR2}$ (650), discussed below), and based upon that error count, using digital control logic circuits, the programmable digital filter 250 generates control signals to modify the frequency and phase of the output signal having a frequency, $f_{OUT}$. The output of the programmable digital filter 250 is one or more control words, provided as control signals (corresponding voltage levels) on bus 125. The control word(s) may be viewed as an ordered set of control signals, such as high or low voltages, corresponding to and/or represented by an ordered plurality of binary coefficients, having a form such as control word comprising coefficients [$a_0, a_1, a_2 \ldots a_N$; $b_0, b_1, b_2, \ldots b_N$; $c_0, c_1, c_2, \ldots c_N$; $d_0, d_1, d_2, \ldots d_N$; $e_0, e_1, e_2, \ldots e_N$; $z_0, z_1, z_2, \ldots z_N$], or equivalently as a plurality of control words comprising coefficients [$a_1, a_1, a_2 \ldots a_N$]; [$b_0, b_1, b_2, \ldots b_N$]; [$c_0, c_1, c_2, \ldots c_N$]; [$d_0, d_1, d_2, \ldots d_N$]; [$e_0, e_1, e_2, \ldots e_N$]; [$z_0, z_1, z_2, \ldots z_N$], for example and without limitation. Accordingly, as used herein, a "control word" should be understood to mean and include any corresponding control signals or digital representations of such control signals, such as a binary 1 (one) corresponding to a high voltage control signal, and a binary 0 (zero) corresponding to a low voltage control signal.

As discussed in greater detail below, these various binary coefficients of the control word(s) have corresponding control signals having high or low voltage levels, and are provided to: (1) the delay control circuits 160 (and its components) and to the reconfigurable phase interpolator 165 for, respectively, frequency and jitter level selection and feedback for frequency and phase locking, for example and without limitation, for the first and second reconfigurable, digital phase-locked loops 100, 200; or (2) the capacitive tuning circuits 195 (and its components, discussed in greater detail below) of the LC oscillator circuitry 275 and to the reconfigurable phase interpolator 165 for, respectively, frequency and jitter level selection and feedback for frequency and phase locking, for example and without limitation, for the third reconfigurable, digital phase-locked loop 300. In addition, for frequency and jitter level selection during configuration and/or reconfiguration, such coefficients may be provided or generated through the user interface controller 115 and/or stored in the memory 120 in response to configuration parameters, or provided directly as configuration parameters, as discussed above. For example and without limitation, a user may configure the first, second and/or third reconfigurable, digital phase-locked loops 100, 200, 300 for a selected frequency and jitter level, which is then translated by the user interface controller 115 into a plurality of coefficients, provided as corresponding control signals to the delay control circuits 160 (and its components) and to the reconfigurable phase interpolator 165, or to the capacitive tuning circuits 195 (and its components) and to the reconfigurable phase interpolator 165, and also optionally stored in the memory 120. Alternatively, the configuration parameters may include such coefficients, which are provided directly to these components from the memory 120.

In various embodiments, the phase sampler 170 and the phase interpolator 165 may also be considered to be part of the first digital controller 105 (and also the second digital controller 135), rather than part of the first and/or second reconfigurable frequency and delay generators 110, 140. For example and without limitation, when each such controller (105, 135, 145) is considered a digital control loop circuit coupleable to any oscillator to form a configurable, digital phase-locked loop, then the phase sampler 170 and the phase interpolator 165 are considered to be part of the first digital controller 105 (and also the second digital controller 135), and may further comprise the memory 120. For such an embodiment, the phase sampler 170, the binary encoder 205 and the gray code counter 210 comprise a "frequency and phase detector", and the digital controller (e.g., 105) is further adapted to detect the frequency and phase of the output signal, and to generate the plurality of control signals in response to both the plurality of configuration parameters and the detected frequency and phase of the output signal.

Figure 7:
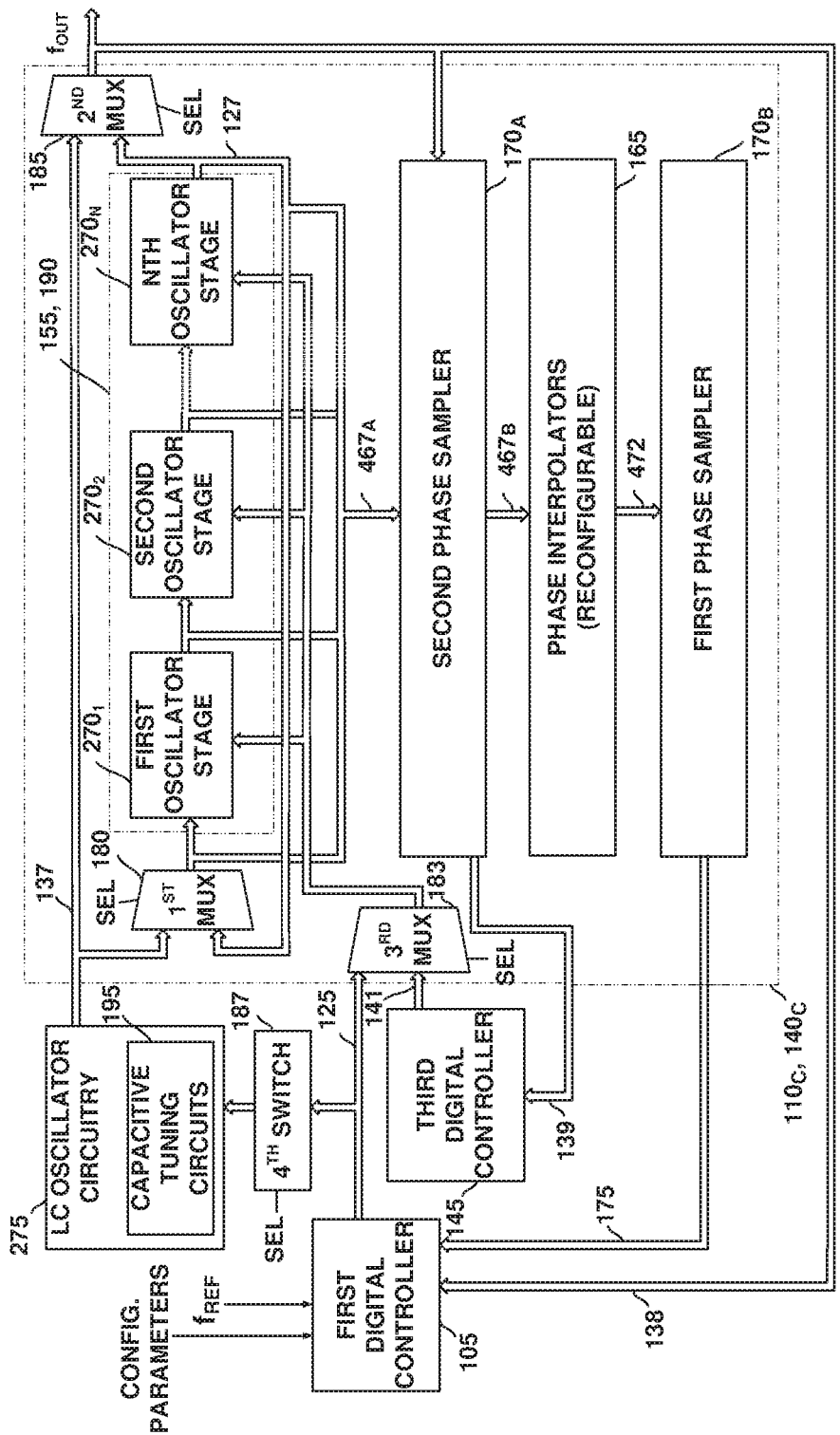
FIG. 7 is a block diagram illustrating in greater detail an exemplary or representative embodiment of a first and/or second reconfigurable frequency and delay generators with phase detection (or measurement), in a third circuit version or alternative, for the first, second or third reconfigurable, digital phase-locked loops.

FIGS. 5-7 are block diagrams illustrating in greater detail exemplary or representative embodiments of first and/or second reconfigurable frequency and delay generators 110, 140, in several different circuit versions or alternatives, for the first, second and/or third reconfigurable, digital phase-locked loops 100, 200, 300. FIG. 5 is a block diagram illustrating in greater detail an exemplary or representative embodiment of first and/or second reconfigurable frequency and delay generator $110_A$, $140_A$, in a first circuit version or alternative, for the first and/or second reconfigurable, digital phase-locked loops 100, 200, in which the reconfigurable oscillator or delay line 155, 190 is configured as a reconfigurable oscillator 155. FIG. 6 is a block diagram illustrating in greater detail an exemplary or representative embodiment of first and/or second reconfigurable frequency and delay generators $110_B$, $140_B$, in a second circuit version or alternative, for the third reconfigurable, digital phase-locked loop 300, in which the reconfigurable oscillator or delay line 155, 190 is configured as a reconfigurable delay line (or delay locked loop) 190. FIG. 7 is a block diagram illustrating in greater detail an exemplary or representative embodiment of first and/or second reconfigurable frequency and delay generators $110_C$, $140_C$, in a third circuit version or alternative, for the first, second and/or third reconfigurable, digital phase-locked loops 100, 200, 300, in which the reconfigurable oscillator or delay line 155, 190 is configurable and reconfigurable as either the reconfigurable oscillator 155 or the reconfigurable delay line (or delay locked loop) 190. Accordingly, any reference to first and/or second reconfigurable frequency and delay generators 110, 140 should be understood to mean and include any and all of the various circuit versions or alternatives $110_A$, $110_B$, $110_C$, and $140_A$, $140_B$, $140_C$, respectively.

In addition, any of these various circuit versions or alternatives $110_A$, $110_B$, $110_C$, and $140_A$, $140_B$, $140_C$, may be utilized in any permutation or combination in the second reconfigurable, digital phase-locked loop 200, such as a first reconfigurable frequency and delay generator 110$_C$ may be utilized with a second reconfigurable frequency and delay generator 140$_A$, or a first reconfigurable frequency and delay generator 110$_B$ may be utilized with a second reconfigurable frequency and delay generator 140$_C$, and so one, in any such permutation or combination, for example and without limitation.

Continuing to refer to FIGS. 4-5, the reconfigurable oscillator 155 provides or generates the output signal having the desired or selectable frequency, f$_{OUT}$, with the desired or selectable frequency determined by the delay control circuits 160 based upon the control signals (control word(s)) provided or generated by the first digital controller 105. As described in greater detail below, the reconfigurable oscillator 155 is typically implemented as a plurality of oscillator stages 270 (illustrated as first oscillator stage 270$_1$, second oscillator stage 270$_2$, through N$^{th}$ oscillator stage 270$_N$), coupled in series (via wires or bus 468), with the output of the last oscillator stage (oscillator stage 270$_N$) fed back to the input of the first oscillator stage (oscillator stage 270$_1$), forming a ring oscillator circuit structure. The oscillation phases between (and/or among) the plurality of oscillator stages are sampled by the phase sampler 170 (which is also clocked by the reference frequency, as described in greater detail below), and the sampled phase information is provided by the phase sampler 170 (via bus 175, or other wires or lines) to the binary encoder 205 of the first digital controller 105. When included as an option, the reconfigurable phase interpolator 165 is coupled between the reconfigurable oscillator 155 and the phase sampler 170, and the reconfigurable phase interpolator 165 generates additional, more fine-grained and/or time-averaged oscillation phases between (and/or among) the plurality of oscillator stages, for sampling by the phase sampler 170. In addition, as discussed with reference to FIGS. 31 and 32, the number of the plurality of oscillator stages 270 is also configurable and/or reconfigurable, depending on the selected embodiment, such as in response to input configuration parameters.

FIG. 5 also illustrates that the plurality of oscillator stages 270 may be provided in differential form (i.e., double-ended, in addition to single-ended), and further in FIGS. 6 and 7, that additional frequency control (e.g., LC (inductive and capacitive) oscillator (or tank) 275) may also be included as an option. As discussed in greater detail below (with reference to FIG. 6), when optional LC oscillator circuitry 275 is included, the output signal having output frequency f$_{OUT}$ is provided by the LC oscillator circuitry 275 (on line or bus 137), and the output of the last oscillator stage 270$_N$ is not fed back to the first oscillator stage 270$_1$. As discussed in greater detail below (with reference to FIG. 7), when optional LC oscillator circuitry 275 and optional switching circuitry is included, the output signal having output frequency f$_{OUT}$ is selectively provided by either the LC oscillator circuitry 275 or reconfigurable oscillator or delay line 155, 190 having the reconfigurable oscillator 155 circuit configuration; in the former case, the output of the last oscillator stage 270$_N$ is not fed back to the first oscillator stage 270$_1$, while in the latter case, the output of the last oscillator stage 270$_N$ is fed back to the first oscillator stage 270$_1$. In addition, each oscillator stage 270 may include, and generally does include, delay control circuits 160, providing a corresponding plurality of delay control circuits 160, as may be necessary or desirable. For the third reconfigurable, digital phase-locked loop 300, in which the output signal (having the output frequency f$_{OUT}$) is provided by the LC oscillator circuitry 275, the LC oscillator circuitry 275 also includes capacitive tuning circuits 195 (and their components), which can be implemented using instantiations or embodiments of the same circuitry as the capacitive components of the delay control circuits 160, as discussed in greater detail below with reference to FIGS. 8 and 17-19.

For the first, second and/or third reconfigurable, digital phase-locked loops 100, 200, 300, the output signal having output frequency f$_{OUT}$ is provided (on lines or bus 138), for feedback used in generation of the control word(s), to the gray code counter 210, which is also clocked by the output frequency f$_{OUT}$, enabling an accurate count of the cycles of the output frequency f$_{OUT}$, which is typically a much higher frequency than the reference frequency. With each successive cycle of the output frequency f$_{OUT}$, the gray code count provided by gray code counter 210 changes by one bit. Subject to that constraint, any suitable gray code may be implemented by the gray code counter 210. That gray code count is sampled by gray code sampler 215 (also clocked by the output frequency f$_{OUT}$), which may also include gray code registers 285, generally to store a plurality of successive gray code output frequency f$_{OUT}$ cycle counts (which may then be utilized as well for error correction, as discussed in greater detail below). The gray code count samples stored in the gray code registers 285 are then read by the gray code-to-binary converter 220, or by the optional error correction circuit 260, clocked at the reference frequency f$_{REF}$. With the gray code output frequency f$_{OUT}$ cycle counts having been determined and sampled using the output frequency f$_{OUT}$ for clocking, and only the gray code output frequency f$_{OUT}$ cycle counts themselves being provided to either the gray code-to-binary converter 220, or to the optional error correction circuit 260 and then to the gray code-to-binary converter 220, timing independence is provided between the first reconfigurable frequency and delay generator 110 and the first digital controller 105.

Alternatively, when the gray code registers 285 are not implemented, the gray code count (clocked by the output frequency f$_{OUT}$) is also sampled by gray code sampler 215, but clocked at the reference frequency f$_{REF}$, to provide the transition in clock domains from f$_{OUT}$ to the f$_{REF}$ clock domain of the balance (or remaining) circuits of the first digital controller 105. The sampled gray code output frequency f$_{OUT}$ cycle counts are also then provided to either the gray code-to-binary converter 220, or to the optional error correction circuit 260 and then to the gray code-to-binary converter 220, also providing for timing independence between the first reconfigurable frequency and delay generator 110 and the first digital controller 105.

As discussed in greater detail below, also for the first, second and/or third reconfigurable, digital phase-locked loops 100, 200, 300, the binary encoder 205 converts the sampled phase information (from phase sampler 170) to a binary representation, and the gray code-to-binary converter 220 converts the gray code count (gray code output frequency f$_{OUT}$ cycle counts) to a binary representation, which are then combined by adder (or combiner) 225 to provide a combined frequency and phase count for feedback, with the binary frequency count being the higher significant digits and the binary phase count being the lower significant digits. Generally concurrently, the reference frequency f$_{REF}$ also has been input into the reference counter (or accumulator) 235, which generates an initial frequency count (as a multiplicand), and the initial frequency count is then multiplied (or divided) by multiplier 230 (using input configuration parameters to determine the multiplier amount (i.e., the amount "M" of the multiplication of the multiplicand)), to provide a multiplied reference (or total) frequency count corresponding to the user-selected or otherwise configurable or reconfigurable desired frequency. The multiplied reference frequency count is then compared with the combined frequency and phase feedback count (provided by the adder (or combiner) 225), by the comparator (or adder or subtractor) 240, to determine an error count indicative of the difference (if any) between both the frequency and phase of the output frequency $f_{OUT}$ compared to the multiplied reference frequency $f_{REF}$. Depending upon the implementation, the comparator 240 may also be utilized to add a second error signal $\phi_{ERR2}$ (650) into the total error count, such as to generate an output signal having a frequency which is a fractional offset from an integer multiple of the reference frequency. The error count is provided to the programmable digital filter 250, which in turn, based on the error count and the desired frequency, generates (or modifies) one or more control words or signals provided: (1) to the reconfigurable oscillator 155 and the delay control circuits 160, for the output signal having output frequency $f_{OUT}$ to match and lock to the desired frequency (as a multiple of the reference frequency $f_{REF}$) and match and lock to the phase of the reference frequency $f_{REF}$; or (2) to the capacitive tuning circuits 195 of the LC oscillator circuitry 275, also for the output signal having output frequency $f_{OUT}$ to match and lock to the desired frequency (as a multiple of the reference frequency $f_{REF}$) and match and lock to the phase of the reference frequency $f_{REF}$. The coefficients used in the programmable digital filter 250 are typically configuration parameters or determined from configuration parameters, as mentioned above.

FIG. 6 is a block diagram illustrating in greater detail an exemplary or representative embodiment of a first and/or second reconfigurable frequency and delay generators $110_B$, $140_B$, in a second circuit version or alternative, for the third reconfigurable, digital phase-locked loop 300, in which the reconfigurable oscillator or delay line 155, 190 is configured as a reconfigurable delay line (or delay locked loop) 190 circuit. For the third reconfigurable, digital phase-locked loop 300, LC oscillator circuitry 275 is included which provides the output signal having output frequency $f_{OUT}$, which is tunable or otherwise selectable using the capacitive tuning circuits 195 (and their components), under the control of the control signals or control words provided by the first digital controller 105, as discussed above and as discussed in greater detail below. As illustrated in FIG. 6, the oscillator stages 270 of the reconfigurable oscillator or delay line 155, 190 of the first and/or second reconfigurable frequency and delay generators, 110, 140, are configured successively in series with each other as a delay line (or delay locked loop) 190 circuit configuration, such that the input of the first stage (oscillator stage $270_1$) is the output signal having output frequency $f_{OUT}$ provided by the LC oscillator circuitry 275, and the output of the last stage (oscillator stage $270_N$) is not fed back to the input of the first stage (oscillator stage $270_1$).

In response to control words (control signals and/or error signals) provided by the third digital controller 145, the first reconfigurable frequency and delay generator 110 in this delay line 190 circuit configuration synchronizes to the frequency and phase of the output signal having output frequency $f_{OUT}$ generated by the LC oscillator 275. More particularly, in response to control words (control signals and/or error signals) provided by the third digital controller 145, the amount of delay between each oscillator stage 270 of the plurality of oscillator stages 270 of the delay line 190 is adjusted until the overall delay and oscillation of the delay line 190 circuit configuration synchronizes with and matches the frequency and phase of the output signal having output frequency $f_{OUT}$ generated by the LC oscillator 275, with the total delay provided by the delay line 190 circuit configuration converging and matching the oscillation period of the LC oscillator 275. The delay line 190 circuit configuration is then utilized to provide incremental phase information, as described below.

The oscillation phases between (and/or among) the plurality of oscillator stages 270 of the delay line 190 are also sampled by the phase sampler 170, illustrated as first phase sampler $170_B$ (which is also clocked by the reference frequency, as described in greater detail below), and the sampled phase information is provided by the first phase sampler $170_B$ (via bus 175, or other wires or lines) to the binary encoder 205 of the first digital controller 105. When the reconfigurable phase interpolator 165 is included as an option, another, second phase sampler $170_A$ is also included to provide non-interpolated phase information to the third digital controller 145. The reconfigurable phase interpolator 165 is also coupled between the series-coupled plurality of oscillator stages 270 and the phase sampler $170_B$, and the reconfigurable phase interpolator 165 generates additional, more fine-grained and/or time-averaged oscillation phases between (and/or among) the plurality of oscillator stages 270, for sampling by the phase sampler $170_B$. In addition, as discussed with reference to FIGS. 31 and 32, the number of the plurality of oscillator stages 270 is also configurable and/or reconfigurable, depending on the selected embodiment, but without the feedback of the output of the last oscillator stage $270_N$ to the first oscillator stage $270_1$.

Figure 21:
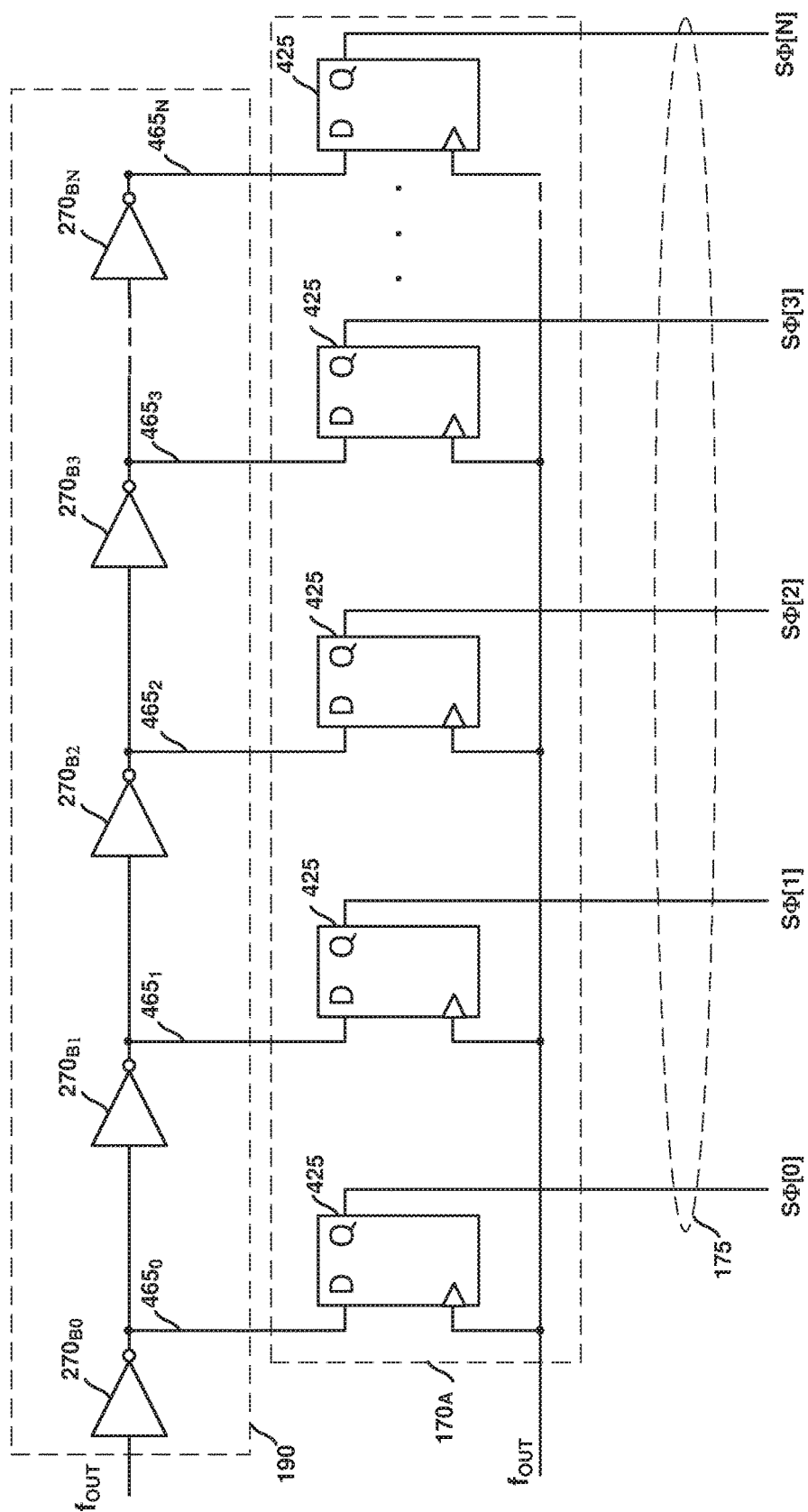
FIG. 21 is a block diagram illustrating in greater detail an exemplary or representative embodiment of a plurality of oscillator stages in a delay line (or delay locked loop) circuit structure and an exemplary or representative embodiment of a phase sampler of the first and/or second reconfigurable frequency and delay generators with phase detection (or measurement) for the third reconfigurable, digital phase-locked loop.

Continuing to refer to FIG. 6, a third digital controller 145 (or another, separate first digital controller 105) is utilized to control the locking of the delay line 190 to the phase of the output signal having output frequency $f_{OUT}$, using sampled phases provided by second phase sampler $170_A$ (on line or bus 139), which may be configured as illustrated in FIG. 21, and is clocked by the output signal having output frequency $f_{OUT}$, which may be from either the LC oscillator 275 or from the delay line 190. Alternatively, another, separate first digital controller 105 may be substituted for the third digital controller 145, and will operate as discussed above. In a representative embodiment, a comparatively more simple third digital controller 145 it utilized, such as a digital filter, to generate corresponding control signals (as control words) to the delay control circuits 160 of each oscillator stage 270 (on line or bus 141), to equalize the delays between the oscillator stages 270 of the delay line 190 and lock to the phase of the output signal having output frequency $f_{OUT}$. The delay line 190 circuit configuration of the first and/or second reconfigurable frequency and delay generators $110_B$, $140_B$ then provides for obtaining phase information of the output signal having output frequency $f_{OUT}$, which would otherwise not be obtainable directly from the LC oscillator 275.

FIG. 7 is a block diagram illustrating in greater detail an exemplary or representative embodiment of a first and/or second reconfigurable frequency and delay generators $110_C$, $140_C$, in a third circuit version or alternative, for the first, second and/or third reconfigurable, digital phase-locked loops 100, 200, 300. For this embodiment, the first and/or second reconfigurable frequency and delay generators $110_C$, $140_C$ operate as discussed above for first and/or second reconfigurable frequency and delay generators $110_A$, $140_A$ and first and/or second reconfigurable frequency and delay generators $110_B$, $140_B$, but include additional switching components, which may be multiplexers or other switching arrangements, such as a first multiplexer 180, a second multiplexer 185, a third multiplexer 183, and a fourth switch 187 (which may be implemented, for example, as one or more transmission gates 365 or a multiplexer). For this embodiment, the first and/or second reconfigurable frequency and delay generators $110_C$, $140_C$ provide for the option of including LC oscillator circuitry 275, such as either through pins to the integrated circuit to add an external inductor or through integrated fabrication of an inductor on the same IC, such as an inductor 550 illustrated and discussed below with reference to FIGS. 17 and 18. The first multiplexer 180, second multiplexer 185, third multiplexer 183 and fourth switch 187 (transmission gates 365 or a multiplexer) are then utilized to select the operating mode (circuit configuration) of the first, second and/or third reconfigurable, digital phase-locked loops 100, 200, 300, typically in response to input configuration parameters or other configuration information, illustrated as select signals "SEL", or alternatively indirectly through control signals based upon the configuration parameters, as mentioned above.

More particularly, when the optional LC oscillator circuitry 275 is included, in response to configuration parameters and/or control signals: (1) the first multiplexer 180 selects the LC oscillator circuitry 275 output signal for input into the first oscillator stage 270 (oscillator stage $270_1$) (and not the output of the last oscillator stage $270_N$)) to form the delay line (or delay locked loop) 190 circuit configuration; (2) the second multiplexer 185 selects the output signal from the LC oscillator circuitry 275 as the output signal having output frequency $f_{OUT}$ (and not from the first and/or second reconfigurable frequency and delay generators $110_C$, $140_C$); (3) the third multiplexer 183 selects the third digital controller 145 (and not the first digital controller 105) to provide control words to the plurality of oscillator stages 270 of the delay line 190; and (4) the fourth switch (or multiplexer) 187 switches the output of the first digital controller 105 to the capacitive tuning circuits 195 of the LC oscillator 275.

Also more particularly, when the optional LC oscillator circuitry 275 is not included, in response to configuration parameters and/or control signals: (1) the first multiplexer 180 selects the output of the last stage (oscillator stage $270_N$) to be fed back to the input of the first oscillator stage 270 (oscillator stage $270_1$) (and not the output of the LC oscillator circuitry 275) to form the reconfigurable oscillator 155 having a ring oscillator circuit configuration; (2) the second multiplexer 185 selects the output signal from the last stage (oscillator stage $270_N$) of the first and/or second reconfigurable frequency and delay generators $110_C$, $140_C$ as the output signal having output frequency $f_{OUT}$ (and not from the LC oscillator circuitry 275); (3) the third multiplexer 183 selects the first digital controller 105 (and not the third digital controller 145) to provide control words to the plurality of oscillator stages 270 of the reconfigurable oscillator 155 to lock to the frequency and phase of the multiplied reference frequency $f_{REF}$; and (4) the fourth switch (or multiplexer) 187 switches, disconnects or decouples the output of the first digital controller 105 from the capacitive tuning circuits 195 of the LC oscillator 275.

Those having skill in the art will recognize that a wide variety of switching circuitry and switching configurations are available for the first and/or second reconfigurable frequency and delay generators 110, $140_C$, any and all of which are considered equivalent and within the scope of the disclosure.

Figure 8:
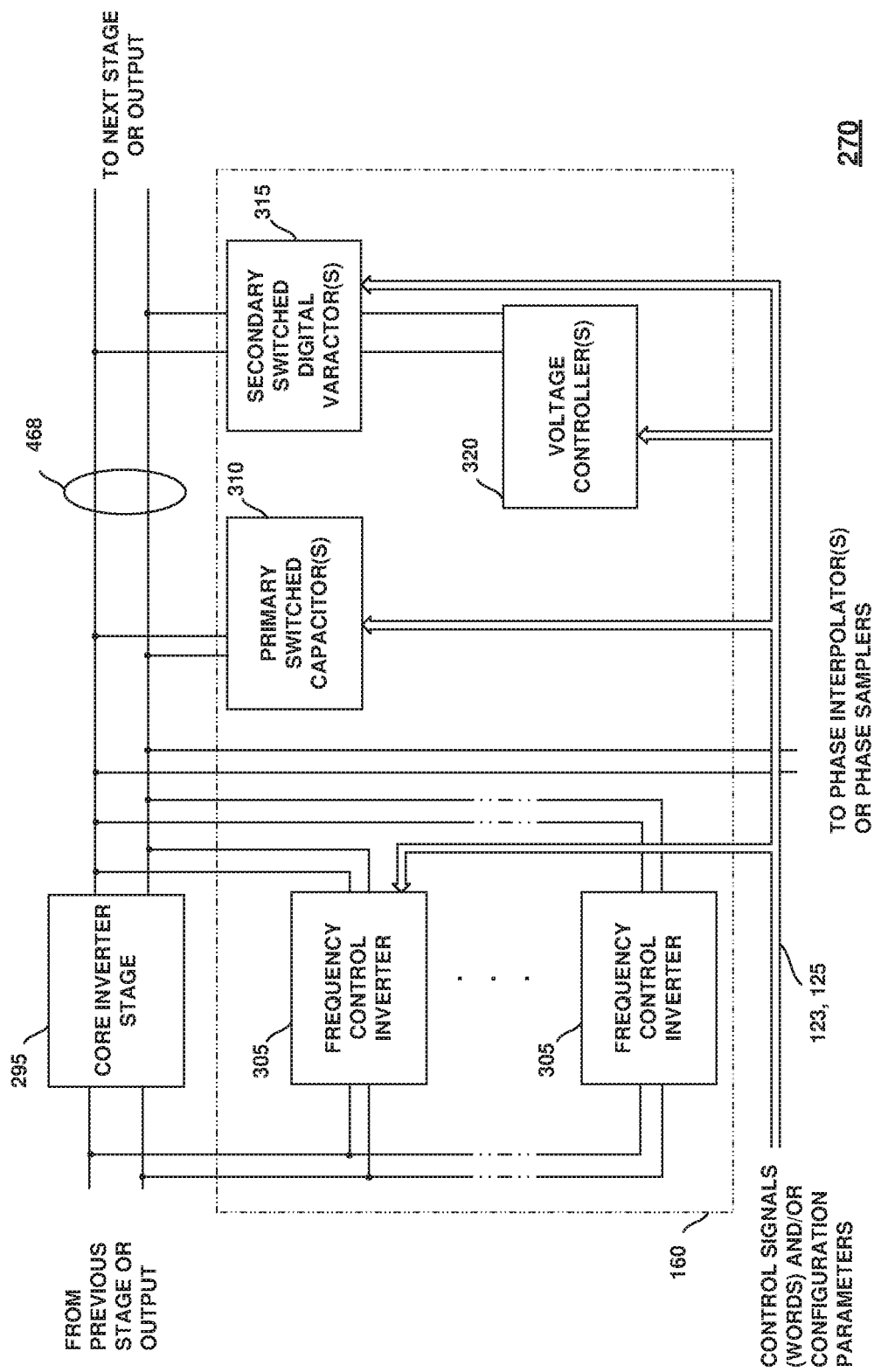
FIG. 8 is a block diagram illustrating in greater detail an exemplary or representative embodiment of an oscillator stage and an exemplary or representative embodiment of delay control circuits, of the reconfigurable oscillator or delay line of the first and/or second reconfigurable frequency and delay generators with phase detection (or measurement) for the first, second or third reconfigurable, digital phase-locked loops.

FIG. 8 is a block diagram illustrating in greater detail an exemplary or representative embodiment of an oscillator stage 270, an exemplary or representative embodiment of delay control circuits 160 of the reconfigurable oscillator or delay line 155, 190 of the first reconfigurable frequency and delay generator 110 (and/or second reconfigurable frequency and delay generator 140), for the first, second and/or third reconfigurable, digital phase-locked loops 100, 200, 300. It should be noted that the demarcation between the delay control circuits 160 and oscillator stage 270 may be considered rather arbitrary at least for some components, as those components could be considered to be included in either the oscillator stage 270 or the delay control circuits 160 without a loss of generality, for example and without limitation, and as described in greater detail below. As illustrated, the oscillator stages 270 either form a ring oscillator circuit structure or a delay lock loop (or delay line) 190 circuit structure.

For the reconfigurable (ring) oscillator (155) circuit structure: (1) a core inverter stage 295 either is coupled at its input (or differential inputs) in series to a previous core inverter stage 295 or, when the oscillator stage 270 is the first oscillator stage $270_1$ (of the ring oscillator), is coupled at its input (or differential inputs) to the output $f_{OUT}$ of the last oscillator stage $270_1$; and (2) the core inverter stage 295 may be either coupled at its output (or differential outputs) in series to a next core inverter stage 295, or is the last core inverter stage 295 of the oscillator stage $270_N$ and provides the output signal having output frequency $f_{OUT}$.

For the reconfigurable delay line or delay locked loop (190) circuit structure: (1) a core inverter stage 295 either is coupled at its input (or differential inputs) in series to a previous core inverter stage 295, or when the oscillator stage 270 is the first oscillator stage $270_1$ (of the delay line 190), coupled at its input (or differential inputs) to the output $f_{OUT}$ of the LC oscillator 275; and (2) the core inverter stage 295 may be either coupled at its output (or differential outputs) in series to a next core inverter stage 295, or is the last core inverter stage 295 of the oscillator stage $270_N$ and provides an output signal to a phase sampler 170 or phase interpolator 165.

As discussed in greater detail below, the number of oscillator stages 270 is configurable and reconfigurable, with one or more oscillator stages 270 being switchable: (1) into or out of the ring oscillator to change the oscillation frequency of the first reconfigurable frequency and delay generator 110 (and/or second reconfigurable frequency and delay generator 140) for the first and/or second reconfigurable, digital phase-locked loops 100, 200; or into or out of the delay line 190 circuit structure to provide greater or lesser granularity of the phase information provided to the first digital controller 105.

A representative oscillator stage 270 comprises at least one "core" (i.e., unswitched or switchable (e.g., on/off)) inverter (or inverter stage) 295, and one or more delay control circuits 160. The representative delay control circuits 160 comprise a first plurality of "primary" switched capacitors 310, a second plurality of "secondary" switched digital varactors 315, with each switched digital varactor 315 of the plurality of switched digital varactors 315 coupled to a voltage controller 320 of a plurality of voltage controllers 320, and may be considered to also comprise frequency control inverters (or inverter stages) 305. The representative capacitive tuning circuits 195 also comprise a first plurality of "primary" switched capacitors 310 and a second plurality of "secondary" switched digital varactors 315, with each switched digital varactor 315 of the plurality of switched digital varactors 315 also coupled to a voltage controller 320 of a plurality of voltage controllers 320, and further having the same circuit structure, same control mechanisms (signaling), and same operation of those components used in the delay control circuits 160, but are coupled instead to the inductor circuitry of the LC oscillator 275, as discussed in greater detail below with reference to FIGS. 17-19. Each of these various components and representative embodiments are discussed in greater detail below.

A representative oscillator stage 270 comprises at least one "core" (i.e., unswitched or switchable (e.g., on/off)) inverter (or inverter stage) 295, that is always on (i.e., is not switched off or out of the oscillator stage 270, when the oscillator stage 270 is included and active in the ring oscillator circuit structure or the delay line 190 circuit structure), and may also comprise one or more switchable, frequency control inverters (or inverter stages) 305, illustrated as frequency control inverter $305_1$, frequency control inverter $305_2$, through frequency control inverter $305_N$. The inverter 295 and frequency control inverters 305 are illustrated as being differential inverters; those having skill in the art will recognize that single-ended (non-differential) inverters may be used equivalently. In addition, as discussed below with reference to FIG. 9, in addition to being differential, the inverter 295, 295A may also be cross-coupled, as illustrated in FIG. 9.

Figure 9:
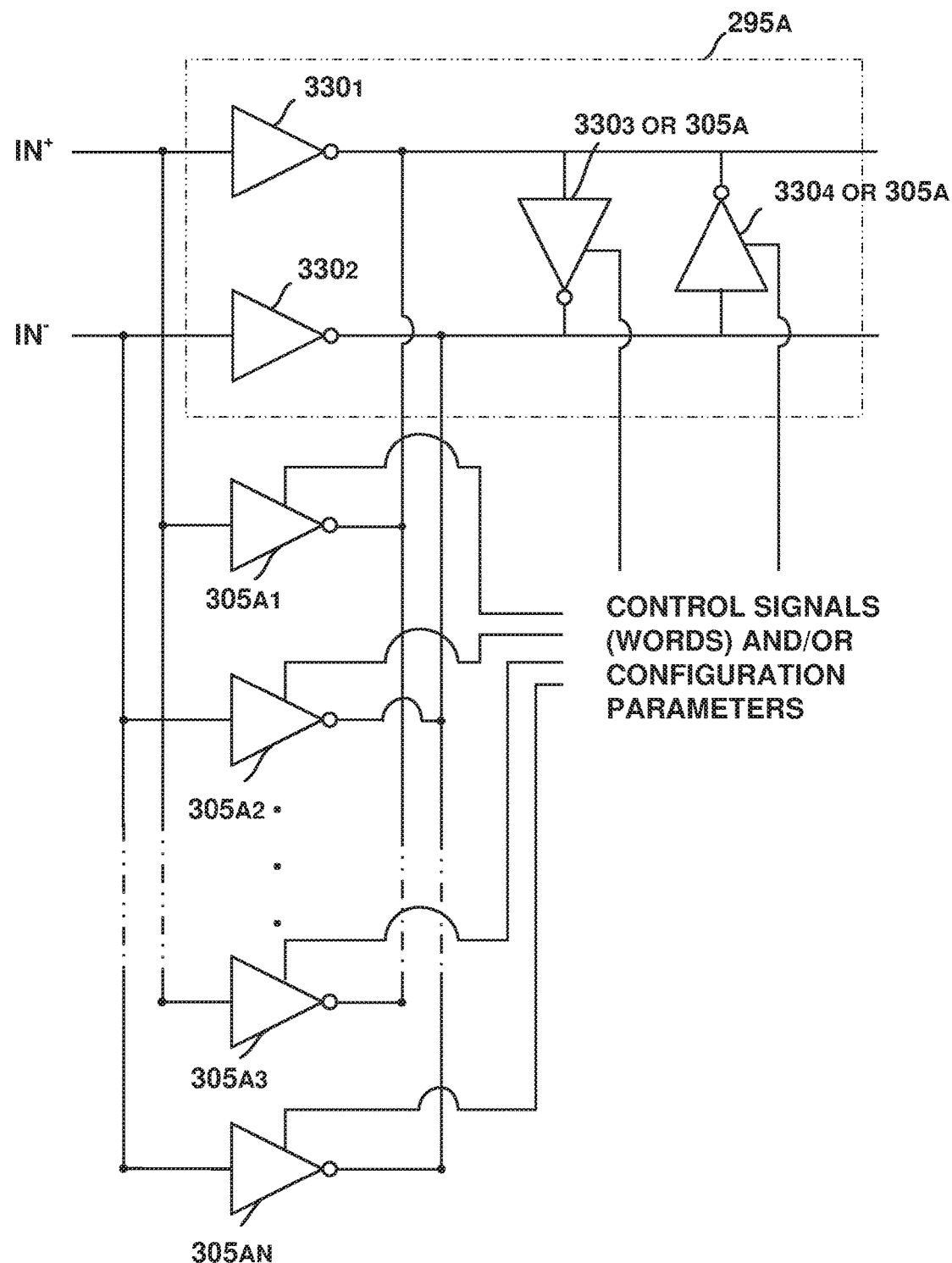
FIG. 9 is a block diagram illustrating in greater detail an exemplary or representative embodiment of a cross-coupled differential core inverter stage and a plurality of configurable frequency control inverters for the oscillator stages of the first and/or second reconfigurable frequency and delay generators with phase detection (or measurement) for the first, second or third reconfigurable, digital phase-locked loops.
Figure 11:
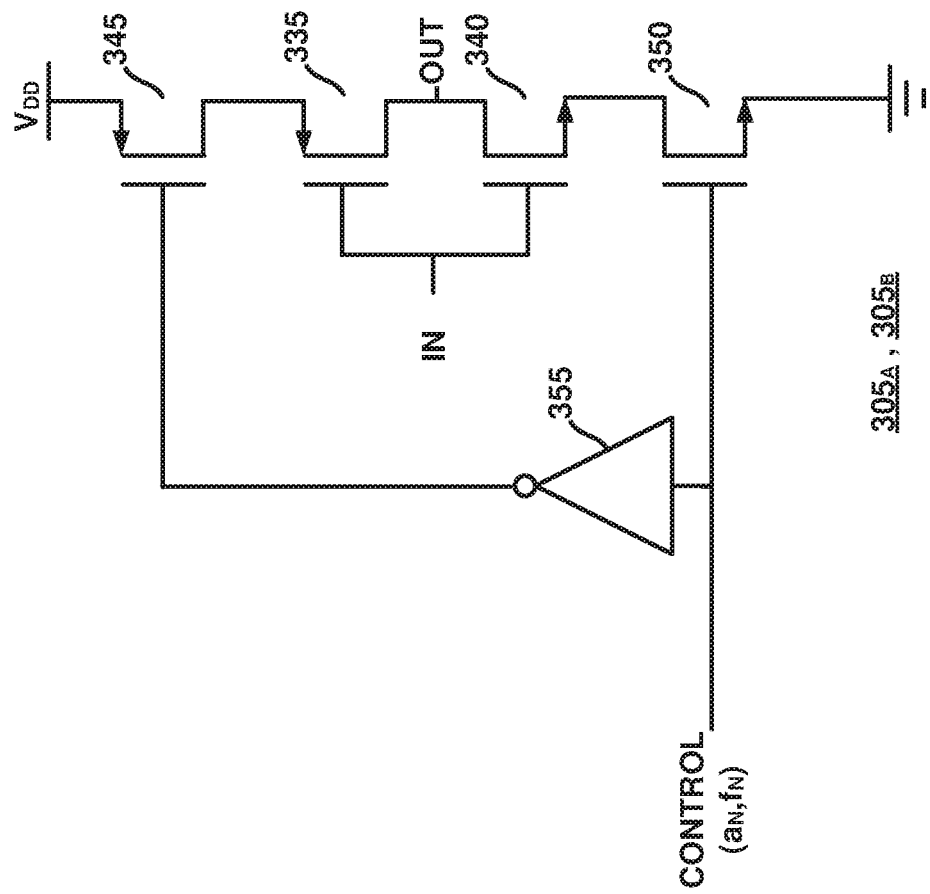
FIG. 11 is a circuit diagram illustrating in greater detail an exemplary or representative embodiment of a first configurable frequency control inverter.
Figure 10:
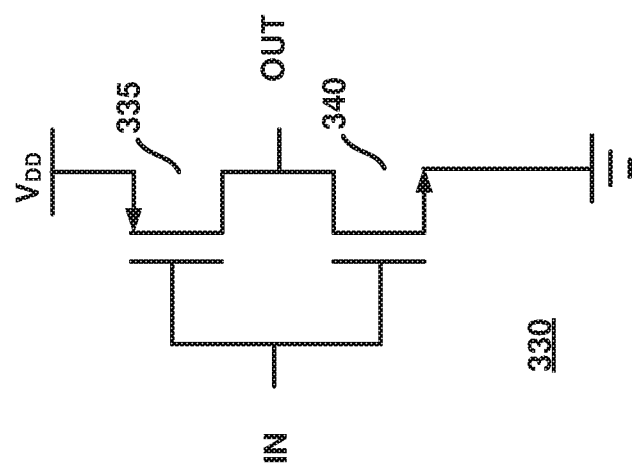
FIG. 10 is a circuit diagram illustrating in greater detail an exemplary or representative embodiment of an inverter for a cross-coupled differential core inverter stage.
Figure 12:
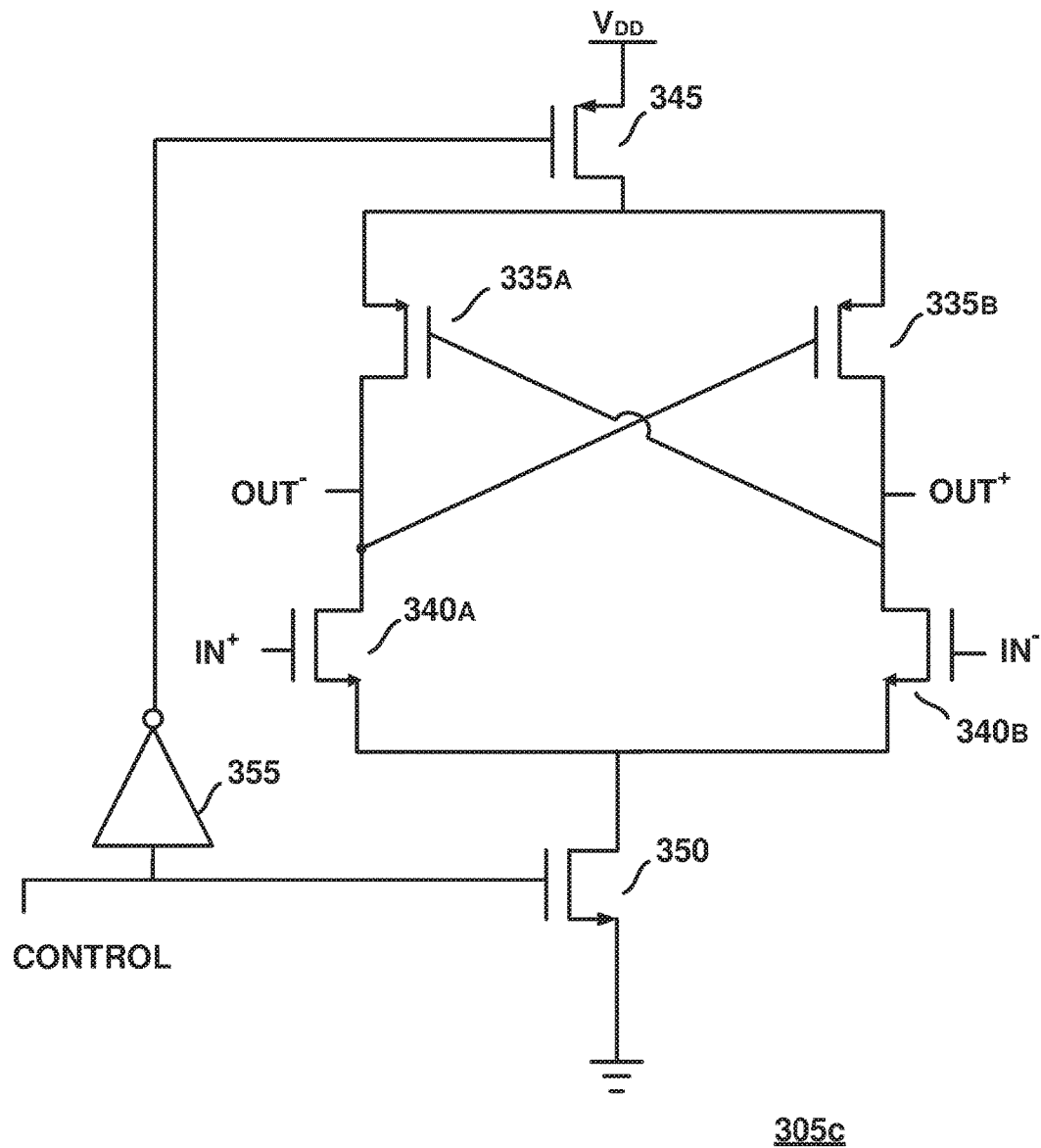
FIG. 12 is a circuit diagram illustrating in greater detail an exemplary or representative embodiment of a second configurable frequency control inverter.
Figure 13:
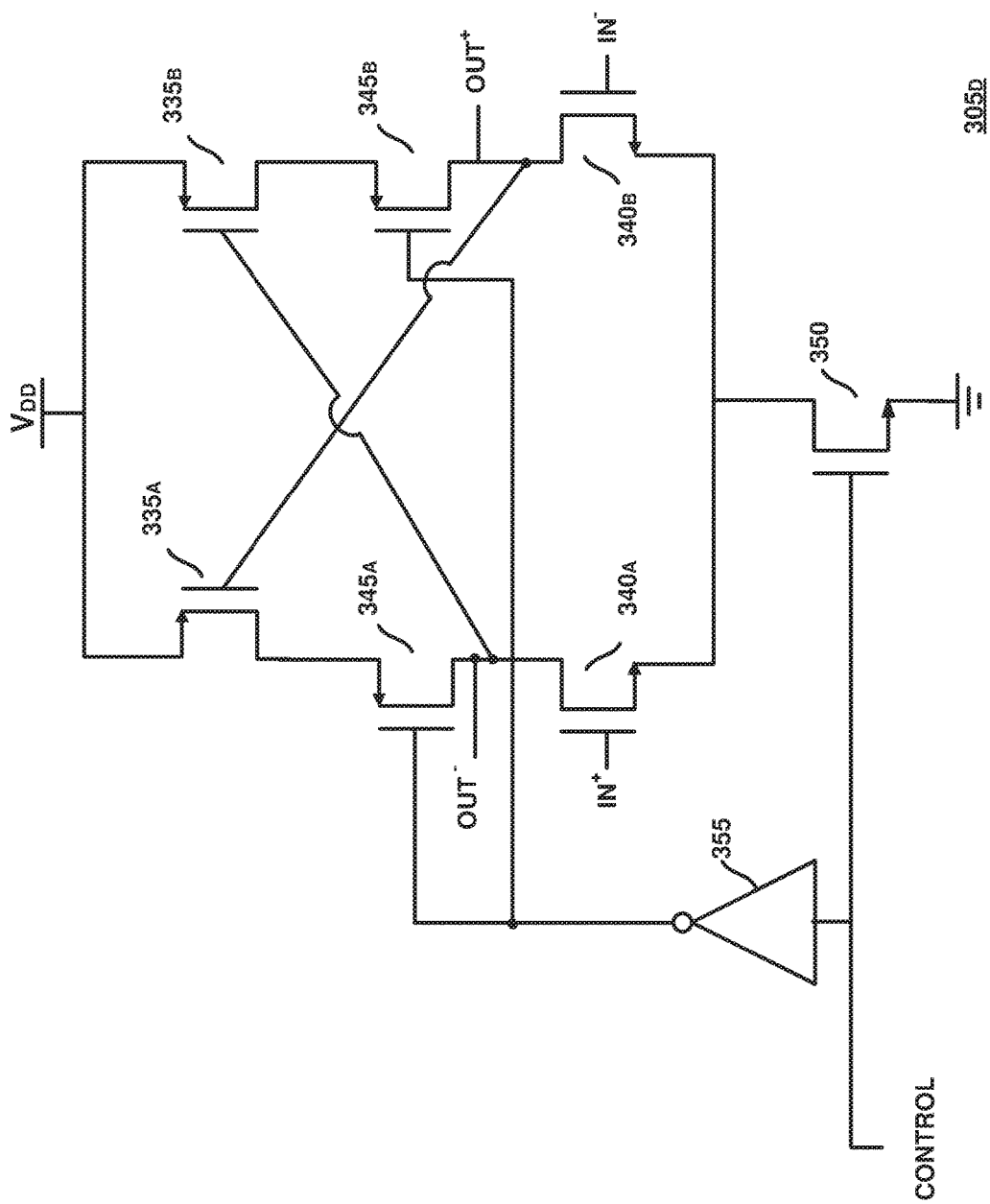
FIG. 13 is a circuit diagram illustrating in greater detail an exemplary or representative embodiment of a third configurable frequency control inverter.

FIG. 9 is a block diagram illustrating in greater detail an exemplary or representative embodiment of a cross-coupled differential core inverter stage $295_A$, and a plurality of configurable frequency control inverters 305A, illustrated as configurable frequency control inverters $305_{A1}$, $305_{A2}$, $305_{A3}$, through $305_{AN}$, for the oscillator stages 270 of the first (and/or second) reconfigurable frequency and delay generator 110, 140 for the first, second and/or third reconfigurable, digital phase-locked loops 100, 200, 300. FIG. 10 is a circuit diagram illustrating in greater detail an exemplary or representative embodiment of an inverter 330 for a cross-coupled differential core inverter stage $295_A$. FIG. 11 is a circuit diagram illustrating in greater detail an exemplary or representative embodiment of first configurable frequency control inverter $305_A$, $305_B$ having a single-ended circuit structure. FIG. 12 is a circuit diagram illustrating in greater detail an exemplary or representative embodiment of a second configurable frequency control inverter $305_C$, having a differential, cross-coupled circuit structure. FIG. 13 is a circuit diagram illustrating in greater detail an exemplary or representative embodiment of a third configurable frequency control inverter $305_D$ having a differential, cross-coupled circuit structure.

Referring to FIGS. 8-13, the cross-coupled differential core inverter stage $295_A$ comprises a plurality of inverters 330, such as the inverter circuit comprising a p-type transistor 335 coupled to an n-type transistor 340, illustrated as MOSFETs, although any type of transistor may be utilized equivalently, as known to those having skill in the art. The inverters $330_1$ and $330_2$ receive differential input, illustrated as IN+ and IN−, and are optionally cross-coupled using inverters $330_3$ and $330_4$ (which are typically sized to be about ⅓ to ⅛ the size of the inverters $330_1$ and $330_2$). The inverters $330_3$ and $330_4$ may be configurable or nonconfigurable, e.g., configurable to the extent of being turned off to save power, in which case inverters $305_A$ may be substituted for inverters $330_3$ and $330_4$, for example and without limitation.

The frequency control inverters $305_A$, $305_B$, $305_C$, $305_D$ differ from the inverters 330 in two ways. First, the frequency control inverters $305_A$, $305_B$, $305_C$, $305_D$ may be switched into or out of the oscillator stage 270 via p-type transistor 345 ($345_A$, $345_B$) and n-type transistor 350 ($350_A$, $350_B$), as illustrated in FIGS. 11-13, which have respective gates coupled to receive control signals (as respective control voltages corresponding to one or more coefficients of a control word and an inverse of the coefficient(s) (via inverter 355, which may be embodied as a typical inverter, such as is illustrated in FIG. 10), such as the coefficients of a control word [$a_0$, $a_1$, $a_2$ ... $a_N$] as illustrated, for switching the various frequency control inverters $305_A$, $305_B$, $305_C$, $305_D$ into or out of the oscillator stage 270.

Second, and perhaps more significantly, the transistors 335 ($335_A$, $335_B$), 340 ($340_A$, $340_B$), 345 ($345_A$, $345_B$), and 350 of a frequency control inverter $305_A$, $305_B$, $305_C$, $305_D$ are each sized, and thereby weighted, to provide a predetermined or selectable delay for the oscillator stage 270 and thereby affect the oscillation frequency provided by the rise and fall times of the frequency control inverter $305_A$, $305_B$, $305_C$, $305_D$. For example, comparatively larger transistors (e.g., having a comparatively larger source-to-drain channel) would allow a comparatively greater current to flow and charge faster, comparatively decreasing the rise and fall times (comparatively lower delay) of the frequency control inverter $305_A$, $305_B$, $305_C$, $305_D$, thereby providing a (frequency) weighting resulting in a comparatively higher oscillation frequency, while comparatively smaller transistors (e.g., having a comparatively smaller source-to-drain channel) would allow a comparatively lesser current to flow and charge more slowly, comparatively increasing the rise and fall times (comparatively higher delay) of the frequency control inverter $305_A$, thereby providing a (frequency) weighting resulting in a lower oscillation frequency.

Accordingly, each of the frequency control inverters $305_A$, $305_B$, $305_C$, $305_D$ are correspondingly weighted, due to their comparative size (via their component transistors 335 ($335_A$, $335_B$), 340 ($340_A$, $340_B$), 345 ($345_A$, $345_B$), and 350), to provide different oscillation frequencies, any and all of which can be selected using the control signals (high or low voltages, corresponding to the binary coefficient values) of the control word(s) (e.g., comprising the coefficients [$a_0$, $a_1$, $a_2$ ... $a_N$]) provided by the first digital controller 105. In a representative embodiment, the frequency control inverters $305_A$, $305_B$, $305_C$, $305_D$ are selected (i.e., switched in or out of the oscillator stage 270) to provide a first, comparatively coarse level of frequency control of the oscillator stage 270 (and thereby a first, comparatively coarse level of frequency control of the first reconfigurable frequency and delay generator 110 (and/or second reconfigurable frequency and delay generator 140) for the first or second reconfigurable, digital phase-locked loops 100, 200). Accordingly, the frequency control inverters $305_A$, $305_B$, $305_C$, $305_D$ can be considered to be part of the oscillator stage 270 or part of the delay control circuits 160, equivalently, given that the frequency control inverters $305_A$, $305_B$, $305_C$, $305_D$ provide part of the overall frequency control of the first reconfigurable frequency and delay generator 110 and/or second reconfigurable frequency and delay generator 140. As discussed in greater detail below, such weighting of the various frequency control inverters $305_A$, $305_B$, $305_C$, $305_D$ may have any of a plurality of different forms such as, for example and without limitation, binary weighting of different frequency control inverters $305_A$, $305_B$, $305_C$, $305_D$, or the same weighting for all of the frequency control inverters $305_A$, $305_B$, $305_C$, $305_D$, other combinations of different weightings, and so on. In a representative embodiment, each of the frequency control inverters $305_A$, $305_B$, $305_C$, $305_D$ have a different weight, such as binary weightings of "x", "2x", "$2^2$x", "$2^3$x", though "$2^N$x" or incremental weightings of "x", "2x", "3x", "4x", though "Nx", for example and without limitation. In another representative embodiment, the frequency control inverters $305_A$, $305_B$, $305_C$, $305_D$ are equally weighted, and each provides a predetermined step size in the oscillation frequency of the first reconfigurable frequency and delay generator 110 and/or second reconfigurable frequency and delay generator 140, e.g., a predetermined percentage of the output frequency, such as 8.0% to 9.0%, or specific predetermined step size, such as an 80-90 MHz step size, or a 2 MHz step size, or a 5 MHz step size, for example and without limitation. Any and all combinations of such weightings are within the scope of the disclosure.

Referring again to FIG. 8, representative delay control circuits 160 and representative capacitive tuning circuits 195 also comprise a first plurality of "primary" switched capacitors 310, and a second plurality of "secondary" switched digital varactors 315, with each switched digital varactor 315 of the plurality of switched digital varactors 315 coupled to a voltage controller 320 of a plurality of voltage controllers 320. Equivalently, the frequency control inverters $305_A$ can be considered to be part of the delay control circuits 160, as mentioned above, or part of the oscillator stage 270, but generally are not included in the representative capacitive tuning circuits 195. Collectively, every oscillator stage 270 comprises or includes the pluralities of primary switched capacitors 310 and secondary switched digital varactors 315, forming a bank of capacitors, which can be used to tune the oscillation frequency of the first reconfigurable frequency and delay generator 110 (and/or second reconfigurable frequency and delay generator 140) for the first and/or second reconfigurable, digital phase-locked loops 100, 200, by switching a selected amount of capacitance into (or out of) the oscillator stage 270 (using control words provided by the first digital controller 105 (or the third digital controller 145), in the first, second and/or third reconfigurable, digital phase-locked loops 100, 200, 300.

Similarly, representative capacitive tuning circuits 195 comprise or include the pluralities of primary switched capacitors 310 and secondary switched digital varactors 315, forming a bank of capacitors, which can be used to tune the oscillation (or resonant) frequency of the LC oscillator 275, by switching a selected amount of capacitance into (or out of) the LC oscillator 275 (using control words provided by the first digital controller 105), in the third reconfigurable, digital phase-locked loop 300.

The primary switched capacitors 310 and secondary switched digital varactors 315 are also correspondingly weighted, due to their comparative size (via their component transistors 360, 380, respectively), with the comparatively larger capacitor size providing an increased rise and fall time, thereby providing an increased delay of the oscillator stage 270 and a lower oscillation frequency, and with the comparatively smaller capacitor size providing a decreased rise and fall time, thereby providing a decreased delay of the oscillator stage 270 and a higher oscillation frequency, and correspondingly providing a lower or higher oscillation (or resonant) frequency for the LC oscillator 275. The primary switched capacitors 310 and secondary switched digital varactors 315 thereby are selectable to provide different oscillation frequencies, any and all of which can be selected using the control signals (high or low voltages, corresponding to the coefficient values) of the control word (e.g., respectively comprising the coefficients $[b_0, b_1, b_2, \ldots b_N]$ and $[c_0, c_1, c_2, \ldots c_N]$) provided by the first digital controller 105 (and/or the third digital controller 145). In addition to providing frequency control through the size of the component transistors, and as described in greater detail below, the secondary switched digital varactors 315 are also switchable to a selected control voltage level, any and all of which can be selected using the control signals (high or low voltages, corresponding to the coefficient values) of the control word (e.g., comprising the coefficients $[d_0, d_1, d_2, \ldots d_N]$) provided by the first digital controller 105 (and/or the third digital controller 145).

In a representative embodiment, the primary switched capacitors 310 are selected (i.e., switched into or out of the oscillator stage 270 and/or LC oscillator 275) to provide a second, comparatively intermediate level of frequency control of the oscillator stage 270 and/or LC oscillator 275, and the secondary switched digital varactors 315 are selected (i.e., switched in or out of the oscillator stage 270 and/or LC oscillator 275) to provide a third, comparatively fine level of frequency control of the oscillator stage 270 and/or LC oscillator 275. The primary switched capacitors 310 and secondary switched digital varactors 315 thereby provide, respectively, a second, comparatively intermediate level of frequency control and a third, comparatively fine level of frequency control (1) of the first reconfigurable frequency and delay generator 110 (and/or second reconfigurable frequency and delay generator 140) for the first or second reconfigurable, digital phase-locked loops 100, 200, or (2) for the LC oscillator 275 of the third reconfigurable, digital phase-locked loop 300.

Figure 14:
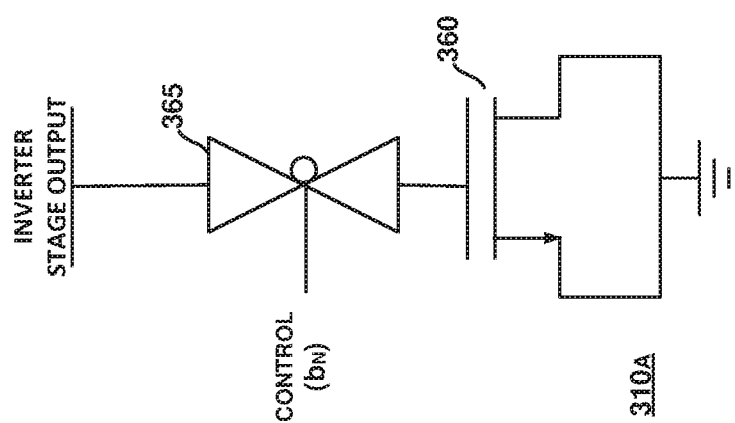
FIG. 14 is a block and circuit diagram illustrating in greater detail an exemplary or representative embodiment of a primary switched capacitor for the first and/or second reconfigurable frequency and delay generators with phase detection (or measurement) and for the capacitive tuning circuits for the first, second or third reconfigurable, digital phase-locked loops.

FIG. 14 is a block and circuit diagram illustrating in greater detail an exemplary or representative embodiment of a primary switched capacitor 310 for the first (and/or second) reconfigurable frequency and delay generator 110, 140, and/or for the representative capacitive tuning circuits 195 of the LC oscillator 275, for the first, second and/or third reconfigurable, digital phase-locked loops 100, 200, 300. The primary switched capacitor 310 comprises an n-type transistor 360 (illustrated as MOSFETs, although any type of transistor may be utilized equivalently, as known to those having skill in the art), having its source and drain coupled to each other and to a ground voltage level (or other predetermined voltage level) to provide a selected level of capacitance, and a transmission gate 365 (or any other switching device, such as another transistor), to switch the capacitance provided by the transistor 360 into or out of the oscillator stage 270 or LC oscillator 275, in response to the control signals (high or low voltages, corresponding to the coefficient values) of the control word (e.g., comprising the coefficients $[b_0, b_1, b_2, \ldots b_N]$) provided by the first digital controller 105 (and/or the third digital controller 145).

Figure 15:
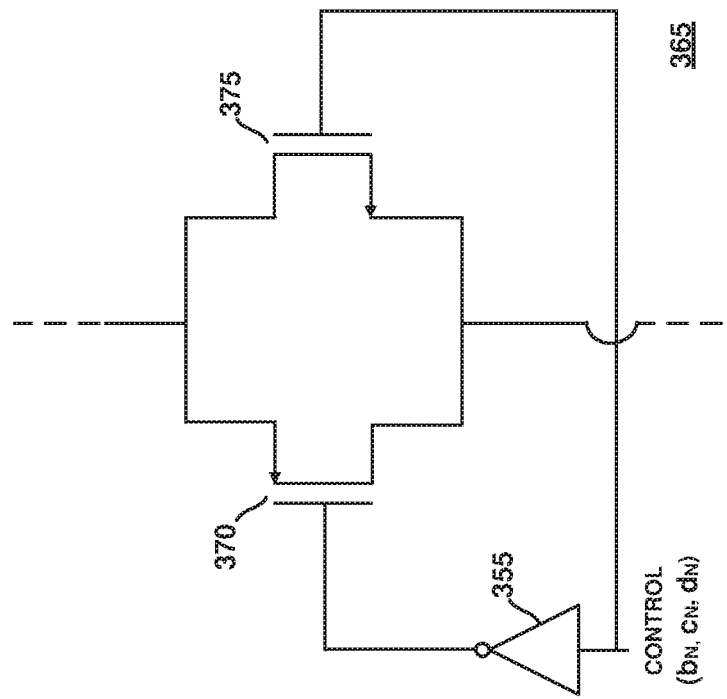
FIG. 15 is a circuit diagram illustrating in greater detail an exemplary or representative embodiment of a transmission gate for use in the primary switched capacitors and secondary switched digital varactors for the first and/or second reconfigurable frequency and delay generators with phase detection (or measurement) and for the capacitive tuning circuits for the first, second or third reconfigurable, digital phase-locked loops.

FIG. 15 is a circuit diagram illustrating in greater detail an exemplary or representative embodiment of a transmission gate 365 for use in the primary switched capacitors 310 and secondary switched digital varactors 315 for the first (and/or second) reconfigurable frequency and delay generator 110, 140, and/or for the representative capacitive tuning circuits 195 of the LC oscillator 275, for the first, second and/or third reconfigurable, digital phase-locked loops 100, 200, 300. The transmission gate 365 comprises a p-type transistor 370 and an n-type transistor 375 (both illustrated as MOSFETs, although any type of transistor may be utilized equivalently, as known to those having skill in the art), which have respective gates coupled to receive control signals (as respective control voltages corresponding to coefficients of a control word and an inverse of the coefficient (via inverter 355, which may be embodied as a typical inverter, such is illustrated in FIG. 10)), such as the coefficients of a control word $[b_0, b_1, b_2, \ldots b_N]$ as illustrated for the primary switched capacitors 310, for switching the capacitance provided by the transistor 360 into or out of the oscillator stage 270 or LC oscillator 275, or such as the coefficients of a control word [$c_0, c_1, c_2, \ldots c_N$] as illustrated in FIG. 16, for switching the capacitance provided by the transistor 380 into or out of the oscillator stage 270 or LC oscillator 275.

Those having skill in the art will recognize that innumerable other types switching devices may be utilized equivalently and in place of a transmission gate 365, such as a single transistor, a multiplexer (e.g., a 2:1 MUX), and so on. Those having skill in the art will recognize that innumerable other types capacitive devices may be utilized equivalently and in place of a primary switched capacitor 310, such as a multiplexer (e.g., a 2:1 MUX) which, when on, provides a capacitance to a coupled node, and so on.

Figure 16:
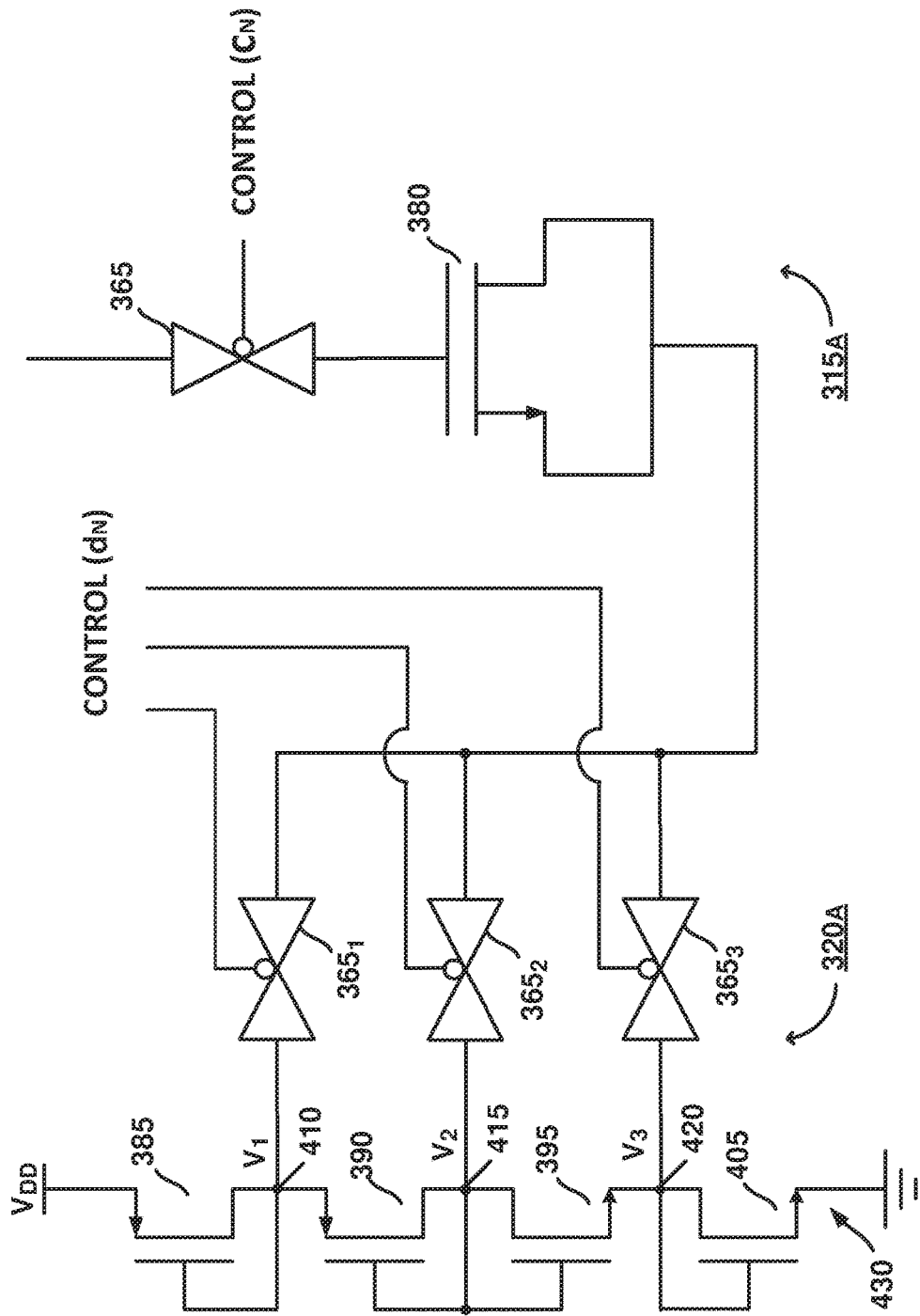
FIG. 16 is a block and circuit diagram illustrating in greater detail exemplary or representative embodiments of a voltage controller and the secondary switched digital varactors for the first and/or second reconfigurable frequency and delay generators with phase detection (or measurement) and for the capacitive tuning circuits for the first, second or third reconfigurable, digital phase-locked loops.

FIG. 16 is a block and circuit diagram illustrating in greater detail exemplary or representative embodiments of a voltage controller $320_A$ and the secondary switched digital varactors $315_A$ for the first (and/or second) reconfigurable frequency and delay generator 110, 140, and/or for the representative capacitive tuning circuits 195 of the LC oscillator 275, for the first, second and/or third reconfigurable, digital phase-locked loops 100, 200, 300. In a representative embodiment, the secondary switched digital varactors $315_A$ comprises an n-type transistor 380 coupled to a transmission gate 365. The n-type transistor 380 is illustrated as a MOSFET, although any type of p or n transistor may be utilized equivalently (e.g., BJT, JFET, etc.), as known to those having skill in the art. The n-type transistor 380 has its source and drain coupled to each other, and further coupled to a selected voltage level (provided by the voltage controller $320_A$) to provide a selected level of capacitance (which may be varied by varying the gate-to-source voltage of the transistor 380, in this case, through the source voltage provided by the voltage controller $320_A$). The transmission gate 365 (or any other switching device, such as another transistor), switches (or transmits) the capacitance provided by the transistor 380 into or out of the oscillator stage 270 or LC oscillator 275, in response to the control signals (high or low voltages, corresponding to the coefficient values) of the control word (e.g., comprising the coefficients [$c_0, c_1, c_2, \ldots c_N$]) provided by the first digital controller 105 (and/or the third digital controller 145).

As mentioned above, the weighting of the various primary switched capacitors 310 and secondary switched digital varactors 315 may have any of a plurality of different forms such as, for example and without limitation, binary weighting of different primary switched capacitors 310, or the same weighting for all of the primary switched capacitors 310, other combinations of different weightings, and binary weighting of different secondary switched digital varactors 315, or the same weighting for all of the secondary switched digital varactors 315, other combinations of different weightings, and so on. In a representative embodiment, each of the primary switched capacitors 310 have a different weight, such as binary weightings of "x", "2x", "$2^2$x", "$2^3$x", though "$2^N$x", and each of the secondary switched digital varactors 315 have a different weight, such as binary weightings of "x", "2x", "$2^2$x", "$2^3$x", though "$2^N$x", or incremental weightings of "x", "2x", "3x", "4x", though "Nx", for example and without limitation. In another representative embodiment, the primary switched capacitors 310 are equally weighted, and each provides a predetermined step size (such as a predetermined percentage of the input or output frequency (e.g., 0.05%), or a predetermined step size (e.g., a 500 kHz step)) in the oscillation frequency of the first reconfigurable frequency and delay generator 110 and/or second reconfigurable frequency and delay generator 140 and/or LC oscillator 275. In another representative embodiment, the secondary switched digital varactors 315 are equally weighted, and together with the selectable voltages provided by the voltage controllers 320, each are "tunable" to provide a range of frequency steps (e.g., 10 kHz to 50 kHz or 100 kHz) in the oscillation frequency of the first reconfigurable frequency and delay generator 110, the second reconfigurable frequency and delay generator 140, and/or the LC oscillator 275. As mentioned above, any and all combinations of such weightings are within the scope of the disclosure.

The voltage controller $320_A$ comprises a plurality of transmission gates 365 (or any other switching devices, such as other transistors), and a plurality of series-connected, diode-coupled transistors 385, 390, 395, 405 (illustrated as p-type and n-type MOSFETs, although any type of p or n transistor may be utilized equivalently (e.g., BJT, JFET, etc.), as known to those having skill in the art) which form a voltage ladder (or voltage divider, equivalently) 430, generally having a comparatively low current level and low power consumption. The plurality of series-connected, diode-coupled transistors 385, 390, 395, 405 forming the voltage ladder 430, are coupled (or coupleable) at corresponding nodes 410, 415, and 420, through the plurality of transmission gates 365, to the secondary switched digital varactor 315. The plurality of diode-coupled transistors 385, 390, 395, 405 are coupled in series between a comparatively high voltage level, such as the high voltage rail ($V_{DD}$), and a comparatively low voltage level, such as the low voltage rail (ground), to provide a voltage "ladder" having a corresponding plurality of different voltage levels, illustrated as $V_1$ at node 410, $V_2$ at node 415, and $V_3$ at node 420, each of which can be selectively switched through a corresponding transmission gate 365 (illustrated as corresponding transmission gates $365_1$, $365_2$, and $365_3$) to the secondary switched digital varactor 315, as illustrated, in response to the control signals (high or low voltages, corresponding to the coefficient values) of the control word (e.g., comprising the coefficients [$d_0, d_1, d_2, \ldots d_N$]) provided by the first digital controller 105 (and/or the third digital controller 145). As result, the voltage controller $320_A$ provides a selected or selectable voltage level to the coupled source and drain of the transistor 380, thereby varying the source voltage (and corresponding gate-to-source voltage) of the transistor 380, which in turn correspondingly provides a selected level of capacitance which may be switched into (or out of) the oscillator stage 270 and/or LC oscillator 275, (a) to tune the oscillation frequency of the first reconfigurable frequency and delay generator 110 (and/or second reconfigurable frequency and delay generator 140) for the first and/or second reconfigurable, digital phase-locked loops 100, 200, or (b) tune the oscillation (resonant) frequency of the LC oscillator 275 for the third reconfigurable, digital phase-locked loop 300.

A particular advantage of this implementation of the frequency control inverters 305, primary switched capacitors 310, and secondary switched digital varactors 315, is that for any given IC fabrication process, very little process information is required to implement the first and/or second reconfigurable frequency and delay generator 110, 140, and/or the representative capacitive tuning circuits 195, in the selected fabrication process. For example, analog models are not required, and it is sufficient to know the capacitance values per size, e.g., based on oxide thickness. As mentioned above, this allows ready porting and implementation of the first and/or second reconfigurable frequency and delay generator 110, 140, and/or the representative capacitive tuning circuits 195 for any selected fabrication process.

Another particular advantage of this implementation of the voltage controller $320_A$ is that the voltage "ladder" 430 has a high impedance, and appears in the circuitry as a large resistor, effectively providing (with a secondary switched digital varactor 315) a resistor in series with a capacitor, and produces a corresponding (and usually comparatively small) RC delay. Given the oscillation, the voltage controller $320_A$ provides a charge and discharge path useful for tuning the first and/or second reconfigurable frequency and delay generator 110, 140 and/or LC oscillator 275, and overall an average voltage level across the resistance which on average does not change very much.

Figure 17:
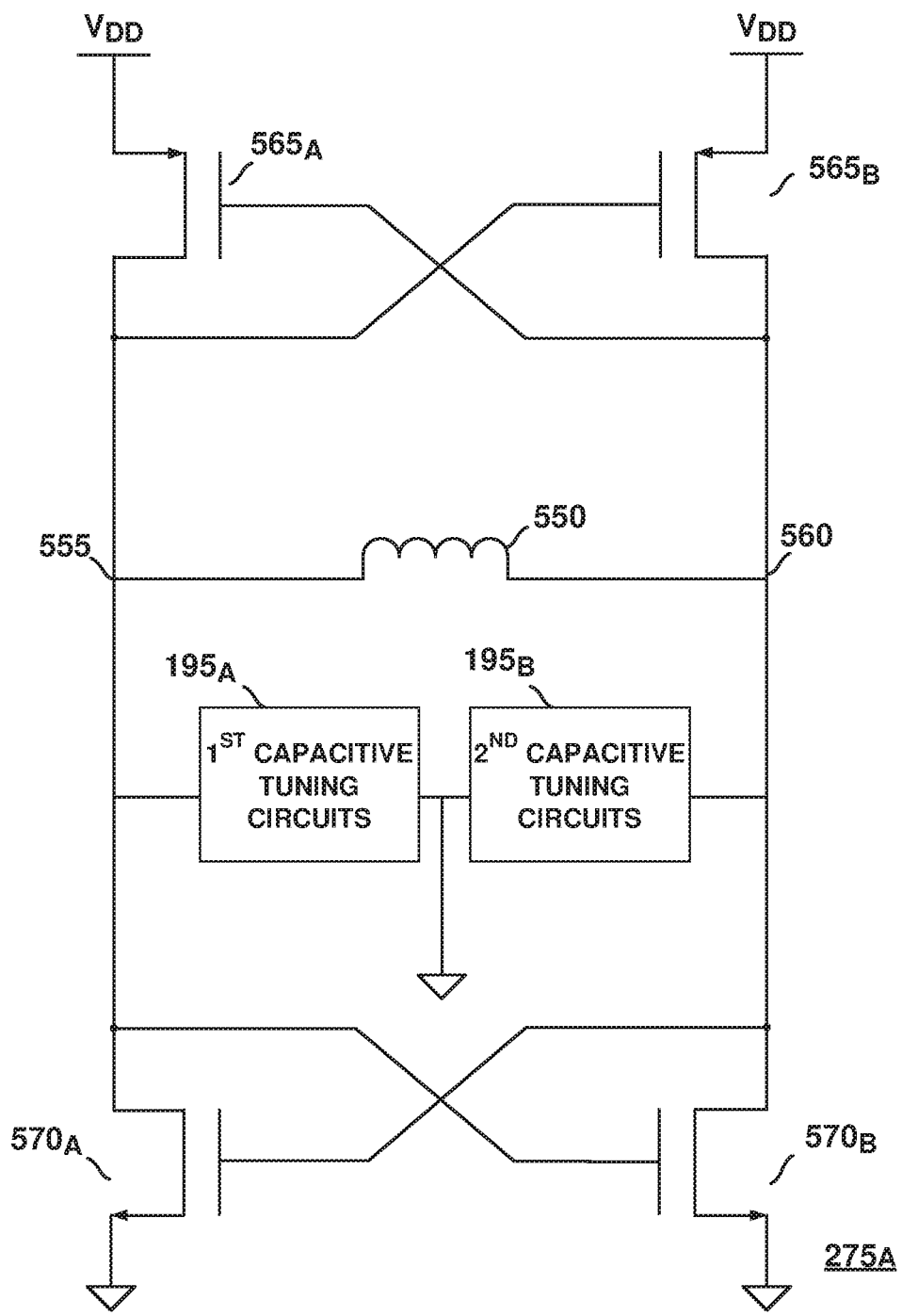
FIG. 17 is a circuit diagram illustrating in greater detail an exemplary or representative first embodiment of optional LC (inductive and capacitive) oscillator circuitry for the third reconfigurable, digital phase-locked loop.
Figure 18:
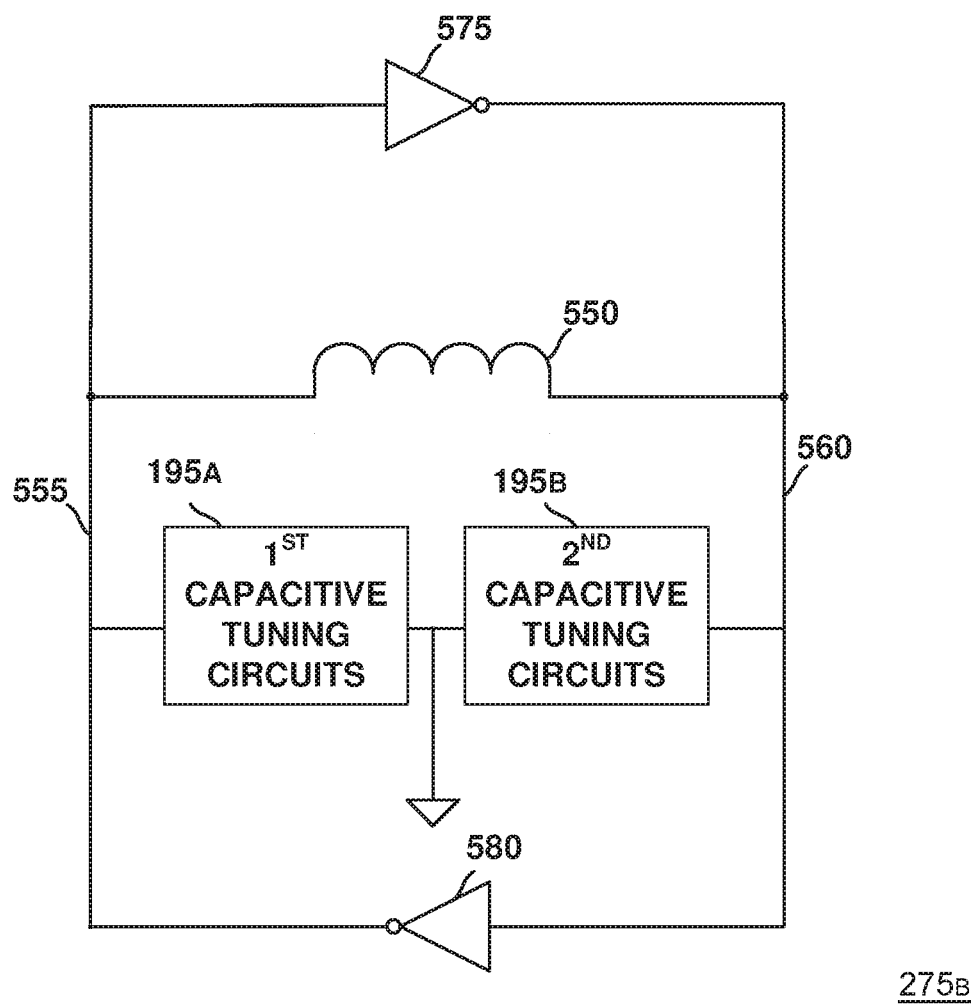
FIG. 18 is a circuit diagram illustrating in greater detail an exemplary or representative second embodiment of optional LC (inductive and capacitive) oscillator circuitry for the third reconfigurable, digital phase-locked loop.
Figure 19:
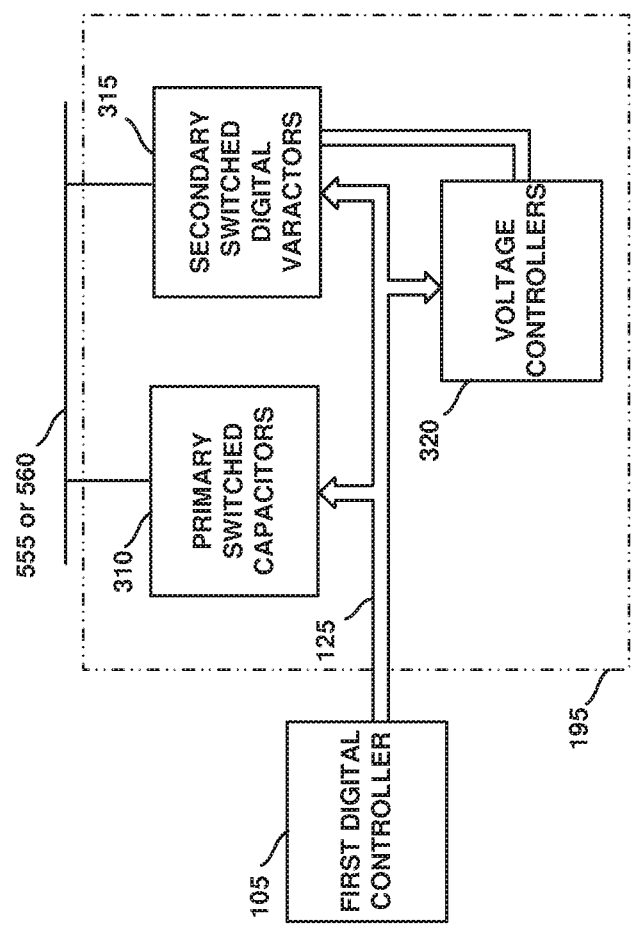
FIG. 19 is a block diagram illustrating an exemplary or representative embodiment of the capacitive tuning circuits for the optional LC (inductive and capacitive) oscillator circuitry for the third reconfigurable, digital phase-locked loop.

FIG. 17 is a circuit diagram illustrating in greater detail an exemplary or representative first embodiment of an optional LC oscillator $275_A$ for the third reconfigurable, digital phase-locked loop 300. FIG. 18 is a block and circuit diagram illustrating in greater detail an exemplary or representative second embodiment of an optional LC oscillator $275_B$ for the third reconfigurable, digital phase-locked loop 300. FIG. 19 is a block diagram illustrating an exemplary or representative embodiment of the capacitive tuning circuits 195 for the optional LC oscillator 275 for the third reconfigurable, digital phase-locked loop 300.

Referring to FIGS. 17-19, the LC oscillator $275_A$ (illustrated in a cross-coupled, differential configuration) comprises an inductor 550, first and second capacitive tuning circuits $195_A$ and $195_B$ coupled to the inductor 550, with cross-coupled p-transistors $565_A$ and $565_B$, and cross-coupled n-transistors $570_A$ and $570_B$. In the differential configuration, the first and second capacitive tuning circuits $195_A$ and $195_B$ are generally balanced with each other, each providing the same selected amount of capacitance. The p-type and n-type transistors are illustrated as MOSFETs, although any type of p or n transistor may be utilized equivalently (e.g., BJT, JFET, etc.), as known to those having skill in the art. The LC oscillator $275_B$ (also illustrated in FIG. 18 in a cross-coupled, differential configuration) comprises an inductor 550, capacitive tuning circuits $195_A$ and $195_B$ coupled to the inductor 550, and with inverters 575 and 580 (replacing the cross-coupled p-transistors $565_A$ and $565_B$, and cross-coupled n-transistors $570_A$ and $570_B$ of FIG. 17).

For the LC oscillators $275_A$, $275_B$, the capacitive tuning circuits $195_A$ and $195_B$ are respectively coupled between the inductor 550 (at node 555) and ground, and between inductor 550 (at node 560) and ground. As discussed above, each of the capacitive tuning circuits $195_A$ and $195_B$ comprise primary switched capacitors 310, secondary switched digital varactors 315, and voltage controllers 320, which function identically to those utilized in the delay control circuits 160. As a result, the capacitive tuning circuits 195 function as variable capacitors, changing the amount of capacitance coupled to the inductor 550 and the time constant of oscillation, to select or otherwise tune the oscillation (resonant) frequency of the LC oscillator 275 for the third reconfigurable, digital phase-locked loop 300, in response to one or more control words provided by the first digital controller 105. Stated another way, the same or similar control signals (control words), provided by the first digital controller 105 to the delay control circuits 160 for the first and second reconfigurable, digital phase-locked loops 100, 200, may be also be generated by the first digital controller 105 to the capacitive tuning circuits $195_A$ and $195_B$, to similarly change the output frequency of the LC oscillator 275 for the third reconfigurable, digital phase-locked loop 300.

FIG. 20 is a block diagram illustrating in greater detail an exemplary or representative embodiment of a plurality of oscillator stages $270_B$ (oscillator stage $270_{B0}$ through oscillator stage $270_{BN}$) in a ring oscillator circuit structure and an exemplary or representative embodiment of a phase sampler 170 of the first and/or second reconfigurable frequency and delay generators 110, 140 for the first or second reconfigurable, digital phase-locked loops 100, 200. FIG. 21 is a block diagram illustrating in greater detail an exemplary or representative embodiment of a plurality of oscillator stages $270_B$ $270_B$ (oscillator stage $270_{B0}$ through oscillator stage $270_{BN}$) in a delay line (or delay locked loop) 190 circuit structure and an exemplary or representative embodiment of a phase sampler $170_A$ of the first and/or second reconfigurable frequency and delay generators 110, 140 for the third reconfigurable, digital phase-locked loop 300.

Other components of the oscillator stages 270 discussed above, and the reconfigurable phase interpolators 165, have been intentionally omitted from the illustration of FIGS. 20 and 21, both to focus on phase sampling by a representative embodiment of a phase sampler 170 and also to illustrate use of single-ended, non-differential inverters within an oscillator stage 270; those having skill in the art will recognize that any and all of such components and/or differential variations may be included, however, for example and without limitation. In addition, the plurality of oscillator stages $270_B$ are illustrated simply as single-ended inverters, e.g., an inverter 330, for purposes of discussion and to simply illustrated suitable oscillation phases representative of any implementation of a ring oscillator circuit structure, and those having skill in the art will recognize that the other components of an oscillator stage 270 described above are represented implicitly.

Referring to FIGS. 20 and 21, in a representative embodiment, the phase sampler 170 may be implemented as a "time-to-digital converter" ("TDC") or "position-to-digital converter" using a plurality of flip-flops 425, illustrated as D flip-flops, although any type of flip-flop or register may be used equivalently. In addition to being fed to a next oscillator stage 270 (or back to the first oscillator stage 270), each output from an oscillator stage 270 (or intervening phase interpolator 165) is also input to a corresponding, separate flip-flop 425, via wires, lines or bus 465, illustrated as wires or lines $465_0$, $465_1$, $465_2$, $465_3$, through $465_N$, and each flip-flop 425 is clocked by the input frequency reference, $f_{REF}$ (in FIG. 20) and the output frequency $f_{OUT}$ (in FIG. 21). Accordingly, every clock cycle of the frequency reference $f_{REF}$ (or output frequency $f_{OUT}$), each flip-flop 425 will output a value (e.g., a low voltage (binary 0) or a high voltage (binary 1), on bus 175) representing the sampled phase of the corresponding oscillator stage $270_B$, illustrated as a plurality of sampled phases (Sϕ), as Sϕ[0], Sϕ[1], Sϕ[2], Sϕ[3], through Sϕ[N], indicative of where the leading edge (e.g., rising edge) of the oscillation is in the reconfigurable oscillator 110, 140, i.e., the position of the leading edge of the oscillation is in the reconfigurable oscillator 110, 140. The transition in phase, as indicated by the plurality of sampled phases (Sϕ), e.g., from a 1 to a 0 or from a 0 to a 1, indicates whether and where in the reconfigurable oscillator 110, 140 there may be a phase difference, if any, between the frequency reference $f_{REF}$ and the oscillator output $f_{OUT}$, i.e., the phase of the reconfigurable oscillator 110, 140 with respect to the frequency reference $f_{REF}$. For example, a 1 (or 0) output from an oscillator stage $270_{(N-1)}$ with a 1 (or 0) output from an oscillator stage $270_{(N)}$ would indicate that the phase has just changed at oscillator stage $270_{(N-1)}$ and will be changing next at oscillator stage $270_{(N)}$. Also for example, for any given oscillator stage 270, an output transition over time of a series of 1's to a 0, or vice-versa, also indicates a phase transition, e.g., 111110000011111. The plurality of sampled phases generated by this embodiment of the phase sampler 170 provide information as to the position of the leading edge of the oscillation, among the plurality of oscillator stages 270 (e.g., as coupled in a ring oscillator configuration), relative to the last oscillator stage $270_N$ (oscillator stage $270_{BN}$), within the reconfigurable oscillator 110, 140, and this information is output on bus 175 to the binary encoder 205, which will convert this positional phase information into a binary representation, as discussed in greater detail below.

For example, for the delay line (or delay locked loop) 190 embodiment illustrated in FIG. 21, the phase sampler $170_A$ is clocked at output frequency $f_{OUT}$, which may be from either the LC oscillator 275 or the last oscillator stage $270_N$ (oscillator stage $270_{BN}$). The plurality of sampled phases generated by this embodiment of the phase sampler $170_A$ provide information as to the position of the leading edge of the oscillation, among the plurality of oscillator stages 270 (e.g., as coupled in a series-connected delay line configuration), relative to the last oscillator stage $270_N$. When the period of the LC oscillator 275 matches the period of the delay line (or delay locked loop) 190, assuming an eight (8) stage delay line as an example, the sampled phases from the phase sampler $170_A$ will alternate between 00001111 and 10000111. The position of the "10" shows where the leading edge is in the delay line (or delay locked loop) 190. When the delay through the delay line (or delay locked loop) 190 matches the period of the input (from the LC oscillator 275) to the delay line (or delay locked loop) 190, the leading edge will occur at the input to the first oscillator stage $270_1$. Similarly, when the delay of the delay line (or delay locked loop) 190 matches the period of the output from the LC oscillator 275, the leading edge from the last oscillator stage $270_N$ will be coincidental with the output from the LC oscillator 275.

Figure 22:
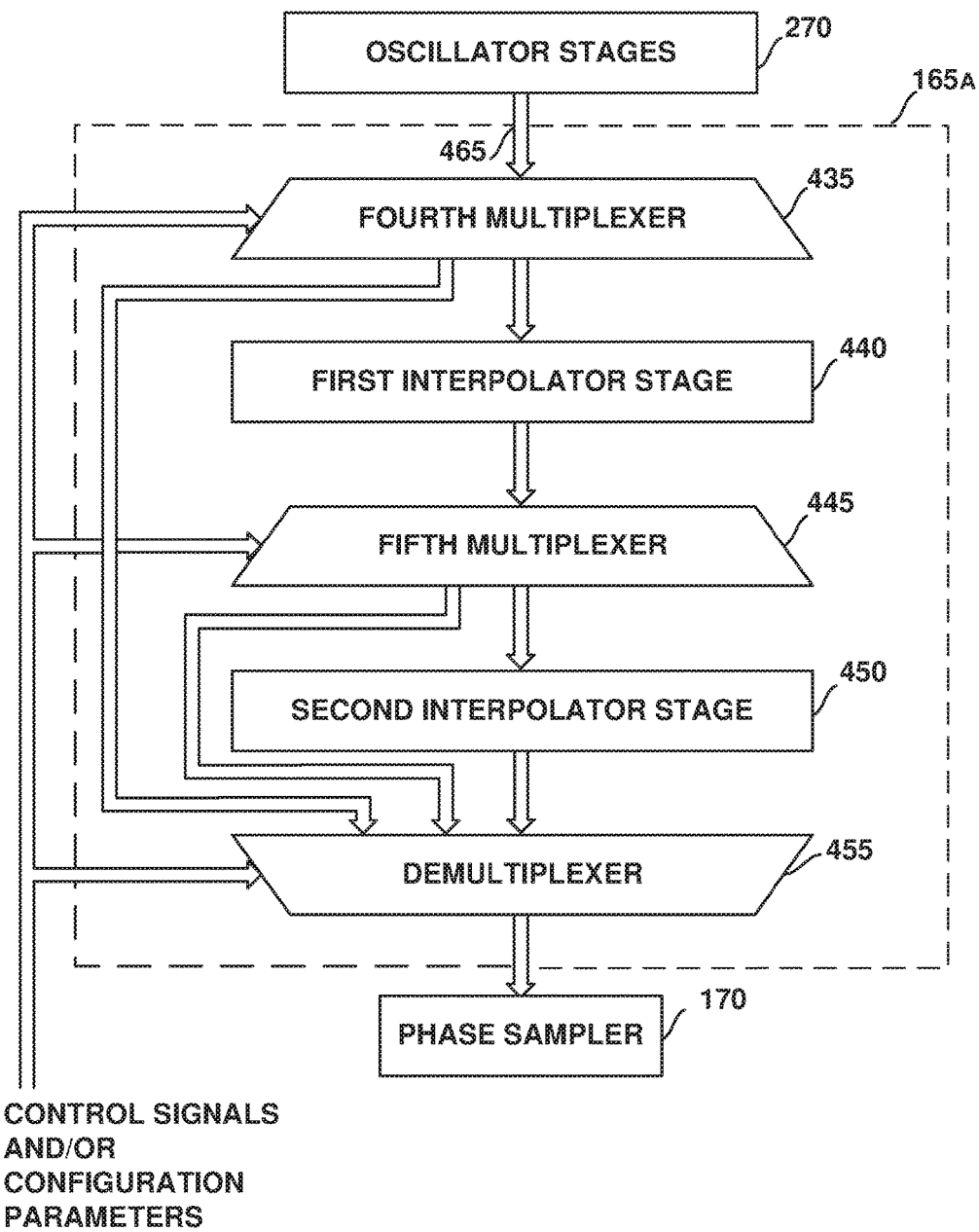
FIG. 22 is a block diagram illustrating in greater detail an exemplary or representative embodiment of a configurable or reconfigurable phase interpolator of the first and/or second reconfigurable frequency and delay generators with phase detection (or measurement) for the first, second or third reconfigurable, digital phase-locked loops.
Figure 23:
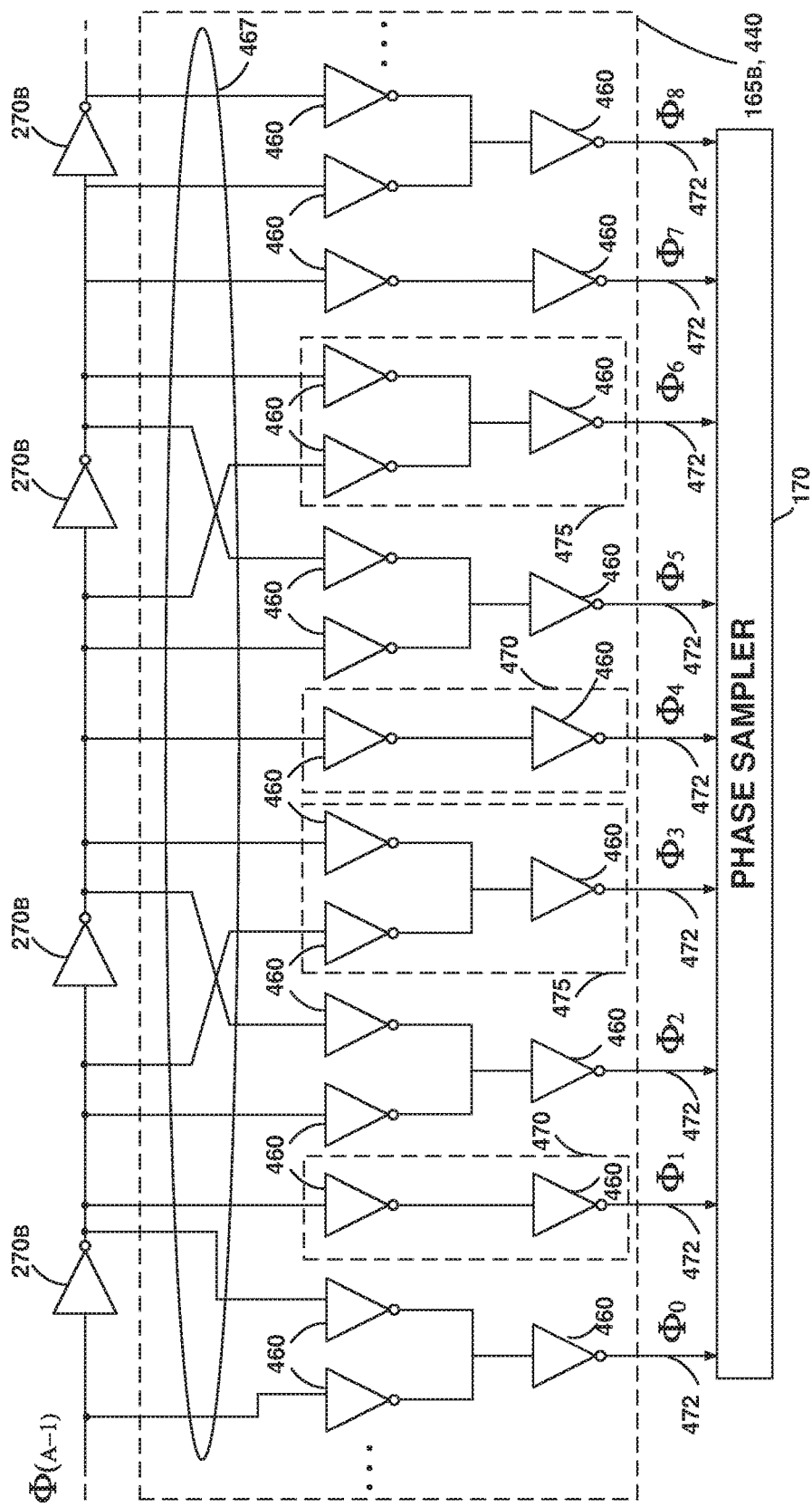
FIG. 23 is a block diagram illustrating in greater detail an exemplary or representative embodiment of a non-configurable or non-reconfigurable phase interpolator of the first and/or second reconfigurable frequency and delay generators with phase detection (or measurement) for the first, second or third reconfigurable, digital phase-locked loops.
Figure 24:
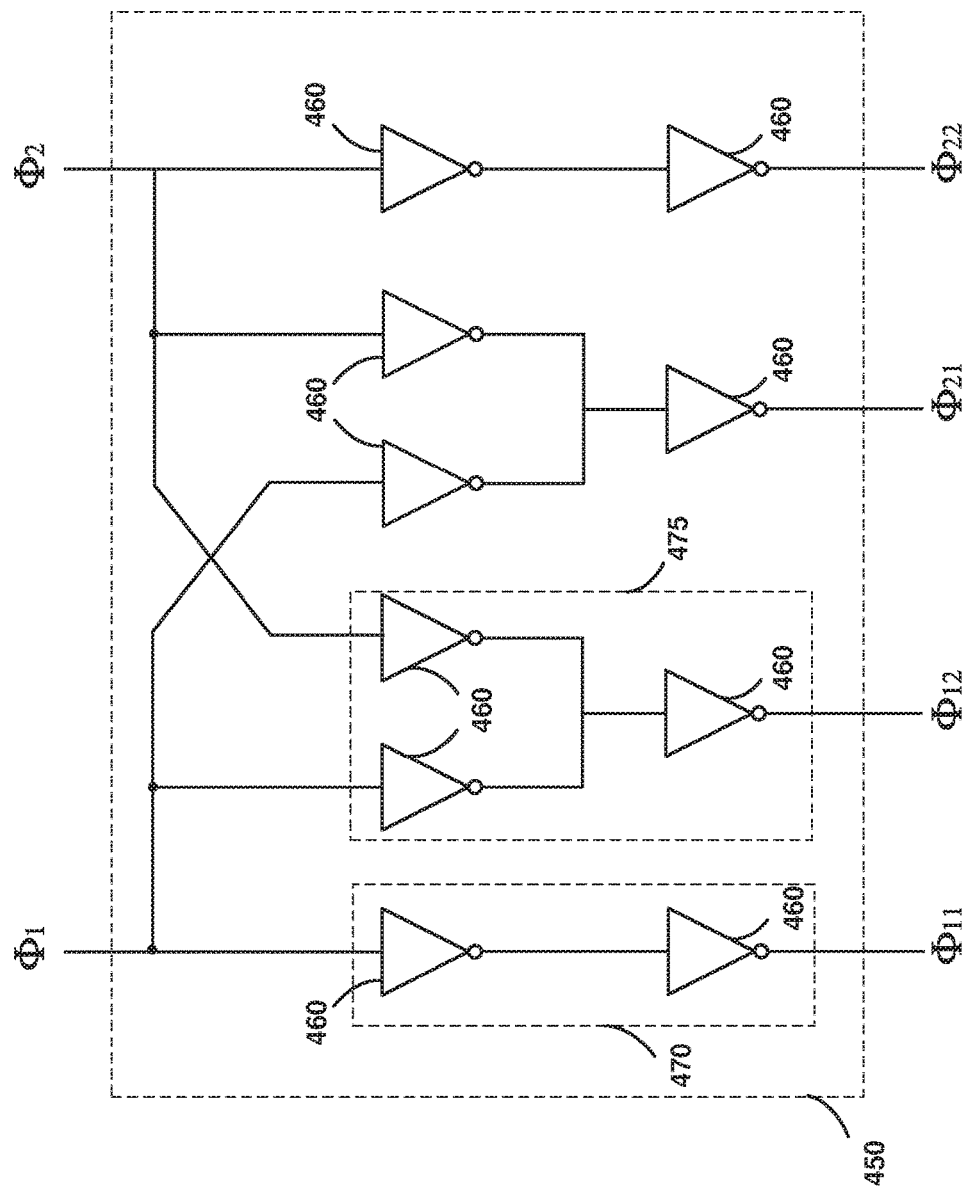
FIG. 24 is a block diagram illustrating in greater detail an exemplary or representative second interpolator stage for the various embodiments of a configurable or non-configurable phase interpolator of the first and/or second reconfigurable frequency and delay generators with phase detection (or measurement) for the first, second or third reconfigurable, digital phase-locked loops.

FIG. 22 is a block diagram illustrating in greater detail an exemplary or representative embodiment of a configurable or reconfigurable phase interpolator $165_A$ of the first and/or second reconfigurable frequency and delay generators 110, 140 for the first, second and/or third reconfigurable, digital phase-locked loops 100, 200, 300. FIG. 23 is a block diagram illustrating in greater detail an exemplary or representative embodiment of a non-configurable or non-reconfigurable phase interpolator $165_B$ of the first and/or second reconfigurable frequency and delay generators 110, 140 for the first, second and/or third reconfigurable, digital phase-locked loops 100, 200, 300. FIG. 24 is a block diagram illustrating in greater detail an exemplary or representative second interpolator stage 450 for the various embodiments of a configurable or non-configurable phase interpolator 165 of the first and/or second reconfigurable frequency and delay generators 110, 140 for the first, second and/or third reconfigurable, digital phase-locked loops 100, 200, 300.

In a first representative embodiment, the output of the each oscillator stage 270 is provided directly to the phase sampler 170, without a phase interpolator 165, as illustrated in FIGS. 20 and 21. In a second representative embodiment, the output of the each oscillator stage 270 is provided (via wires or bus 467), first, to a phase interpolator $165_B$ (which also may be reconfigurable, as an option), and then the interpolated phases are provided (via wires or bus 472) to the phase sampler 170, as illustrated in FIG. 23. In a third representative embodiment, the output of the each oscillator stage 270 is provided, first, to a first interpolator stage 440 of a reconfigurable phase interpolator $165_A$ (which may be configurable or reconfigurable, for both the number of interpolation stages and/or for a plurality of configurable or reconfigurable oscillator stages), and then the interpolated phases are provided to the phase sampler 170, as illustrated in FIG. 22. An optional, additional second interpolator stage 450, a plurality of which may be utilized in either the second or third embodiments phase interpolator $165_B$, $165_A$, is illustrated in FIG. 24, and would be included between the first interpolator stage 440 and the phase sampler 170.

Referring to FIG. 22, a reconfigurable phase interpolator $165_A$ is coupled between the plurality of oscillator stages 270 and the phase sampler 170. The reconfigurable phase interpolator $165_A$ comprises one or more interpolator stages, illustrated as a first interpolator stage 440 and a second interpolator stage 450, one or more multiplexers or other controllable switches (such as transmission gates 365 or any type of transistors, as described above), illustrated as a fourth multiplexer 435 and a fifth multiplexer 445, and an optional demultiplexer 455. The fourth and fifth multiplexers 435, 445 may be implemented as multiplexer circuits as known or becomes known in the art. While illustrated with two interpolator stages 440, 450 and two multiplexers 435, 445, those having skill in the art will recognize that a lesser or greater number of interpolator stages and/or multiplexers may be utilized equivalently, and any and all such combinations are within the scope of the disclosure. Each multiplexer 435, 445 is configured to switch the outputs from an oscillator stages 270 (on bus 465) either to a next interpolator stage, e.g., respectively to the first interpolator stage 440 and the second interpolator stage 450, or directly to the phase sampler 170, bypassing one or more interpolator stages, in response to configuration parameters or in response to a plurality of control signals (high or low voltages, corresponding to the coefficient values) of the control word (e.g., comprising the coefficients [$e_0$, $e_1$, $e_2$, ... $e_N$]) provided by the first digital controller 105. Depending on the selected embodiment, an optional demultiplexer 455 may also be utilized, so select which signals are provided to the phase sampler 170, such as the direct outputs from the oscillator stages 270, or the interpolated phases from the first interpolator stage 440 or the second interpolator stage 450. By using the reconfigurable phase interpolator $165_A$, user-selectable control over the desired or allowable jitter level is provided. A representative first interpolator stage 440 is illustrated in FIG. 23, as phase interpolator $165_B$. A repeating unit of a representative second interpolator stage 450 is illustrated in FIG. 24.

Referring to FIGS. 23 and 24, an interpolator stage 440 comprises a plurality of inverters 460 (e.g., implemented as shown in FIG. 10 using two transistors 335, 340 coupled in an inverter configuration as shown), which may be coupled to each other in two different ways, illustrated in a buffer configuration 470 for a single phase (e.g., φ1, φ4, φ7) from a single oscillator stage 270, and a tree configuration 475 for multiple phases (e.g., φ0, φ2, φ3, φ5, φ6, φ8) from two consecutive oscillator stages 270, with a lesser or greater number of inverters 460 (coupled in buffer configurations 470 and coupled in tree configurations 475) utilized depending upon the number of oscillator stages 270.

Similarly, an interpolator stage 450 also comprises a plurality of inverters 460 (e.g., implemented as shown in FIG. 10 using two transistors 335, 340 coupled in an inverter configuration as shown), also coupled to each other in a buffer configuration 470 for a single phase (e.g., φ11 from φ1) from a either a single oscillator stage 270 or a next phase, and a tree configuration 475 for multiple phases (e.g., φ12 from φ1 and φ2, φ21 from φ1 and φ2) from either two consecutive oscillator stages 270 or from two successive phases, also with a lesser or greater number of inverters 460 (coupled in buffer configurations 470 and coupled in tree configurations 475) utilized depending upon the number of oscillator stages 270. For example, multiple implementations of an interpolator stage 450 may be utilized, and is illustrated, for example, to be a next interpolator stage coupled to receive φ1 and φ2 from interpolator stage 440 illustrated in FIG. 23, with additional interpolator stages 450, each of which is respectively coupled to receive φ3 and φ4 from interpolator stage 440, φ5 and φ6 from interpolator stage 440, φ7 and φ8 from interpolator stage 440, and so on, to provide additional, second order phase interpolation.

As discussed above, the resulting phase information from the first interpolator stage 440 or the second interpolator stage 450 (or any additional interpolator stages, not separately illustrated) is provided to the phase sampler 170, to sample each of these interpolated phases. The plurality of sampled phases generated by this embodiment of the phase sampler 170 also provides information as to the position of the leading edge of the oscillation, among the plurality of oscillator stages 270 (e.g., as coupled in a ring oscillator configuration), within the reconfigurable oscillator 110, 140, and this information is output on bus 175 to the binary encoder 205, which will convert this positional phase information into a binary representation, as discussed in greater detail below. For example and without limitation, for a reconfigurable oscillator 110, 140 having five oscillator stages 270 coupled in a ring oscillator configuration, without phase interpolation for this example, an output from the phase sampler 170 may consist of 01101, indicating the leading edge of the oscillation has occurred at the output of the second oscillator stage 270, while an output from the phase sampler 170 may consist of 01011, indicating the leading edge of the oscillation has occurred at the output of the fourth oscillator stage 270. Finer-grained information is provided with phase interpolation, but is nonetheless information for the position of the phase of the oscillation among the plurality of oscillator stages 270.

In turn, the binary encoder 205 of the first digital controller 105 converts or encodes this phase positional information into or as a binary value, which is then output on line or bus 207. Continuing with the example above, the output from the phase sampler 170 of 01011, indicating the leading edge of the oscillation has occurred at the output of the fourth oscillator stage 270, may be encoded and output from the binary encoder 205 as a binary four, 0100 (or 100), for example and without limitation. There are innumerable equivalent ways to implement the binary encoder 205, such as a state machine or as a look up table, or using conditional or combinational logic gates, for example and without limitation, any and all of which are considered equivalent and within the scope of the disclosure.

As mentioned above, the first digital controller 105 also receives frequency feedback of the output, having a frequency $f_{OUT}$, provided directly to the gray code counter 210, which is also clocked by the output at the output frequency, $f_{OUT}$, so that a count is provided for every edge (e.g., leading or rising edge) of the output oscillation as an estimate of the output frequency, $f_{OUT}$, regardless of whether the output signal is provided by the LC oscillator 275 or by the first and/or second reconfigurable frequency and delay generators 110, 140. The gray code counter 210 is implemented as a counter, as known or becomes known in the art, but which counts using a gray code rather than a binary code, in which only one bit of successive values is allowed to transition, e.g., 000 to 001 to 011 to 010 to 110 to 100 in gray code, rather than 000 to 001 to 010 to 011 to 100 to 101 to 110, etc., of binary code. Any suitable or selectable gray code may be utilized, and provides several advantages. First, it may be clocked at the output frequency, $f_{OUT}$, which may be at a very high frequency (e.g., GHz), but because only one bit is changing or transitioning at a time, the rapid counting does not exhaust the capabilities of the fabrication technology, which may not be able to transition from high to low and immediately again from low to high at such high frequencies. Another added advantage of using the gray code counter 210 in the representative embodiments is error detection, because any successive counts which have more than one bit transition indicates an error. In a representative embodiment, as discussed in greater detail below, several successive gray code counts are utilized, to provide not only error detection but also error correction, using optional error correction circuit 260. In addition, as discussed above, the gray code counting using gray code counter 210 and optional error correction circuit 260 is also helpful for crossing clock domains, from clocking at the output frequency, $f_{OUT}$, to clocking at the reference frequency, $f_{REF}$.

As the gray code counter 210 is counting the leading or rising edge of the output oscillation as an estimate of the output frequency, $f_{OUT}$, one or more successive then-current counts of gray code counter 210 are sampled by gray code sampler 215 (via wires or bus 268, and which may be clocked at either the input reference frequency $f_{REF}$ or the output frequency, $f_{OUT}$, as discussed above) to provide one or more gray code samples (and when error correction is implemented, successive gray code samples are also stored in one or more gray code registers 285, as an option). The gray code sampler 215 may be implemented using any of a plurality of different circuits, such as using a plurality of switches (e.g., any type of transistors), with each switch or transistor (or transmission gate) passing one bit, or using a plurality of flip-flops, such as illustrated for the phase sampler 170, any and all of which are considered equivalent and within the scope of the disclosure. In a representative embodiment, successive gray code samples (from gray code sampler 215) are stored in one or more gray code registers 285, which are then provided either to the error correction circuit 260 (via wires or bus 262, and then to the gray code-to-binary converter 220, via wires or bus 264) or directly to the gray code-to-binary converter 220, via wires or bus 266.

There are several alternative embodiments for the gray code sampler 215 and gray code registers 285 within the scope of the disclosure. In another, second embodiment, using bus 287 illustrated in FIG. 4, successive grey code count values from the gray code counter 210 are shifted directly into gray code registers 285 (also clocked at the output frequency, $f_{OUT}$), which may be implemented as first-in, first-out (FIFO) registers, for example and without limitation. Also for example and without limitation, the registers may be implemented as a series of several sets of flip-flops for each bit position, one set of flip-flops having an input to receive the then-current gray code count bits (at time t), with its outputs provided to the next, second set of flip-flops (storing values at time t−1), with its outputs provided to the next, third set of flip-flops (storing values at time t−2), creating a delay line storing three successive gray code counts, as delayed samples. The gray code sampler 215, clocked at the reference frequency, $f_{REF}$, is implemented as one or more switches (e.g., using any of the transistors or transmission gates discussed above), and switches or shifts the stored, successive grey code count values from the gray code registers 285, so that a plurality of successive grey code count values are switched generally concurrently (or in parallel), either to the error correction circuit 260 (and then to the gray code-to-binary converter 220) or directly to the gray code-to-binary converter 220.

In yet another, third embodiment, the gray code sampler 215, clocked at the reference frequency, $f_{REF}$, is also implemented as one or more switches, and switches or shifts the one or more, or successive, grey code count values directly from the gray code counter 210, which are then also provided either to the error correction circuit 260 (and then to the gray code-to-binary converter 220) or directly to the gray code-to-binary converter 220. These various embodiments advantageously allow the gray code sampler 215 to operate in a different, generally slower clock domain than the gray code counter 210.

In a representative embodiment, the error correction circuit 260 is implemented to check successive gray code counts, sampled from the gray code registers 285 at the reference frequency, $f_{REF}$, determine if any count has more than one bit transition, and if so, the error correction circuit 260 determines that an error occurred. For example, the error correction circuit 260 may be implemented using conditional or combinational logic gates and a bank or plurality of exclusive or (XOR) gates, one for each bit position, or one or more comparators, such that only one XOR gate or comparator should indicate different input bit values between successive counts, and if more than one, then an error has occurred. In a representative embodiment, with at least three gray code count samples, the erroneous sample may by determined (if any), and discarded or otherwise not passed to the gray code-to-binary converter 220.

In turn, the gray code-to-binary converter 220 of the first digital controller 105 converts or encodes these gray code samples into or as a binary value, which is then output on line or bus 209. There are innumerable equivalent ways to implement the gray code-to-binary converter 220, such as a state machine or as a look up table, or using conditional or combinational logic gates, for example and without limitation, any and all of which are considered equivalent and within the scope of the disclosure.

The output binary value from the gray code-to-binary converter 220, indicative of a count corresponding to the output frequency, $f_{OUT}$, and the output binary value from the binary encoder 205, indicative of the phase of the output frequency, $f_{OUT}$, are added or otherwise combined to form a combined feedback binary value, using adder (or combiner) 225. Typically, the phase of the output frequency, $f_{OUT}$, is provided in the least significant bits of the combined feedback binary value (e.g., in the binary equivalent of decimal places or fractions). The adder (or combiner) 225 may be implemented using combinational logic gates as known or becomes known in the electronic arts. For example and without limitation, in a representative embodiment, the adder (or combiner) 225 may be implemented to merely concatenate the two output binary values to provide the combined feedback binary value (e.g., as [frequency binary count, phase binary count]).

Generally concurrently, the reference signal from the reference clock (or oscillator) 95, input into the reference counter (or accumulator) 235, to generate a reference frequency count, has been multiplied (or divided) by multiplier 230 (providing a multiplied count indicative of the user-selected or otherwise configurable or reconfigurable desired frequency, e.g., multiplied by a value "M", generally determined by or derived from configuration parameters), with the multiplied reference frequency count (e.g., $M \cdot f_{REF}$), generally accumulating over multiple clock cycles. As mentioned above, the multiplied reference frequency count is then compared with the combined frequency and phase feedback binary value, namely, the multiplied reference frequency count is compared with the combined frequency and phase feedback count, by the comparator (adder or subtractor) 240, to determine an amount of error, if any, as an error amount, value or count which is indicative of the difference (if any) between both the frequency and phase of the output signal having output frequency $f_{OUT}$ compared to the multiplied reference frequency ($M \cdot f_{REF}$). The multiplier 230, the reference counter (or accumulator) 235, and the comparator (adder or subtractor) 240 may be implemented using combinational logic gates as known or becomes known in the electronic arts.

As an available alternative or option, such as when a second digital controller 135 is implemented using the circuitry of a first digital controller 105, the comparator (adder or subtractor) 240 may also add in an additional error, second configurable error signal $\phi_{ERR2}$ (650). As discussed in greater detail below, this second configurable error signal $\phi_{ERR2}$ is inserted or injected by the second digital controller 135 into the feedback loop providing control signals to the second reconfigurable frequency and delay generator 140 of the reconfigurable PLL 200, and is utilized to generate an output signal having an output frequency which has a fractional offset from an integer multiple of the reference frequency.

The resulting error count (or error signal) is provided via line or bus 243 to the programmable digital filter 250, which generally comprises both combinational logic gates and optionally memory circuitry 120A (e.g., registers to store various parameters and the resulting error count) (which also may be implemented using memory 120), to perform digital filtering of the error count, and to increment or decrement the various control words (which might be stored in memory circuitry or registers) or control signals to increase or decrease the amount of delay provided in each of the oscillator stages 270. Based on the error count and the desired frequency, the programmable digital filter 250 generates (or modifies) one or more control words or signals to the reconfigurable oscillator 155 and the delay control circuits 160 (or to the capacitive tuning circuits 195), for the output frequency $f_{OUT}$ to match and lock to the desired frequency (as a multiple of the reference frequency $f_{REF}$) and match and lock to the phase of the reference frequency $f_{REF}$ provided by the reference clock (or oscillator) 95. In a representative embodiment, the output of the programmable digital filter 250 will converge to a stable value (with the plurality of control words or signals also stabilizing), the average error count will converge to zero, and the frequency $f_{OUT}$ will settle and lock to its selected frequency, and match and lock to the phase of the reference frequency $f_{REF}$, within about 400-1,000 clock cycles (at the reference frequency $f_{REF}$), for example and without limitation, depending upon the filter coefficients of the programmable digital filter 250.

Figure 25:
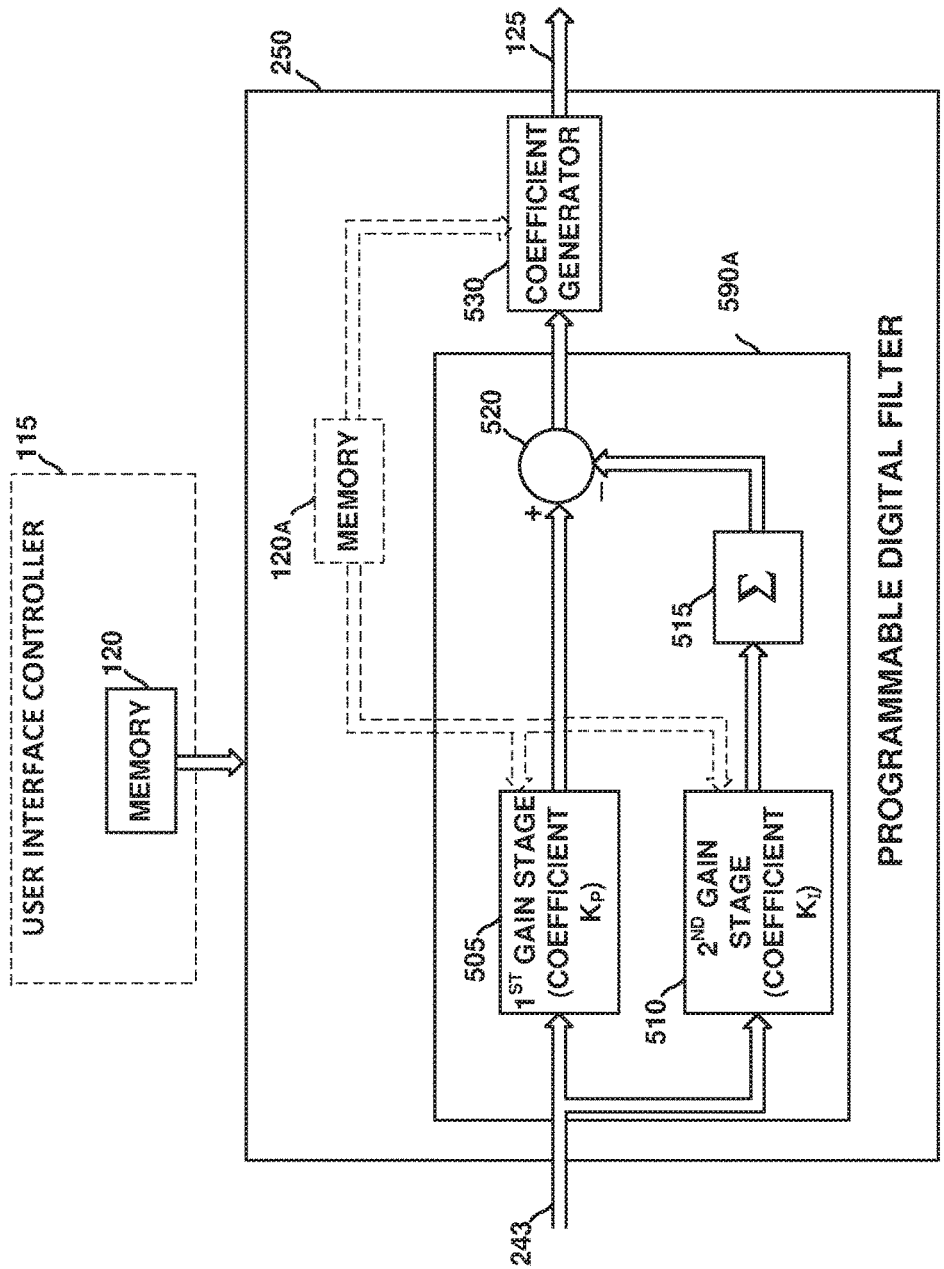
FIG. 25 is a block diagram illustrating in greater detail an exemplary or representative embodiment of a programmable digital filter with a first configurable filter for the first digital controller for the first, second or third reconfigurable, digital phase-locked loops.
Figure 26:
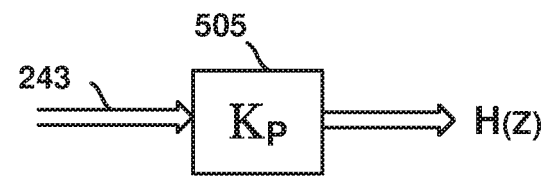
FIG. 26 is a block diagram illustrating in greater detail an exemplary or representative second configurable filter of a programmable digital filter for the first digital controller for the first, second or third reconfigurable, digital phase-locked loops.
Figure 27:
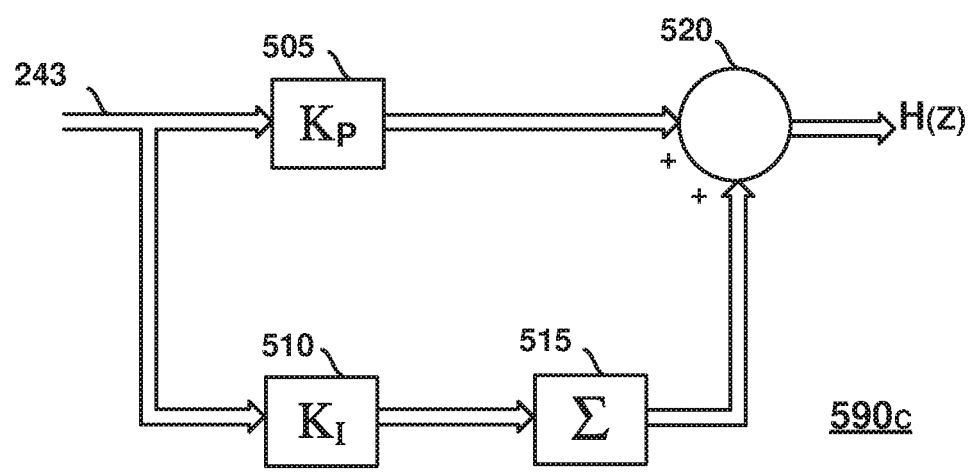
FIG. 27 is a block diagram illustrating in greater detail an exemplary or representative third configurable filter of a programmable digital filter for the first digital controller for the first, second or third reconfigurable, digital phase-locked loops.
Figure 28:
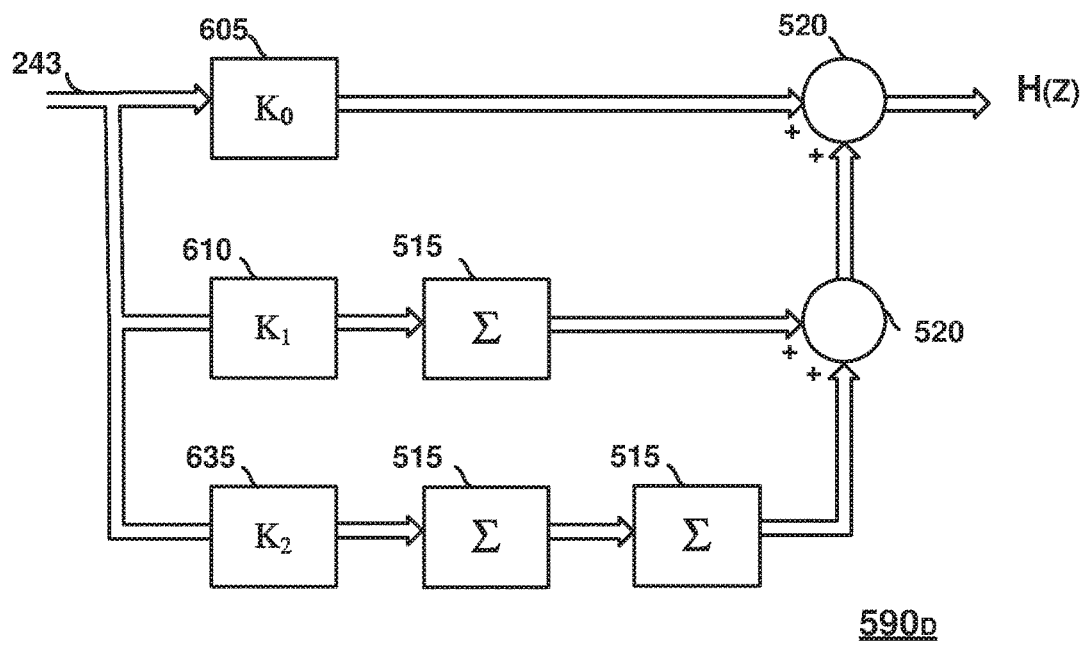
FIG. 28 is a block diagram illustrating in greater detail an exemplary or representative fourth configurable filter of a programmable digital filter for the first digital controller for the first, second or third reconfigurable, digital phase-locked loops.
Figure 29:
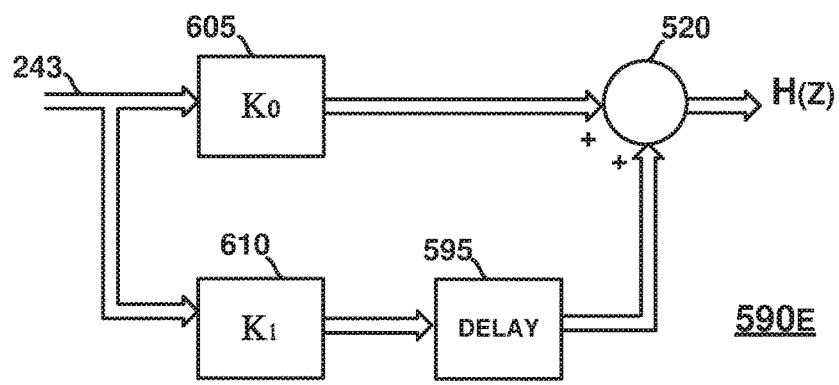
FIG. 29 is a block diagram illustrating in greater detail an exemplary or representative fifth configurable filter of a programmable digital filter for the first digital controller for the first, second or third reconfigurable, digital phase-locked loops.
Figure 30:
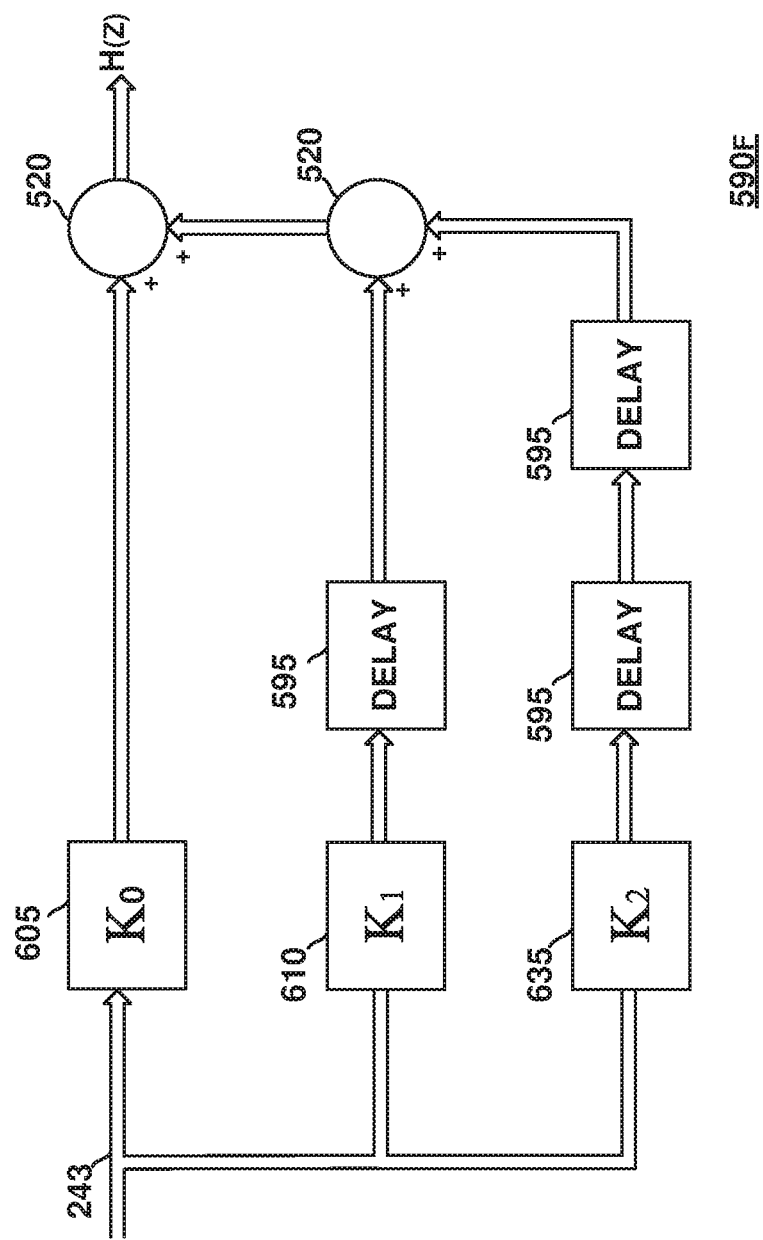
FIG. 30 is a block diagram illustrating in greater detail an exemplary or representative sixth configurable filter of a programmable digital filter for the first digital controller for the first, second or third reconfigurable, digital phase-locked loops.

FIG. 25 is a block diagram illustrating in greater detail an exemplary or representative programmable digital filter 250 with a first configurable filter $590_A$ for the first digital controller 105 for the first, second or third reconfigurable, digital phase-locked loops 100, 200, 300. FIG. 26 is a block diagram illustrating in greater detail an exemplary or representative second configurable filter $590_B$ of a programmable digital filter 250 for the first digital controller 105 for the first, second or third reconfigurable, digital phase-locked loops 100, 200, 300. FIG. 27 is a block diagram illustrating in greater detail an exemplary or representative third configurable filter $590_C$ of a programmable digital filter 250 for the first digital controller 105 for the first, second or third reconfigurable, digital phase-locked loops 100, 200, 300. FIG. 28 is a block diagram illustrating in greater detail an exemplary or representative fourth configurable filter 590$_D$ of a programmable digital filter 250 for the first digital controller 105 for the first, second or third reconfigurable, digital phase-locked loops 100, 200, 300. FIG. 29 is a block diagram illustrating in greater detail an exemplary or representative fifth configurable filter 590$_E$ of a programmable digital filter 250 for the first digital controller 105 for the first, second or third reconfigurable, digital phase-locked loops 100, 200, 300. FIG. 30 is a block diagram illustrating in greater detail an exemplary or representative sixth configurable filter 590$_F$ of a programmable digital filter 250 for the first digital controller 105 for the first, second or third reconfigurable, digital phase-locked loops 100, 200, 300.

A representative programmable digital filter 250 comprises a configurable filter 590 (illustrated in FIG. 25 using first configurable filter 590$_A$), and generally also a memory 120A (as an option) and a coefficient generator 530, depending upon the embodiment. Any of the various configurable filters 590 may be utilized in the programmable digital filter 250, including any of the first configurable filter 590$_A$, second configurable filter 590$_B$, third configurable filter 590$_C$, fourth configurable filter 590$_D$, fifth configurable filter 590$_E$, or sixth configurable filter 590$_F$, for example and without limitation.

Depending upon the representative embodiment, the programmable digital filter 250 may be coupled to the user interface controller 115 to receive the various user-selectable configuration parameters (or specifications) for selection of: (1) the desired frequency $f_{OUT}$ of the output signal; (2) bandwidth (for noise suppression); (3) frequency accuracy or Q value; (4) frequency resolution (frequency increments, such as the minimum capacitance values and minimum voltage increments for tuning the frequency); (5) number of stages; (6) jitter level or scale (phase increments for phase locking); (7) power consumption; and/or (8) fractional frequency selection, for example and without limitation. These configuration parameters may be stored in either or both the memory 120, or the optional memory 120A of or coupled to the programmable digital filter 250. Other parameters may also be stored in the memories 120, 120A, such as for frequency control over voltage and temperature (from feedback from voltage or temperature sensors, not separately illustrated). The user interface controller 115 and/or programmable digital filter 250 may be implemented using combinational logic gates, and more generally as one or more processors, as described in greater detail below. The optional memory 120A may be implemented as described in greater detail below, or as a pair of cross-coupled inverters 330 to provide a fault-tolerant memory 120A, such as the pair of cross-coupled inverters 330 having the circuit configuration illustrated in FIG. 9 with inverters 330$_3$ and 330$_4$.

Depending upon the representative embodiment, the various user-selectable configuration parameters may take any of various forms. For example, in a first representative embodiment, the various user-selectable configuration parameters are converted or translated directly to coefficients of the various control words and other parameters discussed below (e.g., number of stages, N, $K_P$, $K_I$), with such conversion or translation performed externally to the first, second or third reconfigurable, digital phase-locked loops 100, 200, 300 and input directly into the memory 120 or the user interface controller 115 and its associated memory 120. Also for example, in a second representative embodiment, the various user-selectable configuration parameters are input directly into the user interface controller 115 and its associated memory 120, and are converted or translated directly to coefficients of the various control words and other control parameters discussed below (e.g., number of stages, N, $K_P$, $K_I$), with such conversion or translation performed by the user interface controller 115 and/or the programmable digital filter 250, with the resulting coefficients and other parameters respectively stored in the one or more associated memories 120, 120A. Continuing with the example, the various user-selectable configuration parameters may be converted or translated into the various control words and other control parameters using a look up table stored in the one or more associated memories 120, 120A, or may be calculated or otherwise determined directly by the user interface controller 115 and/or the programmable digital filter 250, such as when the user interface controller 115 and/or the programmable digital filter 250 are implemented as processors, and provided (via bus 123) to any of the various first digital controller 105, the first reconfigurable frequency and delay generator 110, the second digital controller 135 and/or the second reconfigurable frequency and delay generator 140, depending upon the selected embodiment. For example and without limitation, depending on the selected embodiment, control coefficients (control words or signals) may be provided directly by the user interface controller 115, or via the programmable digital filter 250, to the first and/or second reconfigurable frequency and delay generators 110, 140 for selection of the number of oscillator stages 270, selection of the reconfigurable phase interpolators, and so on.

The user interface controller 115, which also may be implemented as a processor, converts or translates the various user-selectable configuration parameters into a form useable by the various components of the first digital controller 105, such as converting the desired frequency $f_{OUT}$ into a multiple "N" of the reference frequency (with or without a fractional component, as described in greater detail below), provided to the multiplier 230. Other user-selectable configuration parameters are converted or translated into some of the various control coefficients, control signals and other control parameters and provided to or determined by the programmable digital filter 250 having a configurable filter 590, such as for user selection of the number of oscillator stages 270, bandwidth (for noise suppression), and jitter levels resulting in corresponding selection of one or more reconfigurable phase interpolators 165, frequency resolution, power consumption, and so on.

In a representative embodiment, the user-selectable bandwidth parameter is mapped to corresponding gain coefficients, a first gain stage 505 using a first internal gain coefficient $K_P$ and a second gain stage 510 using a second internal gain coefficient $K_I$, which are part of a feedback loop 525, illustrated as part of a configurable filter 590$_A$. The feedback loop 525 receives the resulting error count (or error signal), and using the resulting error count (or error signal) generates the corresponding gains using first and second gain stages 505, 510. A first gain is generated by the first gain stage 505 using the first internal gain coefficient $K_P$. The second gain from the second gain stage 510 using the second internal gain coefficient $K_I$ is accumulated, using accumulator 515 (e.g., counter or adder), and the accumulated second gain is subtracted or offset from the first gain (using comparator or subtractor 520) to generate one or more control feedback values or signals, which in turn are converted (by coefficient generator 530, together with other parameters stored in memory 120A) into the various control coefficients and other control parameters discussed above, such as to select capacitance levels, voltage levels, and so on.

Other configurable filters 590 are illustrated in FIGS. 26-30, implementing, as examples: (1) $H(z)=K_P$ (configurable filter 590$_B$ in FIG. 26);

(2) $H(z)=K_P+K_I/(1-z^{-1})$ (configurable filters 590$_A$ in FIGS. 25 and 590$_C$ in FIG. 27);

(3) $H(z)=K_0+K_1/(1-z^{-1})+K_2/(1-z^{-2})$ (configurable filter 590$_D$ in FIG. 28);

(4) $H(z)=K_0+K_1\ z^{-1}$ (configurable filter 590$_E$ in FIGS. 29); and (5) $H(z)=K_0+K_1\ z^{-1}+K_2\ z^{-2}$ (configurable filter 590$_F$ in FIG. 30).

As illustrated in FIGS. 26-30, any of these filters may be implemented using the relevant gain coefficients (e.g., $K_P$ (505), $K_I$ (510), $K_0$ (605), $K_1$ (610), $K_2$ (635)), one or more delay blocks 595 (e.g., each implemented using a flip-flop), one or more accumulators 515, and one or more adders 520, to implement virtually any linear digital filter function. In addition, any of these various configurable filters 590 may also be utilized equivalently in the digital loop filter 540 (of the second digital controller 135) or in the third digital controller 145. Any of these configurable filters 590 or equivalent filters may be utilized in a programmable digital filter 250, and all such variations are within the scope of the disclosure.

Figure 31:
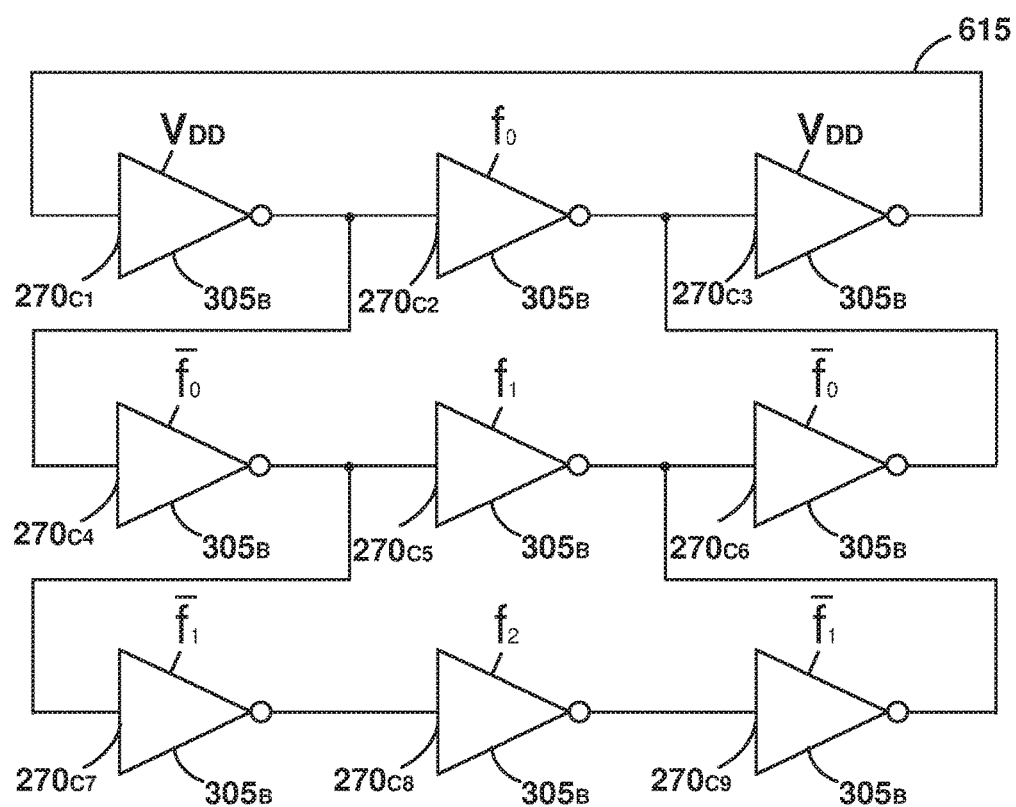
FIG. 31 is a block diagram illustrating in greater detail an exemplary or representative second embodiment of a configurable or reconfigurable oscillator of the first reconfigurable frequency and delay generator with phase detection (or measurement) (and/or second reconfigurable frequency and delay generator with phase detection (or measurement)) for the first, second or third reconfigurable, digital phase-locked loops.
Figure 32:
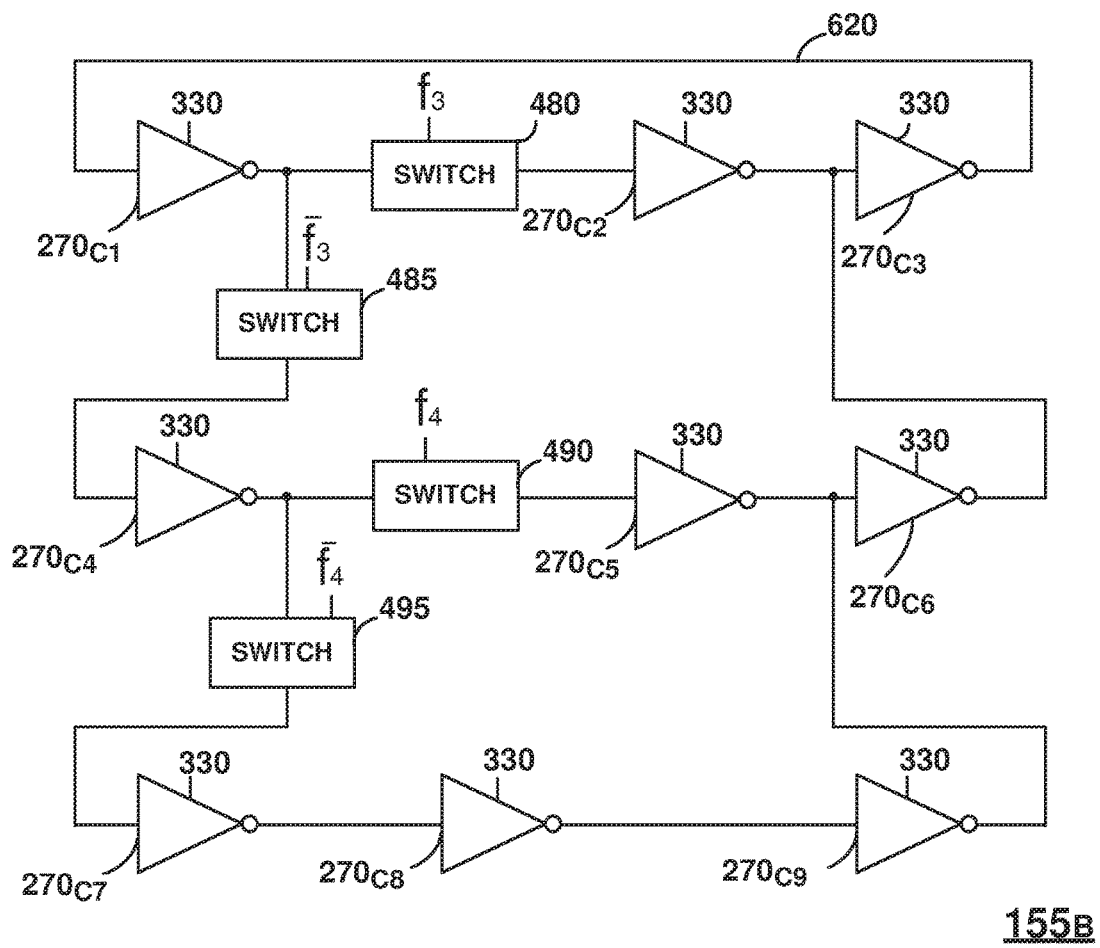
FIG. 32 is a block diagram illustrating in greater detail an exemplary or representative third embodiment of a configurable or reconfigurable oscillator of the first reconfigurable frequency and delay generator with phase detection (or measurement) (and/or second reconfigurable frequency and delay generator with phase detection (or measurement)) for the first, second or third reconfigurable, digital phase-locked loops.

FIG. 31 is a block diagram illustrating in greater detail an exemplary or representative second embodiment of a configurable or reconfigurable oscillator 155A of the first reconfigurable frequency and delay generator 110 (and/or second reconfigurable frequency and delay generator 140) for the first or second reconfigurable, digital phase-locked loops 100, 200. FIG. 32 is a block diagram illustrating in greater detail an exemplary or representative third embodiment of a configurable or reconfigurable oscillator 155B of the first reconfigurable frequency and delay generator 110 (and/or second reconfigurable frequency and delay generator 140) for the first or second reconfigurable, digital phase-locked loops 100, 200. Any of these reconfigurable oscillators 155A, 155B may also be utilized in the third reconfigurable, digital phase-locked loop 300 to form a reconfigurable delay line or delay locked loop (190) by eliminating the feedback line (615 or 620, respectively) to the first oscillator stage 270$_{C1}$ from the last oscillator stage 270$_{C3}$. As mentioned above, these various configurations of the reconfigurable oscillator or delay line 155, 190 may be selected using the configuration parameters.

A representative configurable or reconfigurable oscillator 155A comprises a plurality of oscillator stages 270$_C$ in a ring oscillator circuit structure, and depending upon the types of inverters 330, 305 which are utilized in each oscillator stage 270$_C$, optionally may also include a plurality of switches 480, 485, 490, 495. For example, when switched inverters 305$_B$ are not utilized, and other types of non-switched inverters (e.g., 330) are utilized instead, then the plurality of switches 480, 485, 490, 495 are included, as illustrated in FIG. 32. Other components of the oscillator stages 270 discussed above, along with the phase sampler 170 and the reconfigurable phase interpolators 165, have been intentionally omitted from the illustrations of FIGS. 31 and 32, both to focus on the configurability of the configurable or reconfigurable oscillators 155A, 155B for different numbers of oscillator stages 270$_C$ and also to illustrate use of single-ended, non-differential inverters within an oscillator stage 270$_C$; those having skill in the art will recognize that any and all of such components and/or differential variations may be included, however, for example and without limitation. In addition, the plurality of oscillator stages 270$_C$ are illustrated simply as single-ended inverters, e.g., inverters 330 or switched inverters 305$_B$, for purposes of discussion and to simply illustrated suitable oscillation phases representative of any implementation of a ring oscillator circuit structure, and those having skill in the art will recognize that the other components of an oscillator stage 270 described above are represented implicitly.

As illustrated in FIG. 31, through the use of the switched inverters 305$_B$, the configurable or reconfigurable oscillator 155A may be configured for three stages, five stages, or seven stages, in response to or based upon the configuration parameters and/or control signals (control word(s)), e.g., comprising the coefficients $[f_0, f_1, f_2, f_3, f_4, f_5, \ldots f_N]$) provided as configuration parameters or generated by the first digital controller 105, which may be further in response to configuration parameters input by a user. Using switched inverters 305$_B$, three oscillator stages 270$_C$ are included in the ring oscillator circuit structure, namely, oscillator stage 270$_{C1}$, oscillator stage 270$_{C2}$, and oscillator stage 270$_{C3}$, when coefficient $f_0$ is high ($=1$) and its inverse is low ($=0$). Using switched inverters 305$_B$, five oscillator stages 270$_C$ are in the ring oscillator circuit structure, namely, oscillator stage 270$_{C1}$, oscillator stage 270$_{C4}$, oscillator stage 270$_{C5}$, oscillator stage 270$_{C6}$, and oscillator stage 270$_{C3}$, when coefficient $f_0$ is low ($=0$) (and its inverse is high ($=1$)) and coefficient $f_1$ is high ($=1$) and its inverse is low ($=0$). Again using switched inverters 305$_B$, seven oscillator stages 270$_C$ are in the ring oscillator circuit structure, namely, oscillator stage 270$_{C1}$, oscillator stage 270$_{C4}$, oscillator stage 270$_{C7}$, oscillator stage 270$_{C8}$, oscillator stage 270$_{C9}$, oscillator stage 270$_{C6}$, and oscillator stage 270$_{C3}$, when coefficient $f_0$ is low ($=0$) (and its inverse is high ($=1$)) and coefficient $f_1$ is low ($=0$) (and its inverse is high ($=1$)) and coefficient $f_2$ is high ($=1$).

When non-switched inverters are utilized, such as when inverters 330 are utilized for the oscillator stages 270$_C$ as illustrated in FIG. 32, through the use of the plurality of switches 480, 485, 490, 495, the configurable or reconfigurable oscillator 155B may be configured for three stages, five stages, or seven stages, also in response to or based upon the configuration parameters and/or control signals (control word(s)), e.g., comprising the coefficients $[f_0, f_1, f_2, f_3, f_4, f_5, \ldots f_N]$) provided as configuration parameters or generated by the first digital controller 105, which may be further in response to configuration parameters input by a user. Using inverters 330, three oscillator stages 270$_C$ are included in the ring oscillator circuit structure, namely, oscillator stage 270$_{C1}$, oscillator stage 270$_{C2}$, and oscillator stage 270$_{C3}$, when coefficient $f_3$ is high ($=1$) and its inverse is low ($=0$). Using inverters 330, five oscillator stages 270$_C$ are in the ring oscillator circuit structure, namely, oscillator stage 270$_{C1}$, oscillator stage 270$_{C4}$, oscillator stage 270$_{C5}$, oscillator stage 270$_{C6}$, and oscillator stage 270$_{C3}$, when coefficient $f_3$ is low ($=0$) (and its inverse is high ($=1$)) and coefficient $f_4$ is high ($=1$) and its inverse is low ($=0$). Again using inverters 330, seven oscillator stages 270$_C$ are in the ring oscillator circuit structure, namely, oscillator stage 270$_{C1}$, oscillator stage 270$_{C4}$, oscillator stage 270$_{C7}$, oscillator stage 270$_{C8}$, oscillator stage 270$_{C9}$, oscillator stage 270$_{C6}$, and oscillator stage 270$_{C3}$, when coefficient $f_3$ is low ($=0$) (and its inverse is high ($=1$)) and coefficient $f_4$ is low ($=0$) (and its inverse is high ($=1$)).

For fractional multiples of the reference frequency $f_{REF}$, those having skill in the art will recognize that sigma-delta modulation can be added into the circuitry illustrated and discussed above with reference to FIGS. 1 and 4, as known in the art. Referring to FIG. 2, instead of using sigma-delta modulation for fractional multiples of the reference frequency $f_{REF}$, in a representative embodiment, a second digital controller 135 and a second reconfigurable frequency and delay generator 140 are cascaded following the first digital controller 105 and the first reconfigurable frequency and delay generator 110. The first reconfigurable frequency and delay generator 110 (or the LC oscillator circuitry 275), under the control of the first digital controller 105, provides a first output signal having a first output frequency $f_{OUT1}$, which is an integer multiple of the reference frequency $f_{REF}$, as discussed above. The second reconfigurable frequency and delay generator 140, under the control of the second digital controller 135, provides a second output signal having a second output frequency $f_{OUT2}$, which is a fractional multiple of the reference frequency $f_{REF}$, i.e., a fractional offset from an integer ("M") multiple of the reference frequency (e.g., $M \cdot f_{REF} + \Delta f$, where $\Delta f$ is the selected fractional offset). In this way, the first reconfigurable frequency and delay generator 110 locks quickly and rapidly produces the first output signal having a first output frequency $f_{OUT1}$, which is typically higher frequency than the reference frequency $f_{REF}$. The higher first output signal having a first output frequency $f_{OUT1}$, which is then fed to the second digital controller 135 and the second reconfigurable frequency and delay generator 140, then enables a greater fractional resolution to produce the second output signal having a second output frequency $f_{OUT2}$, which is a fractional offset or a fractional multiple of the reference frequency $f_{REF}$, without the need for any sigma-delta modulation, and further eliminates fractional spurs and associated phase noise.

Figure 33:
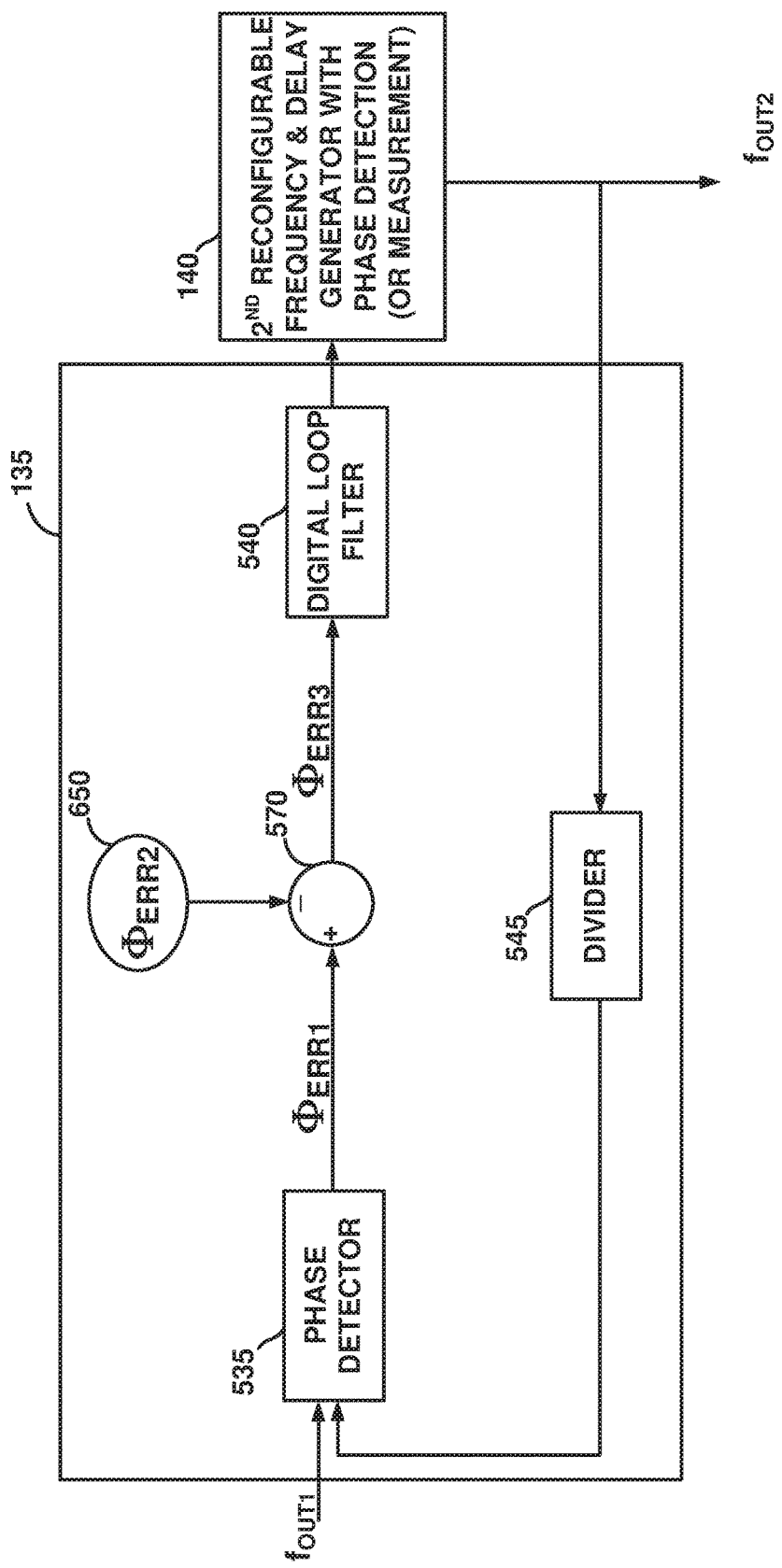
FIG. 33 is a block diagram illustrating an exemplary or representative embodiment of a second digital controller for the second reconfigurable, digital phase-locked loop.

FIG. 33 is a block diagram illustrating an exemplary or representative embodiment of a second digital controller 135 for the second reconfigurable, digital phase-locked loop 200, for generation of second output signal having a second output frequency $f_{OUT2}$ that is a fractional offset or a fractional multiple of the reference frequency $f_{REF}$. The second digital controller 135 comprises a phase detector 535, a digital loop filter 540, a divider 545, and a comparator (or subtractor) 570. The phase detector 535, the digital loop filter 540, the divider 545, and the comparator (or subtractor) 570 may be implemented as known or becomes known in the art. The second digital controller 135 provides a novel circuit for generation of a fractional multiple of the reference frequency $f_{REF}$ by using a comparator (or subtractor) 570, which would not be typically utilized in a prior art feedback loop, to introduce a new, second configurable error signal (650), illustrated as $\phi_{ERR2}$, to provide for the fractional locking by manipulating the error signals in the feedback loop of the second digital controller 135. The second, configurable error signal $\phi_{ERR2}$ (650) is a user-selectable, digital configuration parameter which can be input through the user interface controller 115 or input into memory 120, and the value of the second error signal $\phi_{ERR2}$ (650) is proportional to the desired fractional offset or increment ("$\Delta f$"). Stated another way, any selected or desired fractional offset or a fractional multiple can be mapped to or translated into a corresponding second error signal $\phi_{ERR2}$ (650).

More specifically, the phase detector 535 receives the first output signal having a first output frequency $f_{OUT1}$ (from the first reconfigurable frequency and delay generator 110 or from the LC oscillator 275) and generates a first error signal, illustrated as $\phi_{ERR1}$, which would typically be driven to zero as the desired output frequency is reached. Generally, the slope (first derivative) of the first error signal $\phi_{ERR1}$ represents the frequency error, the difference between first output frequency $f_{OUT1}$ and the second output frequency $f_{OUT2}$. The second digital controller 135, however, using comparator (or subtractor) 570, combines the first error signal $\phi_{ERR1}$ with the new, second error signal $\phi_{ERR2}$ (650), to produce another new, third error signal, illustrated as $\phi_{ERR3}$. As the feedback loop of the second digital controller 135 operates, the third error signal $\phi_{ERR3}$ is also driven to zero, but in doing so, the second reconfigurable frequency and delay generator 140 will produce the second output signal having a second output frequency $f_{OUT2}$ that is a fractional offset or a fractional multiple of the reference frequency $f_{REF}$, i.e., $f_{OUT2} = (M \cdot f_{REF}) + \Delta f$, where $\Delta f$ is some fractional offset or increment of the reference frequency $f_{REF}$.

It should be noted that instead of using a second digital controller 135 cascaded with the second reconfigurable frequency and delay generator 140, another first digital controller 105 may be utilized and cascaded with the second reconfigurable frequency and delay generator 140. For such an embodiment, as mentioned above, the second error signal $\phi_{ERR2}$ (650) is also introduced, and using comparator (adder or subtractor) 240 as illustrated in FIG. 4 (instead of comparator (or subtractor) 570), combined (subtracted from) with the difference (error) between the reference frequency count and the combined frequency and phase feedback count, to generate a new resulting error count (or error signal) provided to the programmable digital filter.

Figure 34:
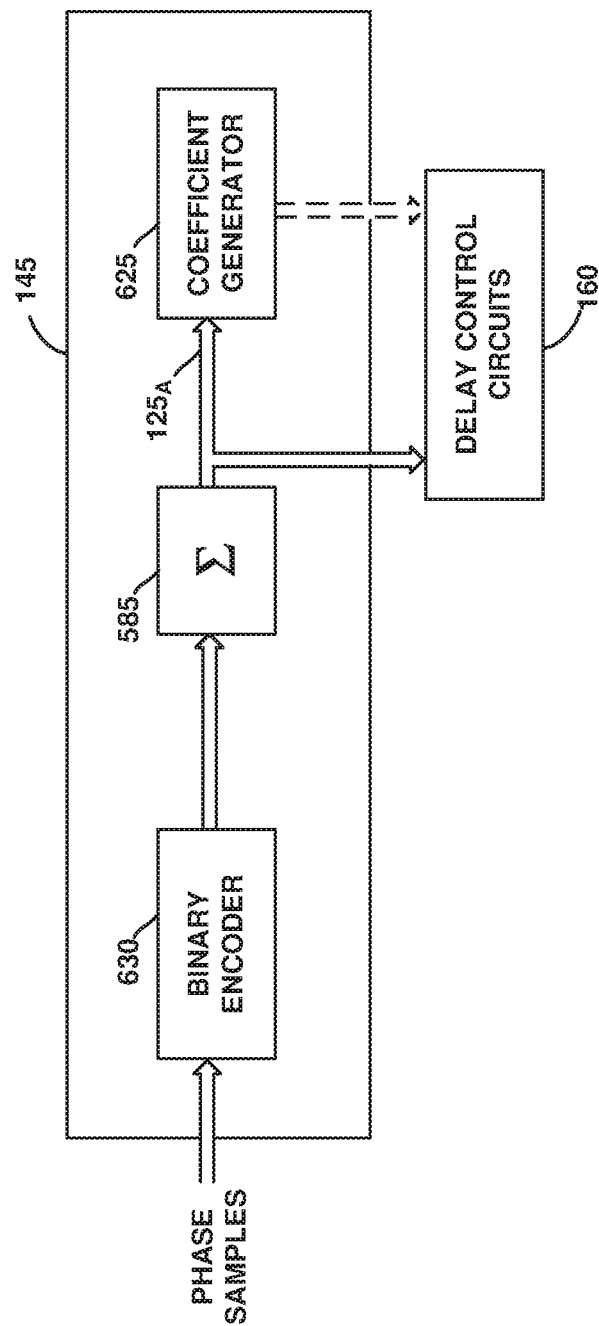
FIG. 34 is a block diagram illustrating an exemplary or representative embodiment of a third digital controller for the third reconfigurable, digital phase-locked loop.

FIG. 34 is a block diagram illustrating an exemplary or representative embodiment of a third digital controller 145 for the third reconfigurable, digital phase-locked loop 300. As the oscillator stages 270 of the first and/or second reconfigurable frequency and delay generator 110, 140 in the third reconfigurable, digital phase-locked loop 300 are implemented as a delay line (or delay locked loop) 190 driven by the oscillation frequency of the LC oscillator 275, which is under the control of the first digital controller 105, it will operate and also oscillate at the oscillation (resonant) frequency of the LC oscillator 275, $f_{OUT}$. The third digital controller 145 is utilized to lock the delay line (or delay locked loop) 190 to the phase of the output signal having the output frequency $f_{OUT}$ from the LC oscillator 275, so that the phase information provided back to the first digital controller 105 (as discussed above) is an accurate representation of the phase of the oscillation of the LC oscillator 275. As mentioned above, in a representative embodiment, another first digital controller 105 may also be substituted for the third digital controller 145.

In a representative embodiment, as illustrated in FIG. 34, the third digital controller 145 may be implemented as a binary encoder 630, coupled to an accumulator 585, which is coupled to a coefficient generator 625. The binary encoder 630 operates as previously described for binary encoder 205, receiving the position encoded phase information from the second phase sampler $170_A$ (clocked at the output frequency $f_{OUT}$ from either the LC oscillator 275 or the last oscillator stage $270_N$ of the delay line 190), and converting that phase information into binary phase information. On every clock edge (clocked at the reference frequency $f_{REF}$), the accumulator 585 adds (or subtracts) the binary value of the incoming phase information to its currently held (accumulated value), and further accumulates the result, tending to converge toward a stable value as the sampled phases align with the phase of the oscillation of the LC oscillator 275.

In a first representative embodiment, the output of the accumulator 585 is passed directly to the delay control circuits 160 of the first and/or second reconfigurable frequency and delay generator 110, 140, on line or bus $125_A$.

More specifically, the accumulated result is provided as one or more control words on a plurality of lines of a bus, each of which is mapped to a corresponding circuit of the delay control circuits 160, to couple or uncoupled a corresponding circuit of the delay control circuits 160 to a corresponding oscillator stage 270. As discussed above, these control words (as control signals) select capacitance levels, voltage levels, and so on, of the delay control circuits 160 of the oscillator stages 270 implemented as a delay line (or delay locked loop) 190, to adjust the delays between the oscillator stages 270, so the overall delay of the delay line (or delay locked loop) 190 synchronizes to and aligns with the period of the oscillation of the LC oscillator 275, to further provide that the subsequent sampled phases (from first phase sampler 170$_B$) accurately represent the phases of the oscillation of the LC oscillator 275. For example, the higher significant bits (lines) of the control word (accumulated result) correspond to coarse tuning control words, such as to control the primary switched capacitors 310; the middle significant bits (lines) of the control word (accumulated result) correspond to medium tuning control words, such as to control the secondary switched digital varactors 315, and the lower significant bits (lines) of the control word (accumulated result) correspond to fine tuning control words, such as to control the voltage controllers 320.

For example, in a representative embodiment, in converting the positional sampled phase information into binary encoding, the binary encoder 630 also provides for the binary value to be positive or negative. For example, for an eight stage delay line (or delay locked loop) 190, the phase information of the first four stages may be assigned a positive binary value, while the phase information of the last four stages may be assigned a negative binary value, with positive values indicating that the delay line (or delay locked loop) 190 is too fast, and negative values indicating that the delay line (or delay locked loop) 190 is too slow. Over a number of cycles, and the accumulated result will tend to converge or stabilize (or have very small oscillations) to or around a particular value, stabilizing the period of the delay line (or delay locked loop) 190.

Alternatively, in a second representative embodiment, the accumulated phase results, in turn are converted (by coefficient generator 625, which may also be implemented as a processor, as described below) into the various control coefficients of the control words (control signals) and other control parameters discussed above provided to the delay control circuits 160 on line or bus 125$_B$, as discussed above, such as to select capacitance levels, voltage levels, and so on, for the oscillator stages 270 implemented as a delay line (or delay locked loop) 190, to adjust the delays between the oscillator stages 270, so the overall delay of the delay line (or delay locked loop) 190 synchronizes to and aligns with the period of the oscillation of the LC oscillator 275, also to further provide that the subsequent sampled phases (from first phase sampler 1700 accurately represent the phases of the oscillation of the LC oscillator 275.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

A "controller" or "processor", such as utilized with or as part of the user interface controller 115 or the programmable digital filter 250, may be any type of controller or processor, and may be embodied as one or more controllers or processors, configured, designed, programmed or otherwise adapted to perform the functionality discussed herein. As the term controller or processor is used herein, a controller or processor may include use of a single integrated circuit ("IC") or system-on-a-chip and integrated with the first, second and/or third reconfigurable, digital phase-locked loops 100, 200, 300, or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components, whether analog or digital. As a consequence, as used herein, the term controller (or processor) should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or E$^2$PROM. A controller (or processor), with its associated memory, may be adapted or configured (via programming, FPGA interconnection, or hard-wiring) to perform the methodology of the invention, as discussed above. For example, the methodology may be programmed and stored, in a controller or processor with its associated memory (and/or memory 120, 120A) and other equivalent components, as a set of program instructions or other code (or equivalent configuration or other program) for subsequent execution when the processor is operative (i.e., powered on and functioning). Equivalently, when the controller or processor may implemented in whole or part as FPGAs, custom ICs and/or ASICs, the FPGAs, custom ICs or ASICs also may be designed, configured and/or hard-wired to implement the methodology of the invention. For example, the controller or processor may be implemented as an arrangement of analog and/or digital circuits, controllers, microprocessors, DSPs and/or ASICs, collectively referred to as a "controller", which are respectively hard-wired, programmed, designed, adapted or configured to implement the methodology of the invention, including possibly in conjunction with a memory 120, 120A.

The one or more memories 120, 120A, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a controller or processor), whether volatile or non-volatile, whether removable or non-removable, including without limitation RAM, FLASH, DRAM, SDRAM, SRAM, MRAM, FeRAM, ROM, EPROM or E$^2$PROM, or any other form of memory device or other machine-readable storage or memory media, which is known or which becomes known, depending upon the selected embodiment. The one or more memories 120, 120A may be adapted to store various look up tables, parameters, coefficients, other information and data, programs or instructions (of the software of the present invention), and other types of tables such as database tables.

As indicated above, the controller or processor is hard-wired or programmed, using software and data structures of the invention, for example, to perform the methodology of the present invention. As a consequence, the system and method of the present invention may be embodied as software which provides such programming or other instructions, such as a set of instructions and/or metadata embodied within a non-transitory computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, SystemC, LISA, XML, Java, Brew, SQL and its variations (e.g., SQL 99 or proprietary versions of SQL), DB2, Oracle, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, for example).

The software, metadata, or other source code of the present invention and any resulting bit file (object code, database, or look up table) may be embodied within any tangible, non-transitory storage medium, such as any of the computer or other machine-readable data storage media, as computer-readable instructions, data structures, program modules or other data, such as discussed above with respect to the one or more memories 120, 120A, or any other type of data storage apparatus or medium, as mentioned above.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

For the numbering of various components as first, second, third, and so on, such as for first, second and third digital controllers, such numbering depends on the context for the selected embodiment. For example and without limitation, in the third PLL 300 embodiment, when a first digital controller 105 is utilized, but no second digital controller 135 is utilized, then the third digital controller 145 may be considered a second digital controller 145 for this third PLL 300 embodiment. Also for example and without limitation, in the first PLL 100 embodiment, when only one digital controller is implemented, the first digital controller 105 may be referred to simply as a "digital controller", without any such numbering.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated. In addition, every intervening sub-range within range is contemplated, in any combination, and is within the scope of the disclosure. For example, for the range of 5-10, the sub-ranges 5-6, 5-7, 5-8, 5-9, 6-7, 6-8, 6-9, 6-10, 7-8, 7-9, 7-10, 8-9, 8-10, and 9-10 are contemplated and within the scope of the disclosed range.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A reconfigurable phase-locked loop integrated circuit coupleable to a reference frequency generator and further coupleable to an inductor, the reconfigurable phase-locked loop integrated circuit comprising:
a memory storing a plurality of configuration parameters, at least one configuration parameter of the plurality of configuration parameters specifying a selected output frequency;
a plurality of capacitive tuning circuits coupleable to the inductor to form an LC oscillator circuit to generate a first output signal having a first output frequency;
a reconfigurable frequency and delay generator configurable and reconfigurable in response to the plurality of configuration parameters to configure as a ring oscillator or as a delay line circuit, and to generate a second output signal having a second output frequency; and
a first digital controller coupled to the reconfigurable frequency and delay generator and to the plurality of capacitive tuning circuits, the first digital controller further coupleable to receive an input signal from the reference frequency generator having a reference frequency, the first digital controller adapted to access the memory and retrieve the plurality of configuration parameters; when the reconfigurable frequency and delay generator is configured as the ring oscillator, to generate a first plurality of control signals to the reconfigurable frequency and delay generator both to generate the second output signal having the second output frequency in response to the plurality of configuration parameters, and to match a phase of the second output signal to an input signal phase; and when the reconfigurable frequency and delay generator is configured as the delay line circuit, to generate a second plurality of control signals to the plurality of capacitive tuning circuits both to generate the first output signal having the first output frequency in response to the plurality of configuration parameters, and to match a phase of the first output signal to the input signal phase.

2. The reconfigurable phase-locked loop integrated circuit of claim 1, further comprising:
a user interface controller coupled to the memory, the user interface controller adapted to receive user input, convert the user input into the plurality of configuration parameters, and to write the plurality of configuration parameters to the memory.

3. The reconfigurable phase-locked loop integrated circuit of claim 1, wherein the plurality of configuration parameters further comprise at least one configuration parameter selected from the group consisting of: bandwidth, frequency resolution, jitter level, power consumption, fractional frequencies, and combinations thereof.

4. The reconfigurable phase-locked loop integrated circuit of claim 1, wherein the reconfigurable frequency and delay generator comprises:
a first phase sampler; and
a plurality of configurable oscillator stages coupled to the first phase sampler, each configurable oscillator stage of the plurality of configurable oscillator stages further comprising:
at least one core inverter to form a plurality of core inverters coupled in series, a last core inverter of the plurality of core inverters generating the second output signal having the second output frequency; and
a first plurality of delay control circuits, each delay control circuit of the first plurality of delay control circuits coupled to an output of a corresponding core inverter of the plurality of core inverters.

5. The reconfigurable phase-locked loop integrated circuit of claim 4, further comprising:
a first multiplexer of a plurality of multiplexers, the first multiplexer coupled to an output of a last configurable oscillator stage of the plurality of configurable oscillator stages, the first multiplexer to selectively couple the last output of the last configurable oscillator stage to an input of a first configurable oscillator stage of the plurality of configurable oscillator stages to form the ring oscillator circuit structure in response to the plurality of configuration parameters.

6. The reconfigurable phase-locked loop integrated circuit of claim 5, wherein the first multiplexer is further coupled to an output of the LC oscillator circuit, the first multiplexer further to selectively couple the output of the LC oscillator circuit to the input of the first configurable oscillator stage to form the delay line circuit structure in response to the plurality of configuration parameters.

7. The reconfigurable phase-locked loop integrated circuit of claim 5, further comprising:
a second multiplexer of the plurality of multiplexers, the second multiplexer coupled to the output of the last configurable oscillator stage, the second multiplexer to selectively couple the last output of the last configurable oscillator stage to an output of the reconfigurable phase-locked loop to provide the second output signal having the selected output frequency.

8. The reconfigurable phase-locked loop integrated circuit of claim 7, wherein the second multiplexer is further coupled to the output of the LC oscillator circuit, the second multiplexer to selectively couple the output of the LC oscillator circuit to the output of the reconfigurable phase-locked loop to provide the first output signal having the selected output frequency.

9. The reconfigurable phase-locked loop integrated circuit of claim 4, further comprising:
a second digital controller coupled to the reconfigurable frequency and delay generator, the second digital controller adapted, when the reconfigurable frequency and delay generator is configured as the delay line circuit, to generate a third plurality of control signals to the plurality of configurable oscillator stages to match the phase of the second output signal to the phase of the first output signal.

10. The reconfigurable phase-locked loop integrated circuit of claim 9, further comprising:
a third multiplexer coupled to the first digital controller and to the second digital controller, the third multiplexer to selectively couple either the output of the second digital controller or the output of the first digital controller to the plurality of delay control circuits, in response to the plurality of configuration parameters.

11. The reconfigurable phase-locked loop integrated circuit of claim 9, further comprising:
a second phase sampler coupled to the second digital controller and to the plurality of configurable oscillator stages.

12. The reconfigurable phase-locked loop integrated circuit of claim 11, wherein the second digital controller comprises:
a binary encoder coupled to the second phase sampler, the binary encoder adapted to generate a second binary count corresponding to positional phase information provided by the second phase sampler; and
an accumulator to add and accumulate successive second binary counts generated by the binary encoder.

13. The reconfigurable phase-locked loop integrated circuit of claim 12, wherein the output of the accumulator comprises a plurality of coefficients forming a control word, each coefficient corresponding to a control signal of the plurality of control signals provided on a signaling bus to the plurality of delay control circuits.

14. The reconfigurable phase-locked loop integrated circuit of claim 12, further comprising:
a coefficient generator coupled to the accumulator and adapted to generate a plurality of coefficients forming a control word, each coefficient corresponding to a control signal of the plurality of control signals provided on a signaling bus to the plurality of delay control circuits.

15. The reconfigurable phase-locked loop integrated circuit of claim 10, further comprising:
a fourth switch coupled to the first digital controller to selectively couple the output of the first digital controller to the plurality of capacitive tuning circuits, in response to the plurality of configuration parameters.

16. The reconfigurable phase-locked loop integrated circuit of claim 4, wherein the first digital controller comprises:
a binary encoder coupled to the first phase sampler, the binary encoder adapted to generate a first binary count corresponding to positional phase information provided by the first phase sampler;
a gray code counter coupled to receive the first or second output signals and generate a gray code count representing the first or second output frequency;
a gray code sampler adapted to sample the gray code count;
a gray code-to-binary converter adapted to generate a second binary count from the gray code count; and
an adder adapted to combine the second binary count with the first binary count to provide a combined binary representation of the frequency and phase of the first or second output signal.

17. The reconfigurable phase-locked loop integrated circuit of claim 16, wherein the first digital controller further comprises:
a reference counter circuit coupled to receive the input signal and provide a third binary count of the reference frequency;
a programmable multiplier circuit coupled to the reference counter to multiply the third binary count by a selected multiplicand to generate a multiplied reference frequency count;
a comparator circuit coupled to the programmable multiplier and to the adder, the comparator circuit adapted to compare the combined binary representation with the multiplied reference frequency count and generate a corresponding first error signal; and
a programmable digital filter coupled to the comparator circuit to convert the first error signal into the plurality of control signals.

18. The reconfigurable phase-locked loop integrated circuit of claim 17, wherein the programmable digital filter comprises:
a configurable filter to receive the first error signal and to generate a second error signal using one or more gain stages; and
wherein the memory further stores one or more gain coefficients for the configurable filter.

19. The reconfigurable phase-locked loop integrated circuit of claim 4, wherein each core inverter of the plurality of core inverters comprises a plurality of nonconfigurable inverters having a differential inverter circuit structure comprising:
first and second nonconfigurable inverters coupled in parallel; and
third and fourth configurable inverters cross-coupled to outputs of the first and second nonconfigurable inverters.

20. The reconfigurable phase-locked loop integrated circuit of claim 19, wherein each delay control circuit of the plurality of delay control circuits comprises:
a plurality of switchable frequency control inverters coupled in parallel with the at least one nonconfigurable inverter;
a plurality of primary switched capacitors coupled to the output of the corresponding non-configurable inverter;
a plurality of secondary switched digital varactors coupled to the output of the corresponding non-configurable inverter; and
a plurality of voltage controllers, each voltage controller of the plurality of voltage controllers coupled to provide a selected voltage to a corresponding secondary switched digital varactor of the plurality of secondary switched digital varactors.

21. The reconfigurable phase-locked loop integrated circuit of claim 1, wherein the plurality of capacitive tuning circuits comprises:
a plurality of primary switched capacitors coupleable to the inductor;
a plurality of secondary switched digital varactors coupleable to the inductor; and
a plurality of voltage controllers, each voltage controller of the plurality of voltage controllers coupled to provide a selected voltage to a corresponding secondary switched digital varactor of the plurality of secondary switched digital varactors.

22. The reconfigurable phase-locked loop integrated circuit of claim 21, wherein each primary switched capacitor of the plurality of primary switched capacitors comprises:
a transmission gate; and
a FET transistor having its gate coupled to the transmission gate and further having its source and drain coupled to a ground potential; and
wherein each secondary switched digital varactor of the plurality of secondary switched digital varactors comprises:
a transmission gate; and
a FET transistor having its gate coupled to the transmission gate and further having its source and drain coupled to the selected voltage.

23. The reconfigurable phase-locked loop integrated circuit of claim 22, wherein each voltage controller of the plurality of voltage controllers comprises:
- a plurality of transistors coupled in series to form a voltage ladder circuit structure having a plurality of nodes, each node of the plurality of nodes having a different voltage; and
- a plurality of transmission gates, each transmission gate of the plurality of transmission gates coupled to a secondary switched digital varactor and to a selected node of the plurality of nodes to transmit the selected voltage to the secondary switched digital varactor in response to the first plurality of control signals.

24. A reconfigurable phase-locked loop integrated circuit coupleable to a reference frequency generator and further coupleable to an inductor, the reconfigurable phase-locked loop integrated circuit comprising:
- a user interface controller adapted to receive user input and convert the user input into a plurality of configuration parameters, at least one configuration parameter of the plurality of configuration parameters specifying a selected output frequency;
- a memory storing the plurality of configuration parameters;
- a plurality of capacitive tuning circuits coupleable to the inductor to form an LC oscillator circuit to generate a first output signal having a first output frequency;
- a plurality of multiplexers;
- a reconfigurable frequency and delay generator configurable and reconfigurable in response to the plurality of configuration parameters to configure as a ring oscillator or as a delay line circuit, and to generate a second output signal having a second output frequency; and
- a first digital controller coupled to the reconfigurable frequency and delay generator and to the plurality of capacitive tuning circuits, the first digital controller further coupleable to receive an input signal from the reference frequency generator having a reference frequency, the first digital controller adapted to access the memory and retrieve the plurality of configuration parameters; when the reconfigurable frequency and delay generator is configured as the ring oscillator, to generate a first plurality of control signals to the reconfigurable frequency and delay generator both to generate the second output signal having the second output frequency in response to the plurality of configuration parameters, and to match a phase of the second output signal to an input signal phase; and when the reconfigurable frequency and delay generator is configured as the delay line circuit, to generate a second plurality of control signals to the plurality of capacitive tuning circuits both to generate the first output signal having the first output frequency in response to the plurality of configuration parameters, and to match a phase of the first output signal to the input signal phase.

25. The reconfigurable phase-locked loop integrated circuit of claim 24, wherein the reconfigurable frequency and delay generator comprises:
- a first phase sampler; and
- a plurality of configurable oscillator stages coupled to the first phase sampler, each configurable oscillator stage of the plurality of configurable oscillator stages further comprising:
  at least one core inverter to form a plurality of core inverters coupled in series, a last core inverter of the plurality of core inverters generating the second output signal having the second output frequency; and
  a first plurality of delay control circuits, each delay control circuit of the first plurality of delay control circuits coupled to an output of a corresponding core inverter of the plurality of core inverters.

26. The reconfigurable phase-locked loop integrated circuit of claim 25, wherein a first multiplexer of the plurality of multiplexers is coupled to an output of a last configurable oscillator stage of the plurality of configurable oscillator stages and to an output of the LC oscillator circuit, the first multiplexer to selectively couple the last output of the last configurable oscillator stage to an input of a first configurable oscillator stage of the plurality of configurable oscillator stages to form the ring oscillator circuit structure in response to the plurality of configuration parameters, and further to selectively couple the output of the LC oscillator circuit to the input of the first configurable oscillator stage to form the delay line circuit structure in response to the plurality of configuration parameters.

27. The reconfigurable phase-locked loop integrated circuit of claim 26, wherein a second multiplexer of the plurality of multiplexers is coupled to the output of the last configurable oscillator stage and to the output of the LC oscillator circuit, the second multiplexer to selectively couple the last output of the last configurable oscillator stage to an output of the reconfigurable phase-locked loop to provide the second output signal having the selected output frequency, and further to selectively couple the output of the LC oscillator circuit to the output of the reconfigurable phase-locked loop to provide the first output signal having the selected output frequency.

28. The reconfigurable phase-locked loop integrated circuit of claim 25, further comprising:
- a second digital controller coupled to the reconfigurable frequency and delay generator, the second digital controller adapted, when the reconfigurable frequency and delay generator is configured as the delay line circuit, to generate a third plurality of control signals to the plurality of configurable oscillator stages to match the phase of the second output signal to the phase of the first output signal.

29. The reconfigurable phase-locked loop integrated circuit of claim 28, further comprising:
- a third multiplexer coupled to the first digital controller and to the second digital controller, the third multiplexer to selectively couple either the output of the second digital controller or the output of the first digital controller to the plurality of delay control circuits, in response to the plurality of configuration parameters.

30. The reconfigurable phase-locked loop integrated circuit of claim 28, further comprising:
- a second phase sampler coupled to the second digital controller and to the plurality of configurable oscillator stages.

31. The reconfigurable phase-locked loop integrated circuit of claim 30, wherein the second digital controller comprises:
- a binary encoder coupled to the second phase sampler, the binary encoder adapted to generate a second binary count corresponding to positional phase information provided by the second phase sampler; and
- an accumulator to add and accumulate successive second binary counts generated by the binary encoder.

32. The reconfigurable phase-locked loop integrated circuit of claim 28, further comprising:
- a switch coupled to the first digital controller to selectively couple the output of the first digital controller to the plurality of capacitive tuning circuits, in response to the plurality of configuration parameters.

33. The reconfigurable phase-locked loop integrated circuit of claim 25, wherein the first digital controller comprises:
- a binary encoder coupled to the first phase sampler, the binary encoder adapted to generate a first binary count corresponding to positional phase information provided by the first phase sampler;
- a gray code counter coupled to receive the first or second output signals and generate a gray code count representing the first or second output frequency;
- a gray code sampler adapted to sample the gray code count;
- a gray code-to-binary converter adapted to generate a second binary count from the gray code count;
- an adder adapted to combine the second binary count with the first binary count to provide a combined binary representation of the frequency and phase of the first or second output signal;
- a reference counter circuit coupled to receive the input signal and provide a third binary count of the reference frequency;
- a programmable multiplier circuit coupled to the reference counter to multiply the third binary count by a selected multiplicand to generate a multiplied reference frequency count;
- a comparator circuit coupled to the programmable multiplier and to the adder, the comparator circuit adapted to compare the combined binary representation with the multiplied reference frequency count and generate a corresponding first error signal; and
- a programmable digital filter coupled to the comparator circuit to convert the first error signal into the plurality of control signals.

34. A reconfigurable phase-locked loop integrated circuit coupleable to a reference frequency generator and further coupleable to an inductor, the reconfigurable phase-locked loop providing an output signal having a selectable output frequency, the reconfigurable phase-locked loop integrated circuit comprising:
- a user interface controller;
- a memory circuit to store a plurality of configuration parameters;
- a plurality of capacitive tuning circuits coupleable to the inductor to form an LC oscillator circuit to generate a first signal;
- a first plurality of configurable oscillator stages, each configurable oscillator stage of the first plurality of configurable oscillator stages further comprising:
  - at least one core inverter to form a plurality of core inverters coupled in series, the plurality of core inverters including a first core inverter and a last core inverter, the last core inverter generating a second signal; and
  - a first plurality of delay control circuits, each delay control circuit of the first plurality of delay control circuits coupled to an output of a corresponding core inverter of the plurality of core inverters;
- a first phase sampler coupled to the plurality of configurable oscillator stages;
- a first multiplexer coupled to the LC oscillator circuit and to the first core inverter, the first multiplexer to select the first signal or the second signal as the input of the first core inverter, in response to the plurality of configuration parameters;
- a second multiplexer coupled to the LC oscillator circuit and to the last core inverter, the second multiplexer to select the first signal or the second signal as the output signal, in response to the plurality of configuration parameters;
- a first digital controller coupled to receive a reference input signal from the reference frequency generator having a reference frequency, the first digital controller adapted to generate a plurality of control signals to the plurality of capacitive tuning circuits or to the plurality of delay control circuits to generate the selected output frequency and to match a phase of the output signal to a phase of the reference input signal;
- a second digital controller;
- a third multiplexer coupled to the first digital controller and to the second digital controller, the third multiplexer to selectively couple the output of the first digital controller or the second digital controller to the plurality of delay control circuits, in response to the plurality of configuration parameters; and
- a fourth switch to selectively couple the output of the first digital controller to the plurality of capacitive tuning circuits in response to the plurality of configuration parameters.

* * * * *